(12) United States Patent
Masuoka et al.

(10) Patent No.: US 11,705,338 B2
(45) Date of Patent: Jul. 18, 2023

(54) METHOD FOR MANUFACTURING PILLAR-SHAPED SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 337 days.

(21) Appl. No.: 17/215,566

(22) Filed: Mar. 29, 2021

(65) Prior Publication Data

US 2021/0242028 A1 Aug. 5, 2021

Related U.S. Application Data

(63) Continuation of application No. PCT/JP2018/036643, filed on Oct. 1, 2018.

(51) Int. Cl.
*H01L 21/30* (2006.01)
*H01L 21/308* (2006.01)
(Continued)

(52) U.S. Cl.
CPC .... *H01L 21/3085* (2013.01); *H01L 21/02587* (2013.01); *H01L 29/1054* (2013.01); *H01L 29/66666* (2013.01)

(58) Field of Classification Search
CPC ........... H01L 21/3085; H01L 21/02587; H01L 29/1054; H01L 29/66666; H01L 27/0207;
(Continued)

(56) References Cited

U.S. PATENT DOCUMENTS

2005/0272195 A1* 12/2005 Bryant ............ H01L 21/823821
257/E21.235
2012/0139035 A1 6/2012 Masuoka et al.

FOREIGN PATENT DOCUMENTS

JP 02-188966 A 7/1990
JP WO 2018/070034 A 10/2018
(Continued)

OTHER PUBLICATIONS

International Preliminary Reporton Patentability, English translation, from Application No. PCT/JP2018/036643, dated Apr. 15, 2021, 8 pages.
(Continued)

*Primary Examiner* — Mohammad M Hoque
(74) *Attorney, Agent, or Firm* — Crowell & Moring LLP

(57) ABSTRACT

A band-shaped Si pillar having a mask material layer on the top portion thereof is formed on a P+ layer. SiGe layers having mask material layers on the top portions thereof are then formed in contact with the side surfaces of the band-shaped Si pillar and the surfaces of N+ layers and the P+ layer. Si layers having mask material layers on the top portions thereof are then formed in contact with the side surfaces of the SiGe layers and the surfaces of the N+ layers. The outer peripheries of the bottom portions of the Si layers are then removed using the mask material layers as a mask to form band-shaped Si pillars. The mask material layers and the SiGe layers are then removed. Si pillars separated in the Y direction are then formed in the band-shaped Si pillars.

8 Claims, 39 Drawing Sheets

(51) Int. Cl.
*H01L 21/02* (2006.01)
*H01L 29/10* (2006.01)
*H01L 29/66* (2006.01)

(58) Field of Classification Search
CPC ......... H01L 21/3083; H01L 21/823885; H01L 29/0676; H01L 29/7827; H01L 27/088; H01L 29/1033; H01L 29/42376; H10B 10/12
USPC ......................................................... 438/478
See application file for complete search history.

(56) References Cited

FOREIGN PATENT DOCUMENTS

WO    WO 2015/022744 A    2/2015
WO    WO 2018/070034 A    4/2018

OTHER PUBLICATIONS

Takato et al., "Impact of Surrounding Gate Transistor (SGT) for Ultra-High-Density LSI's", IEEE Transaction on Electron Devices, vol. 38, No. 3, pp. 573-578 (1991), 6 pages.
Ting et al., "Study of planarized sputter-deposited SiO2"J.Vac.Sci. Technol, 15(3), May/Jun. 1978, 8 pages.
International Search Report and Written Opinion in Application No. PCT/JP2018/036643, dated Dec. 18, 2018.

* cited by examiner

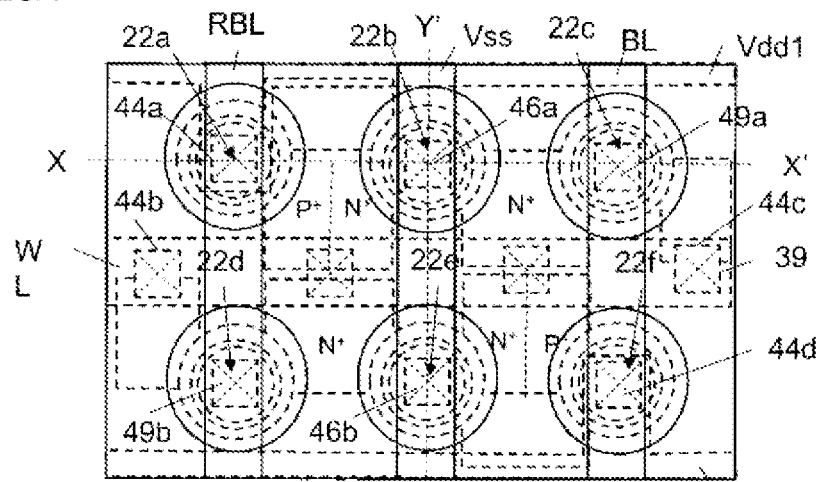

METHOD FOR MANUFACTURING PILLAR-SHAPED SEMICONDUCTOR DEVICE

CROSS REFERENCES TO RELATED APPLICATIONS

The present application is a continuation application of PCT/JP2018/036643, filed Oct. 1, 2018, the entire contents of which are incorporated herein by reference.

BACKGROUND OF THE INVENTION

Field of the Invention

The present invention relates to methods for manufacturing pillar-shaped semiconductor devices.

Description of the Related Art

Recently, three-dimensional-structure transistors have been used for large-scale integration (LSI). Of these, surrounding gate transistors (SGTs), which are pillar-shaped semiconductor devices, have attracted attention as semiconductor elements that provide semiconductor devices with high levels of integration. In addition, there is a need for a semiconductor device having an SGT with a higher level of integration and a higher performance.

A typical planar MOS transistor has a channel extending in the horizontal direction along the upper surface of a semiconductor substrate. In contrast, an SGT has a channel extending in a direction perpendicular to the upper surface of a semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka, IEEE Transaction on Electron Devices, Vol. 38, No. 3, pp. 573-578 (1991)). Thus, SGTs provide a higher density of semiconductor devices than planar MOS transistors.

FIG. 7 shows a schematic structural view of an N-channel SGT. A Si pillar 100 (silicon semiconductor pillars are hereinafter referred to as "Si pillar") whose conductivity type is P-type or i-type (intrinsic) has N+ layers 101a and 101b (semiconductor regions containing donor impurities in high concentrations are hereinafter referred to as "N+ layer") formed in the upper and lower portions of the Si pillar 100, one serving as the source and the other serving as the drain. The portion of the Si pillar 100 between the N+ layers 101a and 101b, which serve as the source and the drain, forms a channel region 102. A gate insulating layer 103 is formed so as to surround the channel region 102. A gate conductor layer 104 is formed so as to surround the gate insulating layer 103. In the SGT, the N+ layers 101a and 101b, which serve as the source and the drain, the channel region 102, the gate insulating layer 103, and the gate conductor layer 104 are formed so as to have a pillar shape as a whole. Hence, in plan view, the area occupied by the SGT corresponds to the area occupied by a single source or drain N+ layer of a planar MOS transistor. Thus, a circuit chip having SGTs can achieve a smaller chip size than a circuit chip having planar MOS transistors.

There is a need for a circuit having SGTs shown in FIG. 7 with a higher level of integration.

Another example of the related art is disclosed in C. Y. Ting, V. J. Vivalda, and H. G. Schaefer, "Study of Planarized Sputter-Deposited SiO2", J. Vac. Sci. Technol. 15(3), pp. 1105-1112, May/June (1978).

SUMMARY OF THE INVENTION

There is a need to achieve a higher density of pillar-shaped semiconductor devices.

Solution to Problem

A method for manufacturing a pillar-shaped semiconductor device according to an aspect of the present invention includes the steps of:

forming a first mask material layer extending in a band shape in one direction in plan view on a semiconductor layer on a substrate;

etching the semiconductor layer using the first mask material layer as a mask to form a first band-shaped semiconductor pillar;

forming a first material layer so as to cover the first mask material layer, the first band-shaped semiconductor pillar, and a portion of the substrate around an outer periphery of the first band-shaped semiconductor pillar;

forming a second material layer so as to cover the first material layer;

planarizing the first material layer and the second material layer such that upper surfaces thereof are located at the same height as an upper surface of the first mask material layer;

etching a top portion of the first material layer using the first mask material layer and the second material layer as a mask to form first recesses;

forming a second mask material layer so as to fill the first recesses above the top portion of the first material layer and such that an upper surface of the second mask material layer is located at the same height as the upper surface of the first mask material layer;

removing the second material layer;

etching the first material layer using the first mask material layer and the second mask material layer as a mask to form a first band-shaped material pillar and a second band-shaped material pillar based on the first material layer on both sides of the first band-shaped semiconductor pillar in plan view;

forming a first semiconductor layer so as to cover the first mask material layer, the second mask material layer, the first band-shaped semiconductor pillar, the first band-shaped material pillar, the second band-shaped material pillar, and the substrate;

forming a third material layer so as to cover the first semiconductor layer;

planarizing the first semiconductor layer and the third material layer such that upper surfaces thereof are located at the same height as the upper surface of the first mask material layer;

etching a top portion of the first semiconductor layer using the first mask material layer, the second mask material layer, and the third material layer as a mask to form second recesses;

forming a third mask material layer so as to fill the second recesses above the top portion of the first semiconductor layer and such that an upper surface of the third mask material layer is located at the same height as the upper surface of the first mask material layer;

removing the third material layer;

etching the first semiconductor layer using the first mask material layer, the second mask material layer, and the third mask material layer as a mask to form a second band-shaped semiconductor pillar and a third band-shaped semiconductor pillar based on the first semiconductor layer outside the first band-shaped material pillar and the second band-shaped material pillar in plan view;

removing the first band-shaped material pillar and the second band-shaped material pillar;

forming a fourth material layer around outer peripheries of the first band-shaped semiconductor pillar, the second band-shaped semiconductor pillar, and the third band-shaped semiconductor pillar such that an upper surface of the fourth material layer is located at the same height as the upper surface of the first mask material layer;

forming a fourth mask material layer extending in a band shape on the first mask material layer, the third mask material layer, and the fourth material layer in a direction perpendicular to the direction in which the first mask material layer extends in a band shape in plan view; and etching the first band-shaped semiconductor pillar, the second band-shaped semiconductor pillar, and the third band-shaped semiconductor pillar using the fourth mask material layer as a mask to form a first semiconductor pillar, a second semiconductor pillar, and a third semiconductor pillar, wherein pillar-shaped semiconductor devices having channels in the first semiconductor pillar, the second semiconductor pillar, and the third semiconductor pillar are formed.

More preferably, the second band-shaped semiconductor pillar and the third band-shaped semiconductor pillar are formed from a second semiconductor base different from a first semiconductor base for the first band-shaped semiconductor pillar.

More preferably, one of the first mask material layer and the second mask material layer is formed so as to be wider than the other in plan view.

More preferably, one of the first mask material layer and the third mask material layer is formed so as to be wider than the other in plan view.

More preferably, one of the first mask material layer and the fourth mask material layer is formed so as to be wider than the other in plan view.

More preferably, the method for manufacturing a pillar-shaped semiconductor device includes the steps of:

forming a gate insulating layer so as to surround side surfaces of the first semiconductor pillar, the second semiconductor pillar, and the third semiconductor pillar; and forming a gate conductor layer so as to surround the gate insulating layer, wherein the gate conductor layer is formed so as to fill spaces between the first semiconductor pillar, the second semiconductor pillar, and the third semiconductor pillar.

More preferably, a semiconductor layer containing a donor or acceptor impurity is formed by epitaxial growth, the semiconductor layer covering top portions of the first semiconductor pillar, the second semiconductor pillar, and the third semiconductor pillar, or having a lower end thereof located at an upper portion of the gate conductor layer in a perpendicular direction and being in contact with and connected to the side surfaces of the first semiconductor pillar, the second semiconductor pillar, and the third semiconductor pillar.

More preferably, the method for manufacturing a pillar-shaped semiconductor device includes the steps of:

forming a fifth material layer around the outer peripheries of the first band-shaped semiconductor pillar, the second band-shaped semiconductor pillar, and the third band-shaped semiconductor pillar such that an upper surface of the fifth material layer is located at the same height as the upper surface of the first mask material layer;

forming a third band-shaped material pillar having a fifth mask material layer on a top portion thereof on the first mask material layer, the third mask material layer, and the fifth material layer, the third band-shaped material pillar being perpendicular to the first band-shaped semiconductor pillar in plan view;

forming a fourth band-shaped material pillar having a sixth mask material layer on a top portion thereof on one side of the third band-shaped material pillar and a fifth band-shaped material pillar having a seventh mask material layer on a top portion thereof on the other side of the third band-shaped material pillar;

removing the fifth mask material layer and the third band-shaped material pillar; and etching the first band-shaped semiconductor pillar, the second band-shaped semiconductor pillar, and the third band-shaped semiconductor pillar using one or both of the sixth mask material layer and the fourth band-shaped material pillar as a mask to form the first semiconductor pillar, the second semiconductor pillar, and the third semiconductor pillar while etching the first band-shaped semiconductor pillar, the second band-shaped semiconductor pillar, and the third band-shaped semiconductor pillar using one or both of the seventh mask material layer and the fifth band-shaped material pillar as a mask to form a fourth semiconductor pillar, a fifth semiconductor pillar, and a sixth semiconductor pillar in regions where the seventh mask material layer intersects the first band-shaped semiconductor pillar, the second band-shaped semiconductor pillar, and the third band-shaped semiconductor pillar in plan view, wherein the sixth mask material layer and the seventh mask material layer have the same width in plan view.

The present invention provides high-density pillar-shaped semiconductor devices.

BRIEF DESCRIPTION OF THE DRAWINGS

FIGS. 1OA to 1OC are a plan view and sectional structural views illustrating the method for manufacturing a pillar-shaped semiconductor device having an SGT according to the first embodiment.

FIGS. 2CA to 2CC are a plan view and sectional structural views illustrating the method for manufacturing a pillar-shaped semiconductor device having an SGT according to the second embodiment.

DESCRIPTION OF THE PREFERRED EMBODIMENTS

Methods for manufacturing pillar-shaped semiconductor devices according to embodiments of the present invention will hereinafter be described with reference to the drawings.

First Embodiment

A method for manufacturing an SRAM cell circuit as a pillar-shaped semiconductor device having an SGT according to a first embodiment of the present invention will hereinafter be described with reference to FIGS. 1AA to 1UC, where the figures with the suffix A show plan views, the figures with the suffix B show sectional structural views taken along line X-X' of the figures with the suffix A, and the figures with the suffix C show sectional structural views taken along line Y-Y' of the figures with the suffix A.

Figure 1A:
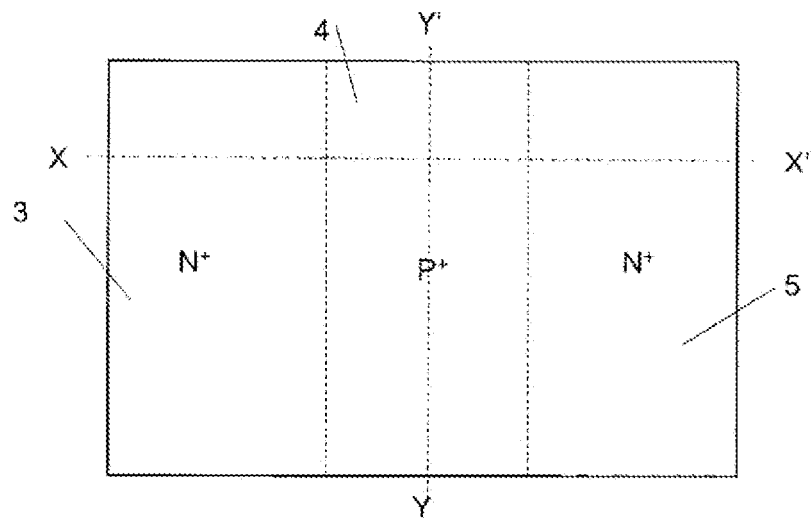
FIGS. 1AA to 1AC are a plan view and sectional structural views illustrating a method for manufacturing a pillar-shaped semiconductor device having an SGT according to a first embodiment.
Figure 1A:
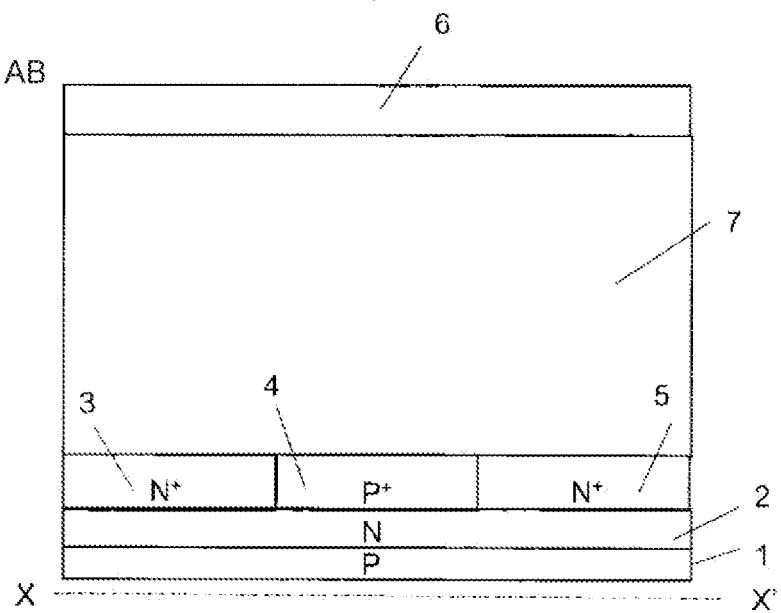
Figure 1A:
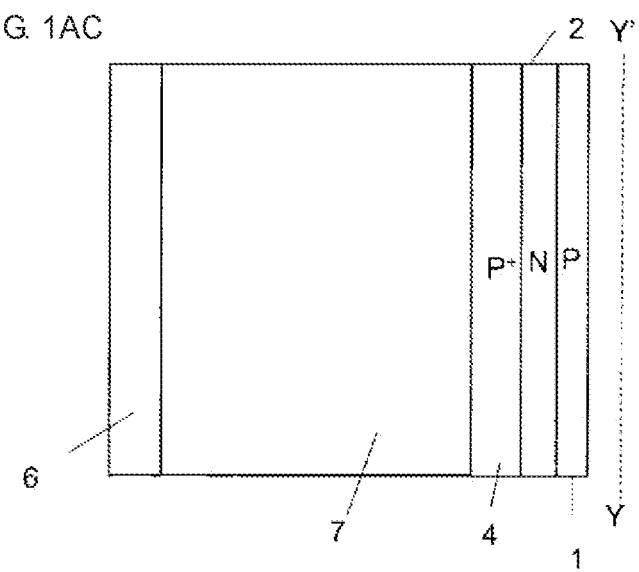

As shown in FIGS. 1AA to 1AC, an N layer 2 is formed on a P-layer substrate 1 by epitaxial crystal growth. N+ layers 3 and 5 and a P+ layer 4 are then formed in the surface layer of the N layer 2 by ion implantation. An i layer (intrinsic Si layer) 7 is then formed. A mask material layer 6 composed of, for example, a SiO2 layer, an aluminum oxide (Al2O3) layer, and a SiO2 layer is then formed. The i layer 7 may also be formed of N-type or P-type Si containing a small amount of donor or acceptor impurity.

Figure 1B:
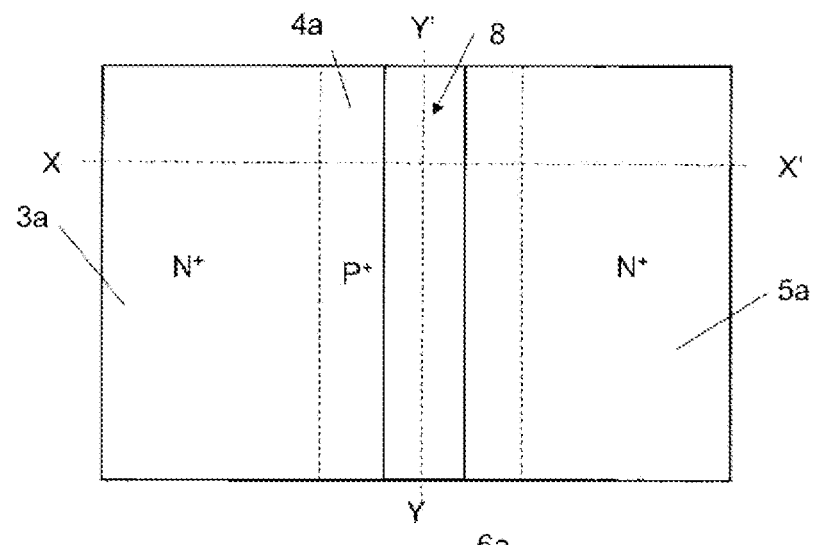
FIGS. 1BA to 1BC are a plan view and sectional structural views illustrating the method for manufacturing a pillar-shaped semiconductor device having an SGT according to the first embodiment.
Figure 1B:
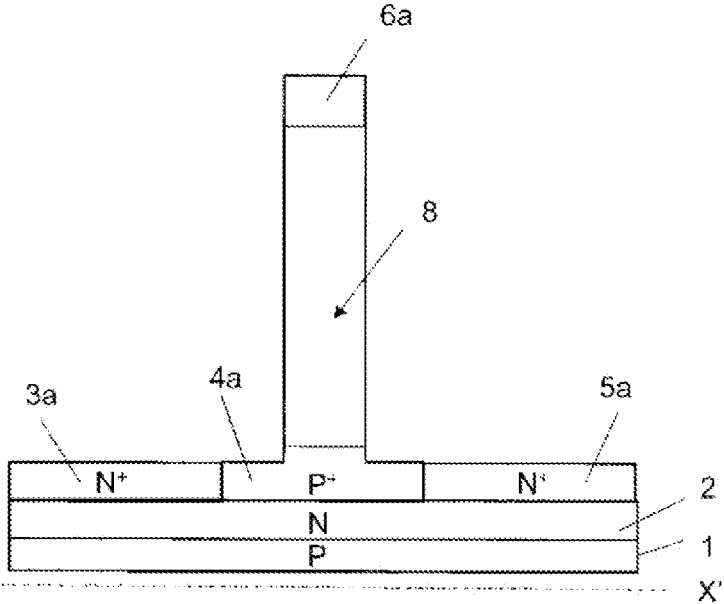
Figure 1B:
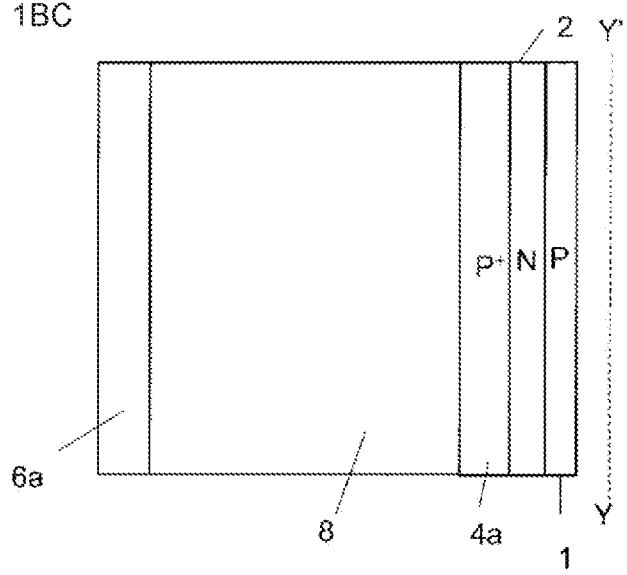

Next, as shown in FIGS. 1BA to 1BC, the mask material layer 6 is subjected to lithography and etching to form a mask material layer 6a extending in the Y direction in plan view. The i layer 7 and the surface layers of the N+ layers 3 and 5 and the P+ layer 4 are then etched using the mask material layer 6a as an etching mask to form a band-shaped Si pillar 8. N+ layers 3a and 5a and a P+ layer 4a are formed on the N layer 2.

Figure 1C:
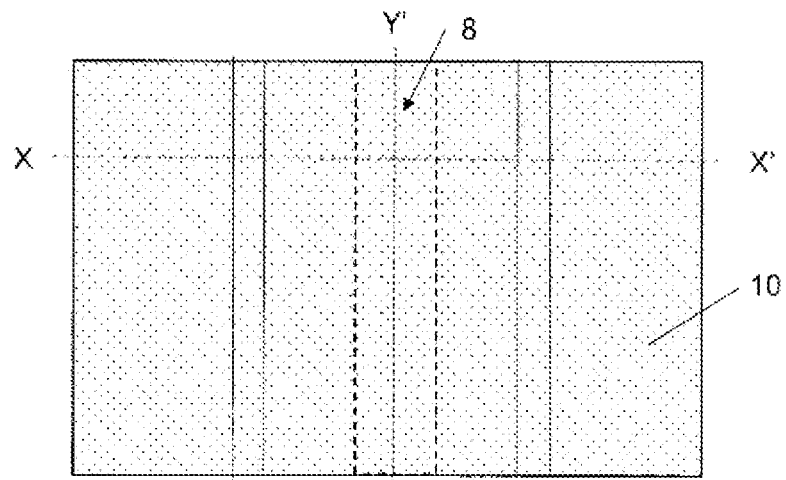
FIGS. 1CA to 1CC are a plan view and sectional structural views illustrating the method for manufacturing a pillar-shaped semiconductor device having an SGT according to the first embodiment.
Figure 1C:
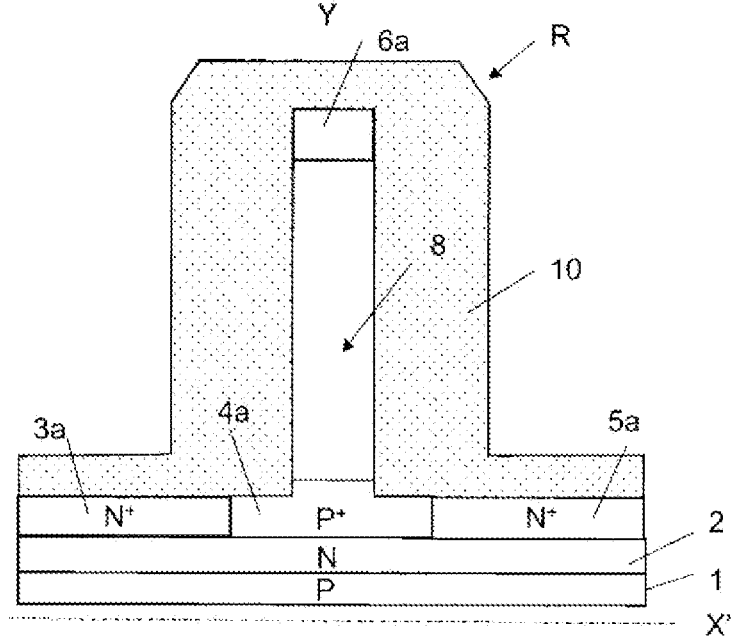
Figure 1C:
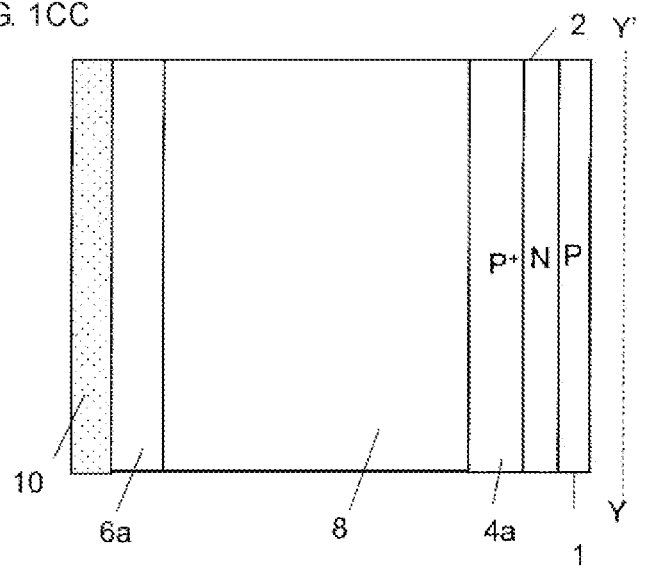

Next, as shown in FIGS. 1CA to 1CC, a SiGe layer 10 is formed so as to cover the band-shaped Si pillar 8, the N+ layers 3a and 5a, and the P+ layer 4a by atomic layer deposition (ALD).

Figure 1D:
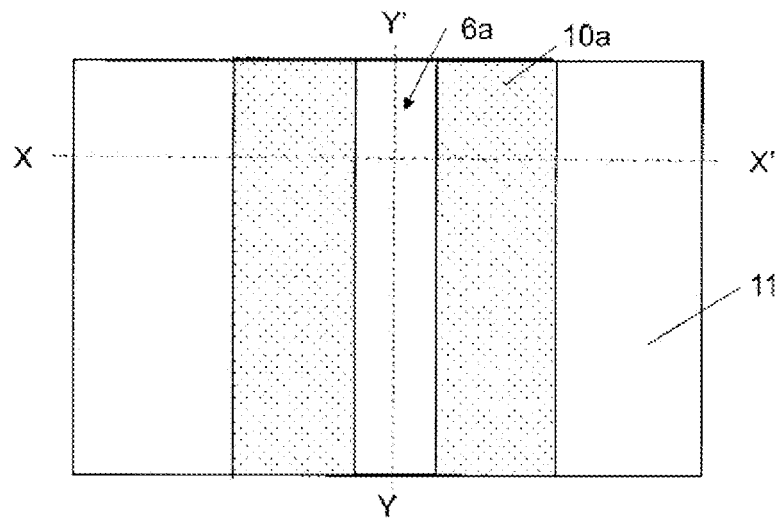
FIGS. 1DA to 1DC are a plan view and sectional structural views illustrating the method for manufacturing a pillar-shaped semiconductor device having an SGT according to the first embodiment.
Figure 1D:
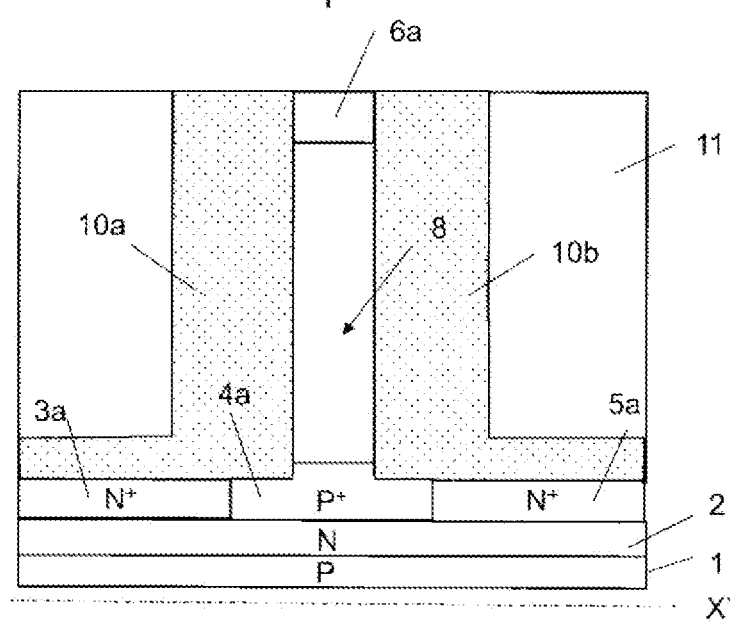
Figure 1D:
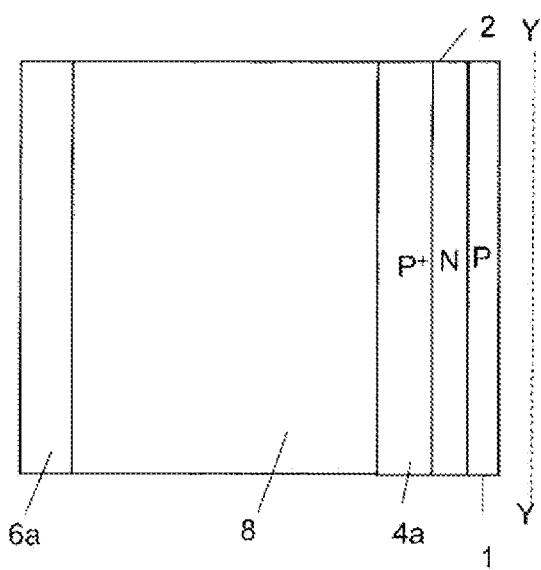

Next, as shown in FIGS. 1DA to 1DC, the entire surface is covered with a SiO2 layer (not shown), for example, by flow chemical vapor deposition (flow CVD). The SiO2 layer and the SiGe layer 10 are then polished by chemical mechanical polishing (CMP) such that the upper surfaces thereof are located at the same height as the upper surface of the mask material layer 6a, thereby forming a SiO2 layer 11 and SiGe layers 10a and 10b. In this case, it is desirable that the side surfaces of the top portions of the SiGe layers 10a and 10b be perpendicular. Accordingly, it is desirable that rounded corners R of the top portion of the SiGe layer 10 in FIGS. 1CA to 1CC be removed in the step of polishing the SiO2 layer and the SiGe layer 10.

Figure 1E:
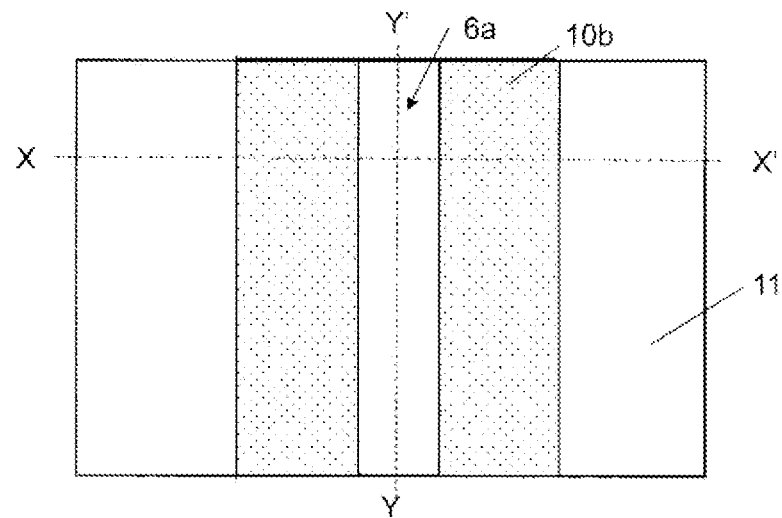
FIGS. 1EA to 1EC are a plan view and sectional structural views illustrating the method for manufacturing a pillar-shaped semiconductor device having an SGT according to the first embodiment.
Figure 1E:
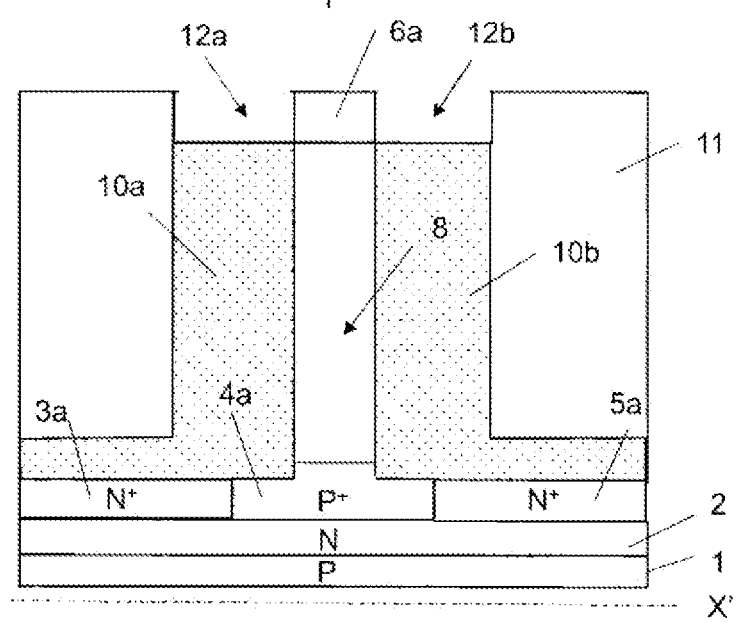
Figure 1E:
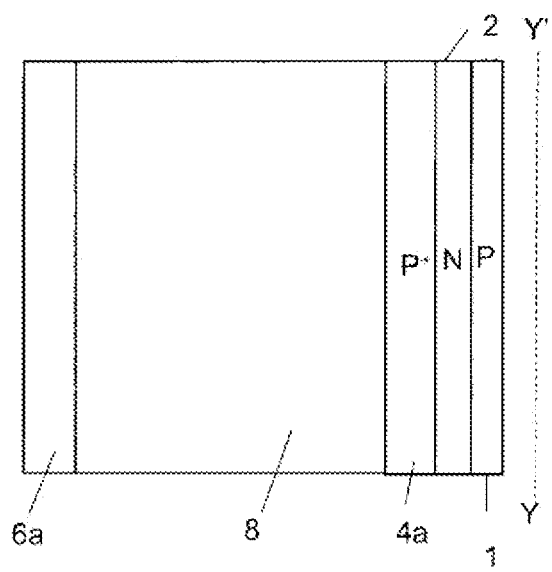

Next, as shown in FIGS. 1EA to 1EC, the top portions of the SiGe layers 10a and 10b are etched using the SiO2 layer 11 and the mask material layer 6a as a mask to form recesses 12a and 12b. It is desirable that the top portions of the SiGe layers 10a and 10b be polished such that the bottom portions of the recesses 12a and 12b are located at the same height as the lower portion of the mask material layer 6a. Since the rounded corners R of the top portion of the SiGe layer 10 in FIGS. 1CA to 1CC have been removed in the step of polishing the SiO2 layer and the SiGe layer 10, recesses 12a and 12b having perpendicular outer peripheral side surfaces are formed.

Figure 1F:
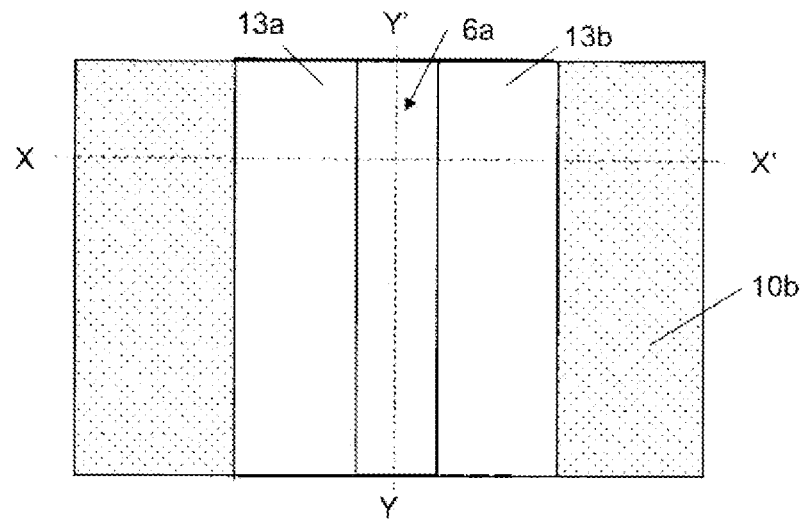
FIGS. 1FA to 1FC are a plan view and sectional structural views illustrating the method for manufacturing a pillar-shaped semiconductor device having an SGT according to the first embodiment.
Figure 1F:
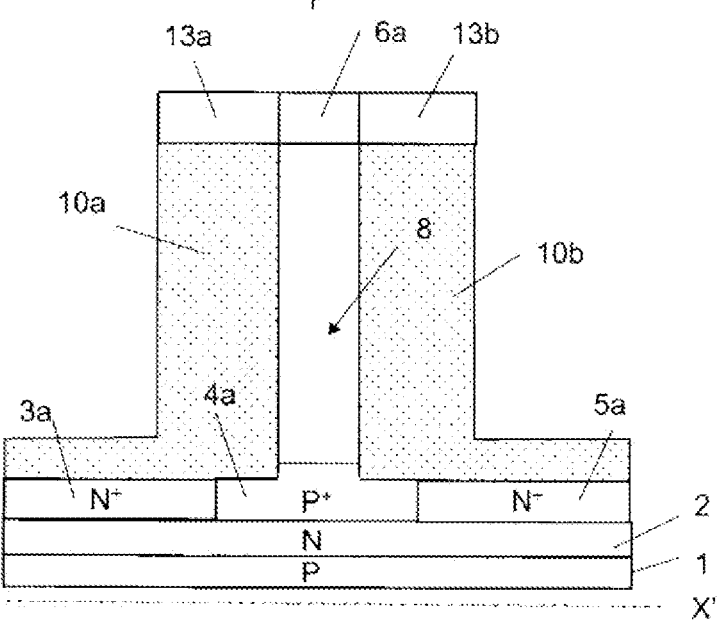
Figure 1F:
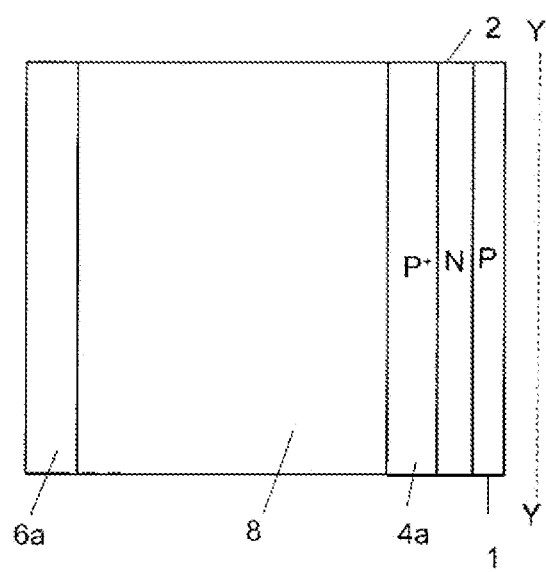

Next, as shown in FIGS. 1FA to 1FC, the entire surface is covered with a SiN layer (not shown), and the SiN layer is polished over the entire surface by CMP such that the upper surface thereof is located at the same height as the upper surface of the mask material layer 6a. The SiO2 layer 11 outside the SiGe layers 10a and 10b in plan view is then removed. Thus, SiN layers 13a and 13b having the same shape as the top portions of the SiGe layers 10a and 10b in plan view are formed on both sides of the mask material layer 6a and the band-shaped Si pillar 8.

Figure 1G:
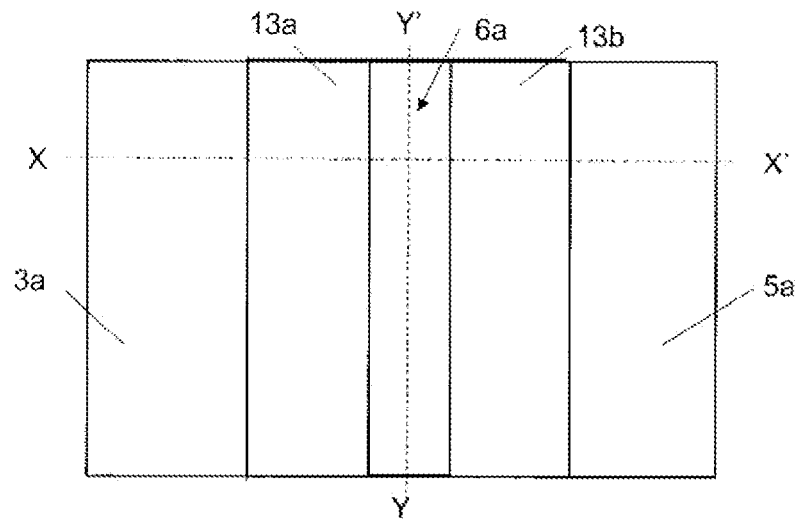
FIGS. 1GA to 1GC are a plan view and sectional structural views illustrating the method for manufacturing a pillar-shaped semiconductor device having an SGT according to the first embodiment.
Figure 1G:
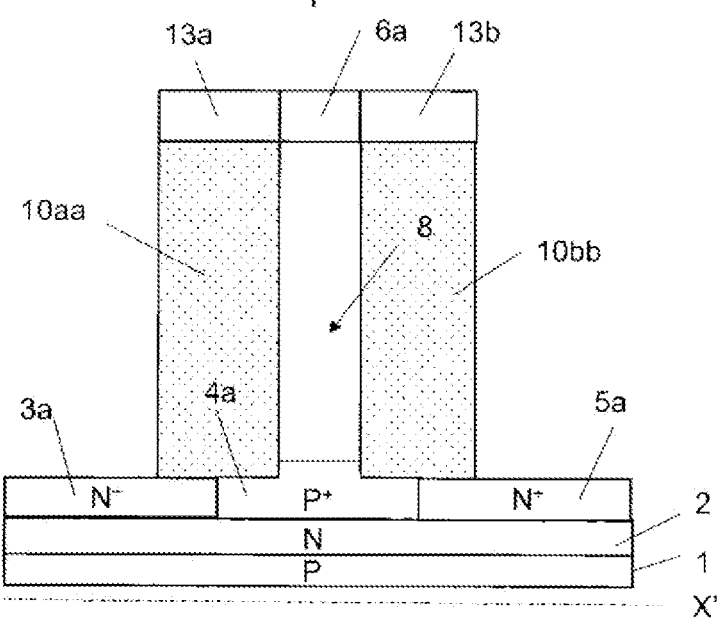
Figure 1G:
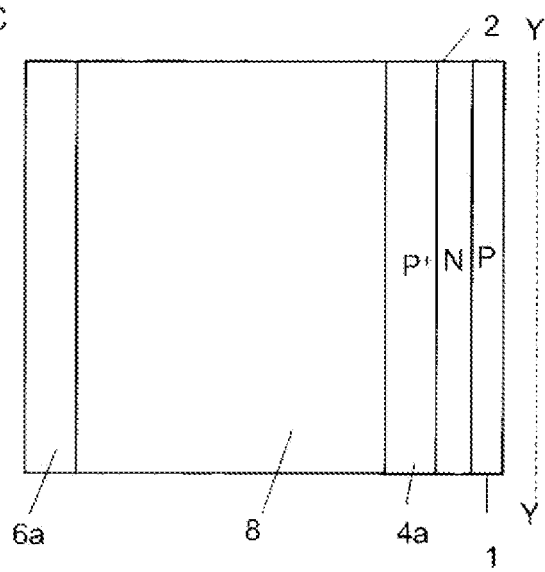

Next, as shown in FIGS. 1GA to 1GC, the SiGe layers 10a and 10b outside the SiN layers 13a and 13b in plan view are etched using the SiN layers 13a and 13b as a mask. Thus, band-shaped SiGe layers 10aa and 10bb having the same width in plan view are formed on both sides of the band-shaped Si pillar 8.

Figure 1H:
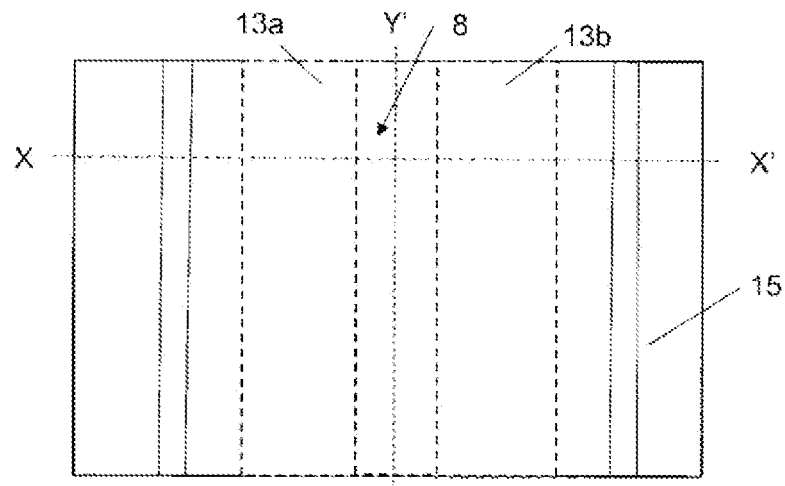
FIGS. 1HA to 1HC are a plan view and sectional structural views illustrating the method for manufacturing a pillar-shaped semiconductor device having an SGT according to the first embodiment.
Figure 1H:
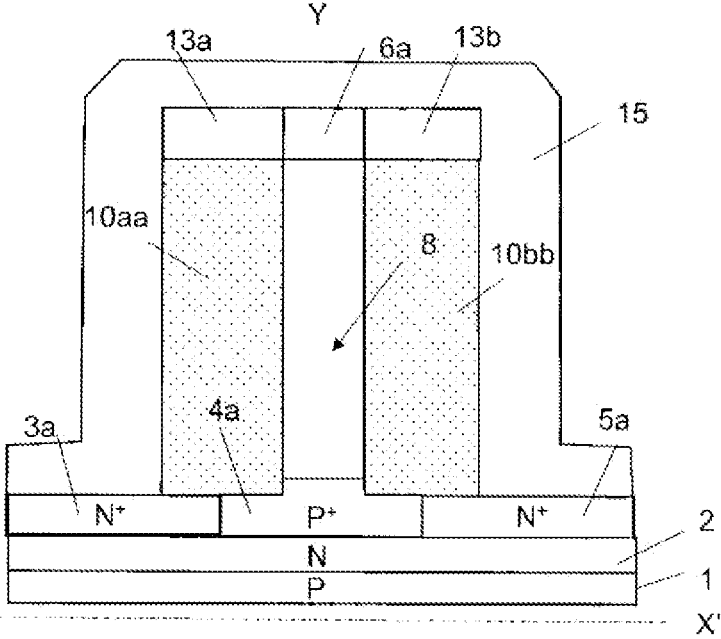
Figure 1H:
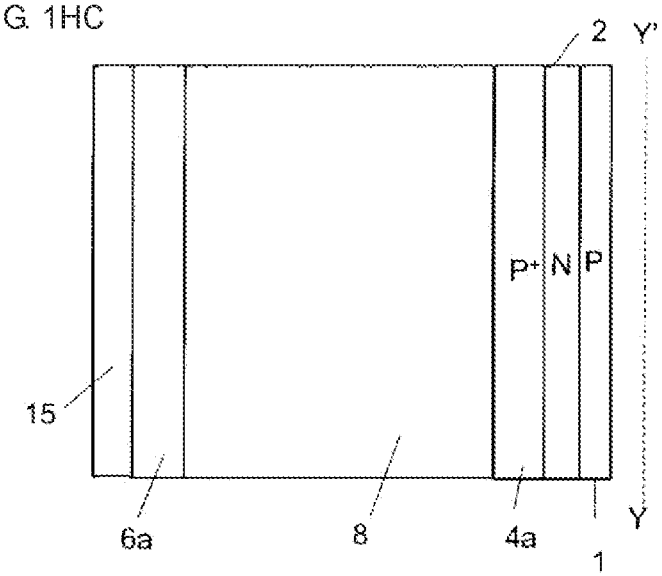

Next, as shown in FIGS. 1HA to 1HC, a Si layer 15 is formed so as to cover the entire surface by Si ALD. The Si layer 15 may also be a layer containing a slight amount of donor or acceptor impurity.

Figure 1I:
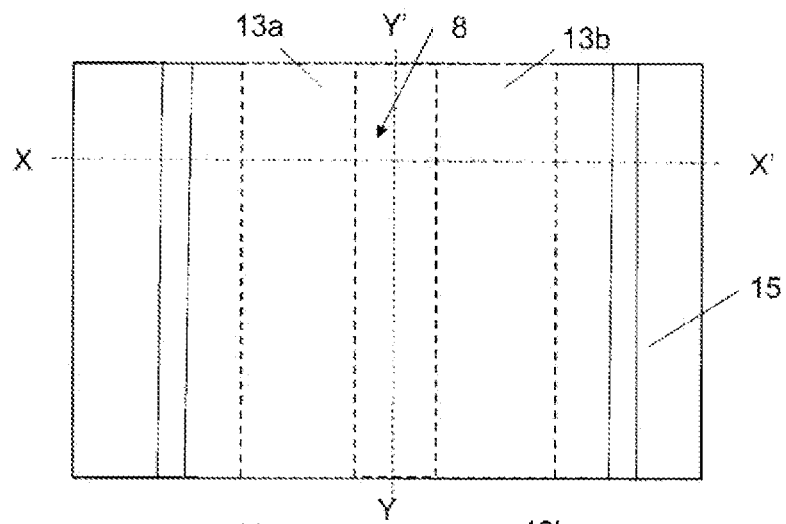
FIGS. 1IA to 1IC are a plan view and sectional structural views illustrating the method for manufacturing a pillar-shaped semiconductor device having an SGT according to the first embodiment.
Figure 1I:
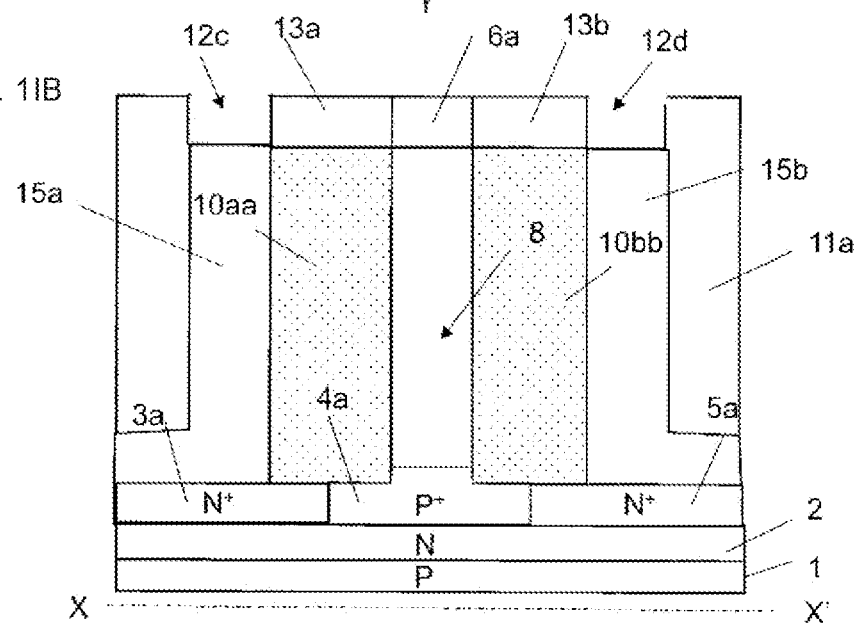
Figure 1I:
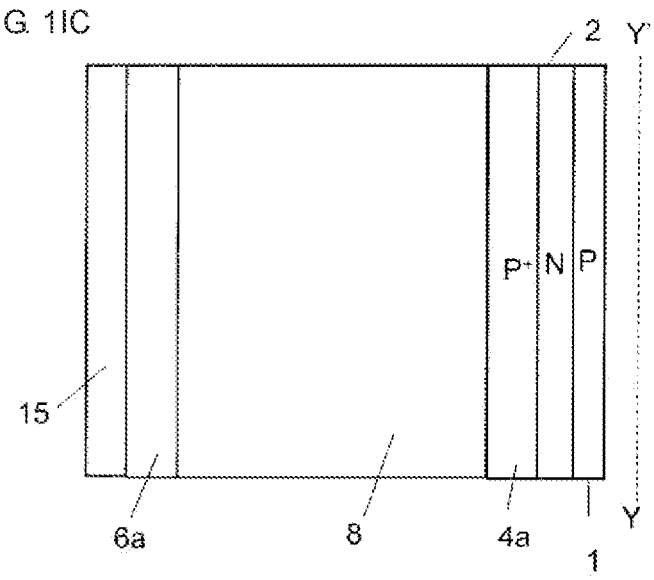

Next, a SiO2 layer (not shown) is formed so as to cover the Si layer 15. The SiO2 layer and the Si layer 15 are then polished such that the upper surfaces thereof are located at the same height as the upper surface of the mask material layer 6a, thereby forming a SiO2 layer 11a and Si layers 15a and 15b. As shown in FIGS. 1IA to 1IC, the top portions of the Si layers 15a and 15b are then etched using the mask material layers 6a, 13a, and 13b and the SiO2 layer 11a as a mask to form band-shaped recesses 12c and 12d.

Figure 1J:
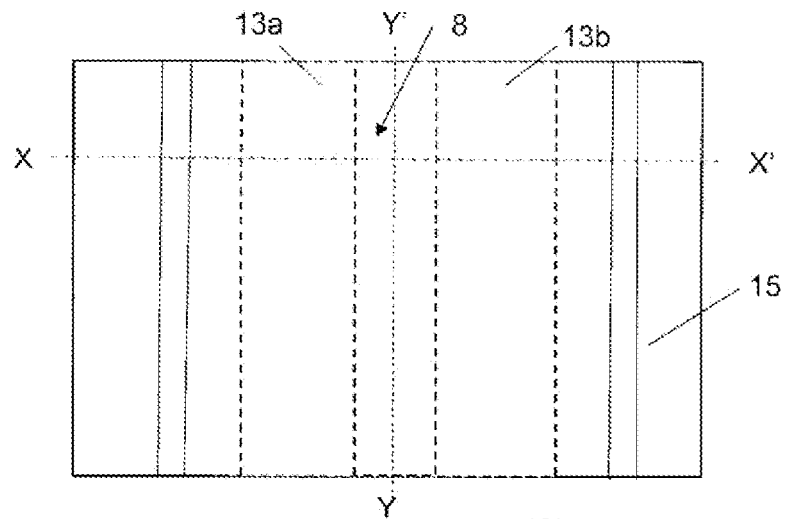
FIGS. 1JA to 1JC are a plan view and sectional structural views illustrating the method for manufacturing a pillar-shaped semiconductor device having an SGT according to the first embodiment.
Figure 1J:
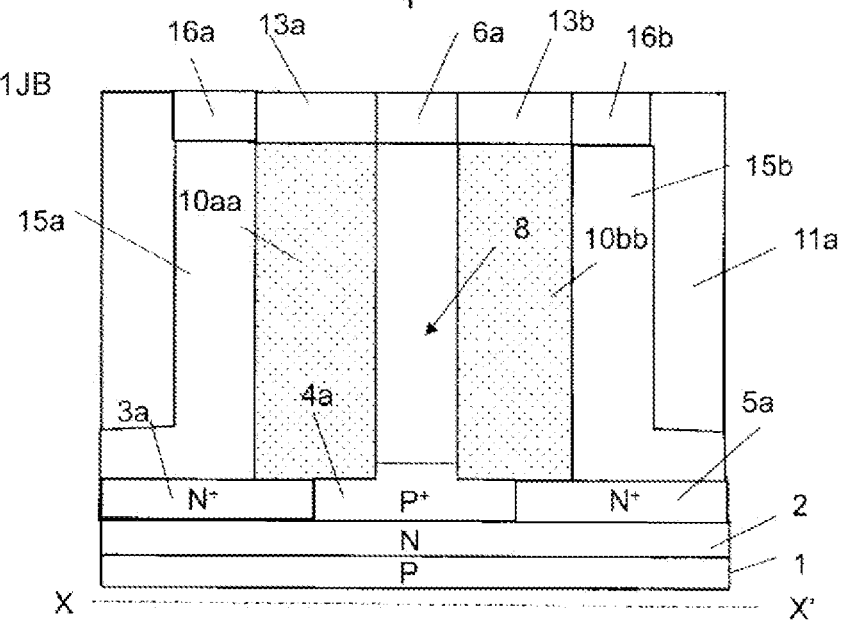
Figure 1J:
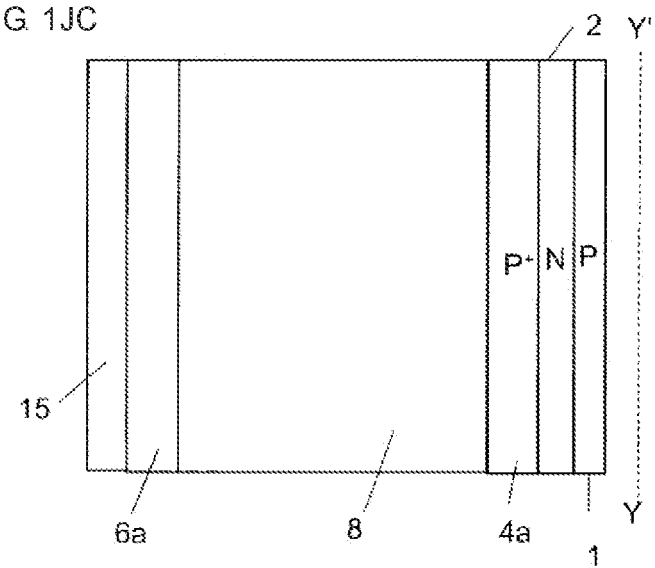

Next, as shown in FIGS. 1JA to 1JC, band-shaped SiO2 layers 16a and 16b are formed so as to fill the recesses 12c and 12d. Thus, band-shaped SiO2 layers 16a and 16b having the same width in plan view and Si layers 15a and 15b disposed under the band-shaped SiO2 layers 16a and 16b and extending over the N+ layers 3a and 5a are formed on both sides of the SiN layers 13a and 13b and the band-shaped SiGe layers 10aa and 10bb.

Figure 1K:
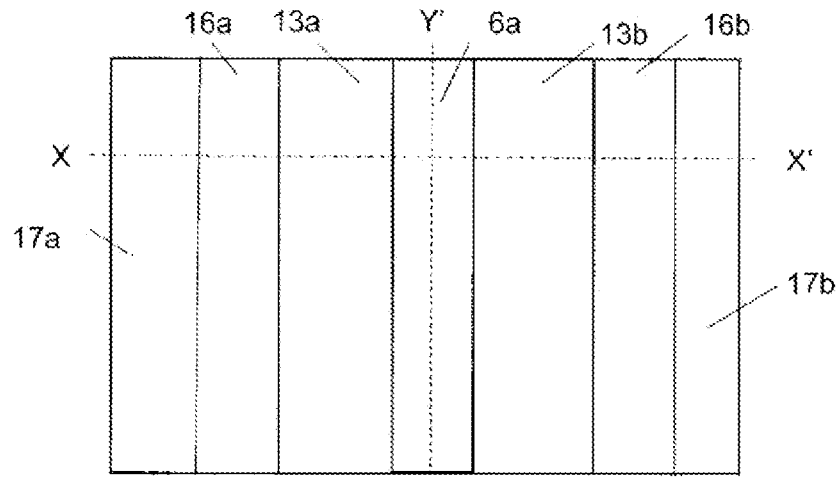
FIGS. 1KA to 1KC are a plan view and sectional structural views illustrating the method for manufacturing a pillar-shaped semiconductor device having an SGT according to the first embodiment.
Figure 1K:
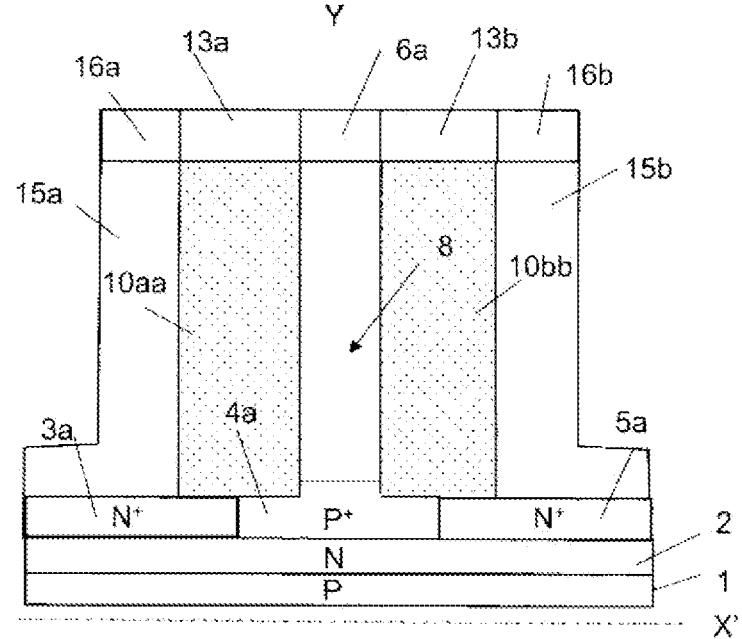
Figure 1K:
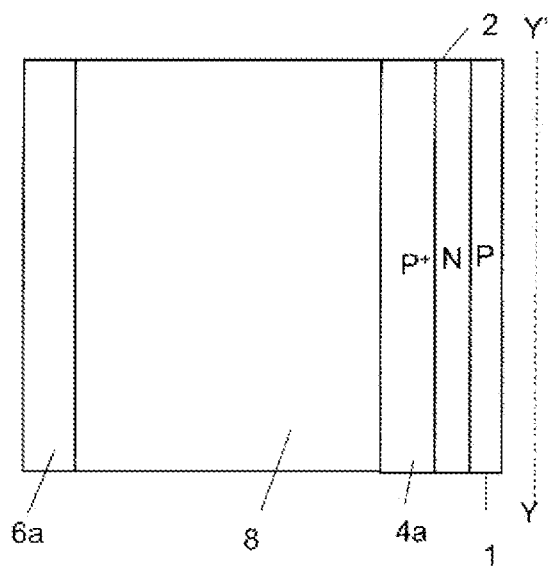

Next, as shown in FIGS. 1KA to 1KC, the SiO2 layer 11a is removed.

Figure 1L:
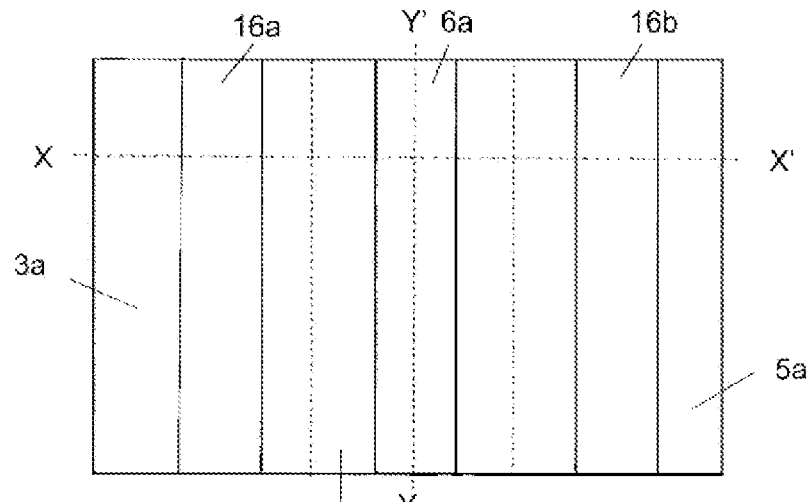
FIGS. 1LA to 1LC are a plan view and sectional structural views illustrating the method for manufacturing a pillar-shaped semiconductor device having an SGT according to the first embodiment.
Figure 1L:
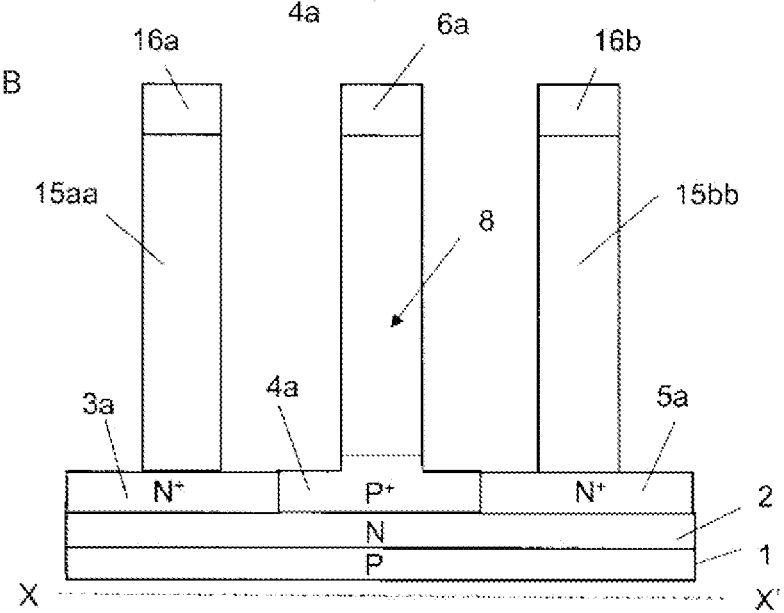
Figure 1L:
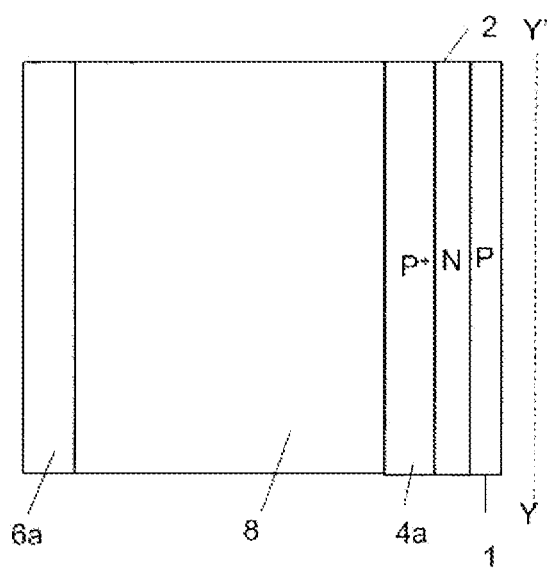

Next, as shown in FIGS. 1LA to 1LC, the Si layers 15a and 15b are etched using the mask material layers 16a and 16b, which are formed of a SiO2 layer, as a mask to form band-shaped Si pillars 15aa and 15bb. It is desirable that the Si layers 15a and 15b be etched down to the upper surfaces of the N+ layers 3a and 5a. The SiN layers 13a and 13b and the SiGe layers 10aa and 10bb outside the Si pillar 8 are then removed. Thus, band-shaped Si pillars 15aa and 15bb separated from the band-shaped Si pillar 8 by the same distance and having the same width are formed on both sides of the band-shaped Si pillar 8. The mask material layers 16a and 16b are left on the band-shaped Si pillars 15aa and 15bb.

Figure 1M:
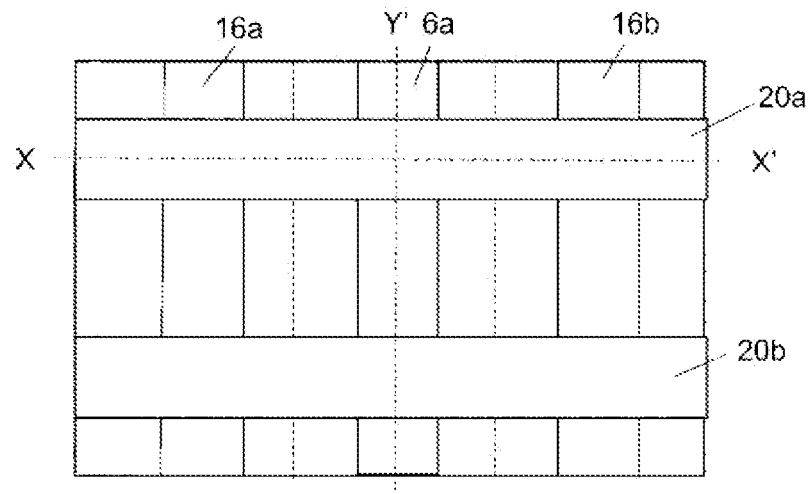
FIGS. 1MA to 1MC are a plan view and sectional structural views illustrating the method for manufacturing a pillar-shaped semiconductor device having an SGT according to the first embodiment.
Figure 1M:
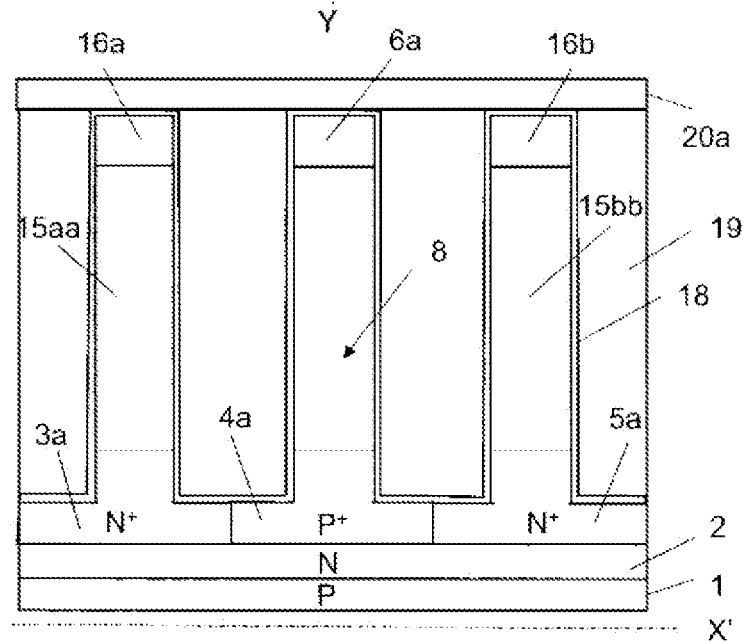
Figure 1M:
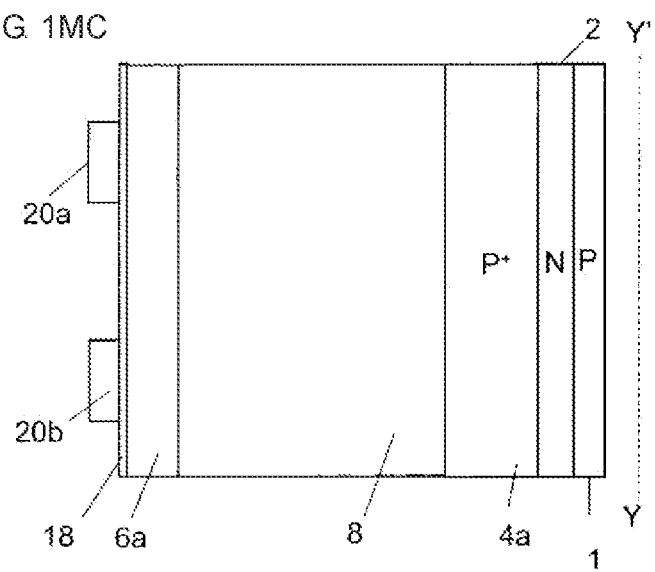

Next, as shown in FIGS. 1MA to 1MC, a thin protective material layer 18 composed of a SiO2 layer and a SiN layer is formed over the entire surface by ALD. The entire surface is then covered with a SiO2 layer (not shown), and the SiO2 layer is polished by CMP such that the upper surface thereof is located at the same height as the upper surface of the protective material layer 18 on the mask material layer 6a and the mask material layers 16a and 16b, thereby forming a SiO2 layer 19 around the outer peripheries of the band-shaped Si pillars 8, 15aa, and 15bb. A mask material layer (not shown) composed of a SiN layer and a SiO2 layer is uniformly formed over the entire surface. The mask material layer is then subjected to lithography and etching to form band-shaped mask material layers 20a and 20b on the mask material layer 6a, the mask material layers 16a and 16b, and the SiO2 layer 19 in a direction perpendicular to the direction in which the mask material layer 6a extends in a band shape in plan view.

Figure 1N:
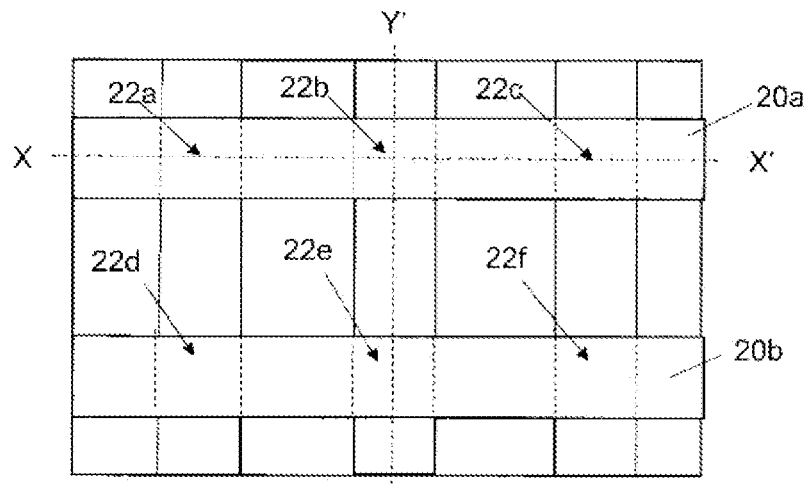
FIGS. 1NA to 1NC are a plan view and sectional structural views illustrating the method for manufacturing a pillar-shaped semiconductor device having an SGT according to the first embodiment.
Figure 1N:
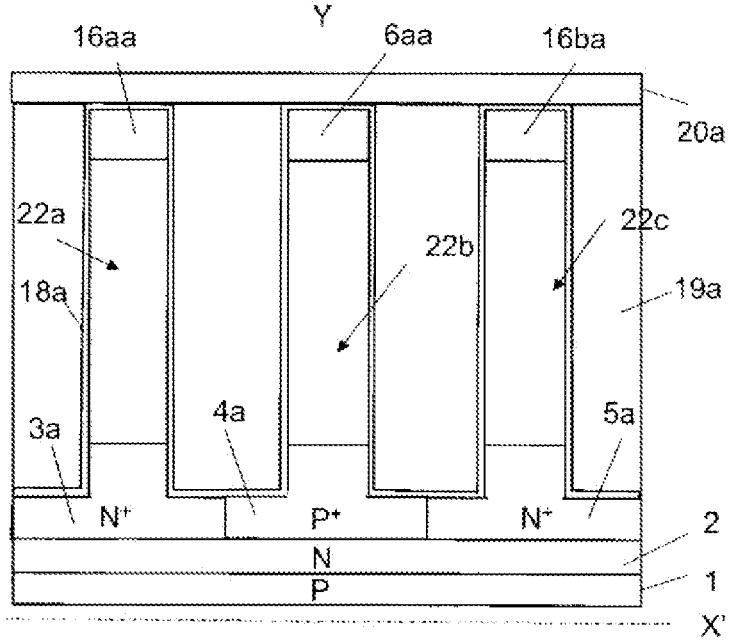
Figure 1N:
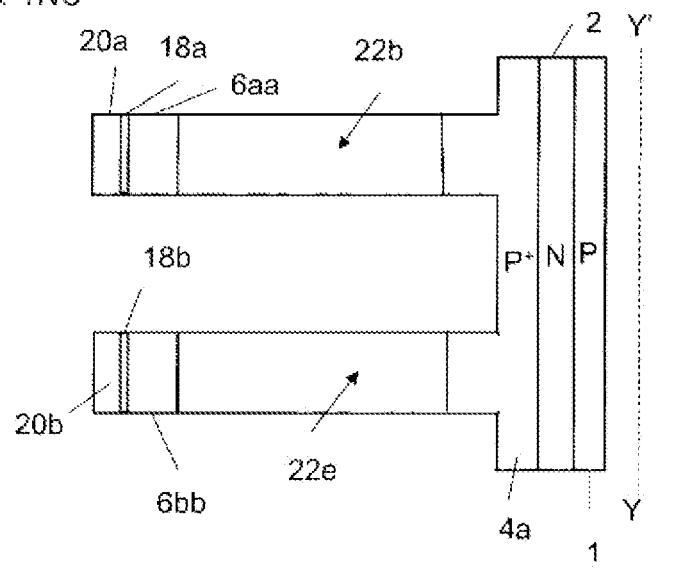
Figure 10A:
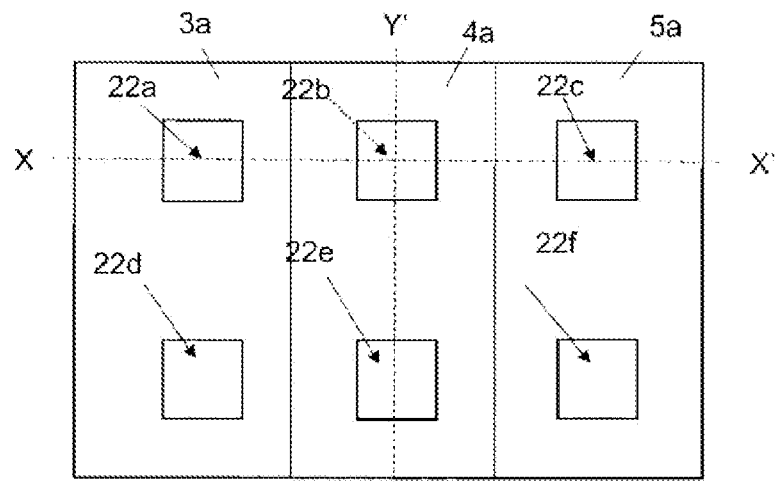
Figure 10B:
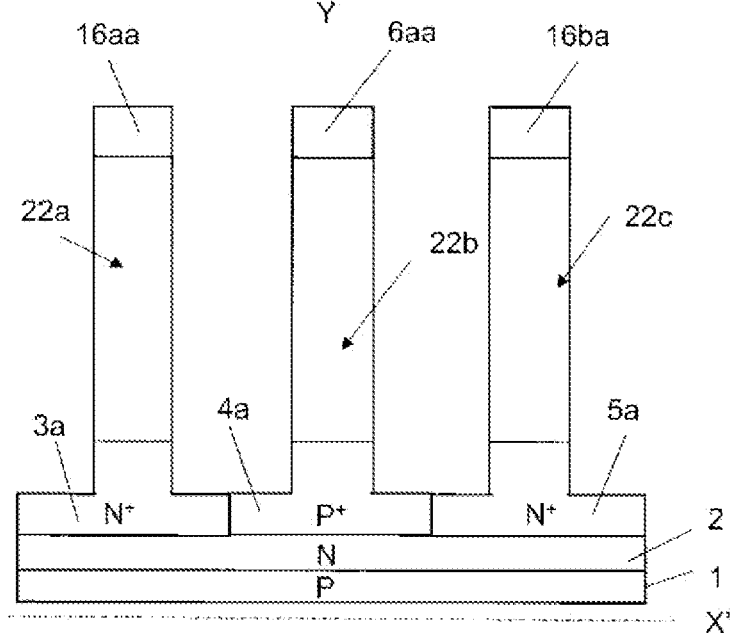
Figure 10C:
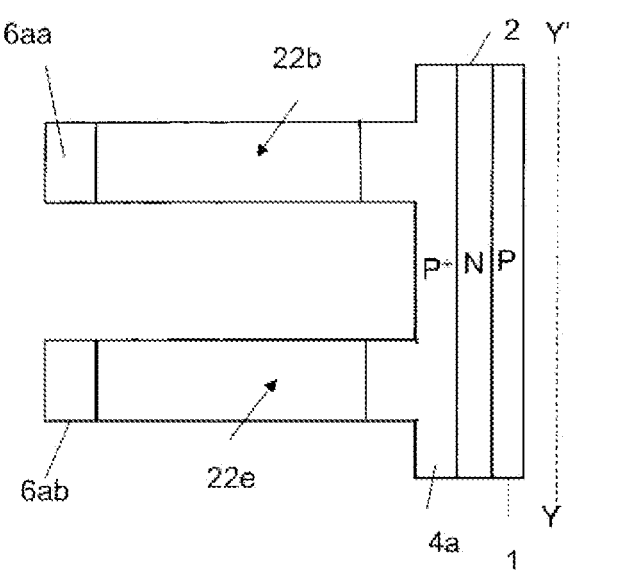

Next, as shown in FIGS. 1NA to 1NC, the SiO2 layer 19, the protective material layer 18, the mask material layers 6a, 16a, and 16b, and the band-shaped Si pillars 8, 15aa, and 15bb are etched using the mask material layers 20a and 20b as a mask. Thus, Si pillars 22a and 22d are formed on the N+ layer 3a, Si pillars 22b and 22e are formed on the P+ layer 4a, and Si pillars 22c and 22f are formed on the N+ layer 5a. A mask material layer 16aa is formed on the Si pillar 22a. A mask material layer 6aa is formed on the Si pillar 22b. A mask material layer 16ba is formed on the Si pillar 22c. A mask material layer 16ab (not shown) is formed on the Si pillar 22d. A mask material layer 6ab is formed on the Si pillar 22e. A mask material layer 16bb (not shown) is formed on the Si pillar 22f. A protective material layer 18a is formed under the band-shaped mask material layer 20a in plan view so as to cover the top portions and side surfaces of the Si pillars 22a, 22b, and 22c and so as to be connected to the upper surfaces of the N+ layer 3a, the P+ layer 4a, and the N+ layer 5a. A protective material layer 18b is formed under the band-shaped mask material layer 20b in plan view so as to cover the top portions and side surfaces of the Si pillars 22d, 22e, and 22f and so as to be connected to the upper surfaces of the N+ layer 3a, the P+ layer 4a, and the N+ layer 5a. A SiO2 layer 19a is formed under the band-shaped mask material layer 20a outside the Si pillars 22a, 22b, and 22c in plan view so as to cover the protective material layer 18a. Similarly, a SiO2 layer 19b (not shown) is formed under the band-shaped mask material layer 20b outside the Si pillars 22d, 22e, and 22f in plan view so as to cover the protective material layer 18b.

Next, as shown in FIGS. 1OA to 1OC, the band-shaped mask material layers 20a and 20b, the SiO2 layers 19a and 19b, and the protective material layers 18a and 18b are removed. A SiO2 layer (not shown) is then formed in the side surfaces of the Si pillars 22a to 22f by isotropic oxidation. The SiO2 layer is then removed. Thus, the Si pillars 22a to 22f have a circular cross-section in plan view.

Figure 1P:
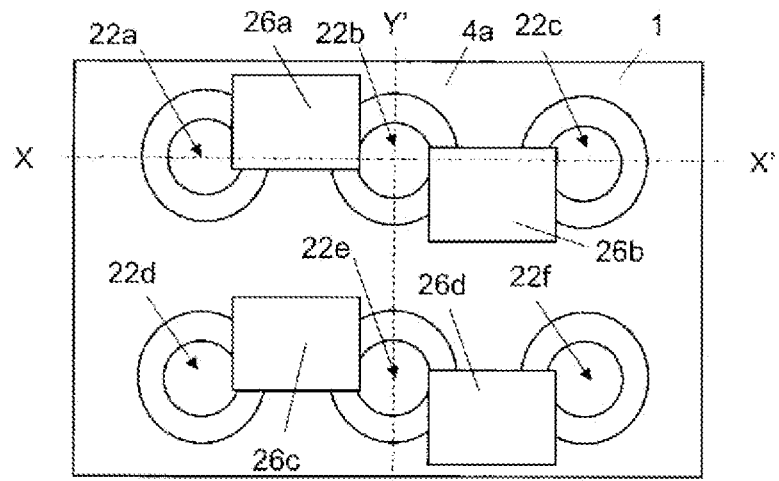
FIGS. 1PA to 1PC are a plan view and sectional structural views illustrating the method for manufacturing a pillar-shaped semiconductor device having an SGT according to the first embodiment.
Figure 1P:
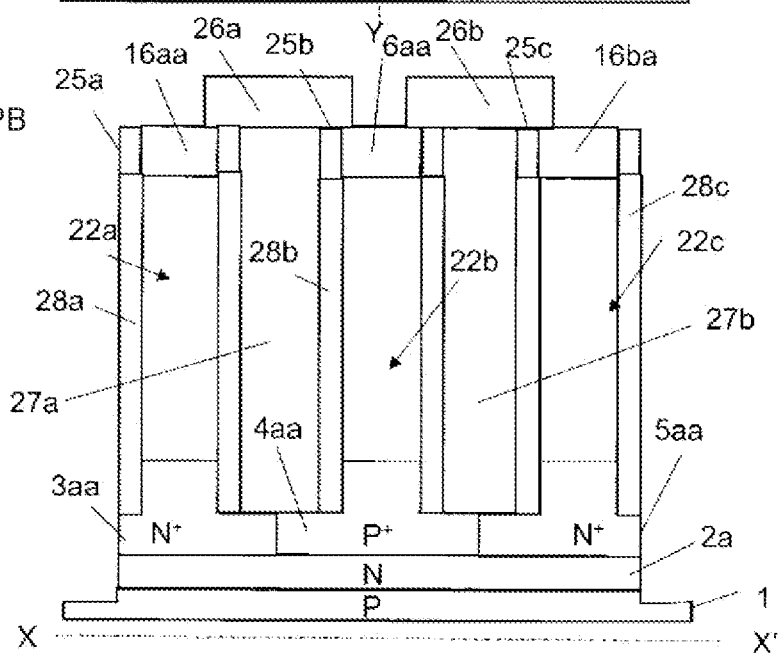
Figure 1P:
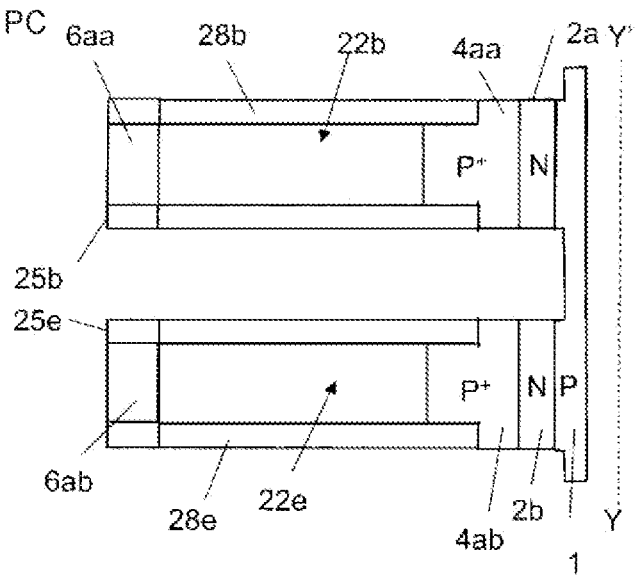

Next, as shown in FIGS. 1PA to 1PC, SiN layers 25a, 25b, 25c, 25d (not shown), 25e, and 25f (not shown) surrounding the side surfaces of the mask material layers 16aa, 6aa, 16ba, 16ab, 6ab, and 16bb and SiO2 layers 28a, 28b, 28c, 28d (not shown), 28e, and 28f (not shown) surrounding the side surfaces of the Si pillars 22a to 22f are formed. The entire surface is then covered with a SiO2 layer (not shown), and the SiO2 layer is polished by CMP such that the upper surface thereof is located at the same height as the upper surfaces of the mask material layers 16aa, 6aa, 16ba, 16ab, 6ab, and 16bb. A mask material layer 26a composed of a SiN layer and a SiO2 layer and connected to the Si pillars 22a and 22b in plan view, a mask material layer 26b connected to the Si pillars 22b and 22c, a mask material layer 26c connected to the Si pillars 22d and 22e, and a mask material layer 26d connected to the Si pillars 22e and 22f are then formed on the SiO2 layer. The SiO2 layer, the N+ layer 3a, the P+ layer 4a, the N+ layer 5a, the N layer 2, and the surface layer of the P layer substrate 1 are then etched using the mask material layers 16aa, 6aa, 16ba, 16ab, 6ab, and 16bb, the SiN layers 25a to 25f, and the SiO2 layers 28a to 28f as a mask. Thus, the bottom portions of the Si pillars 22a, 22b, and 22c are connected together through an N+ layer 3aa, a P+ layer 4aa, and an N+ layer 5aa. An N layer 2a is formed under the N+ layer 3aa, the P+ layer 4aa, and the N+ layer 5aa. Similarly, the bottom portions of the Si pillars 22c, 22d, and 22e are connected together through an N+ layer 3ab, a P+ layer 4ab, and an N+ layer 5ab. An N layer 2b is formed under the N+ layer 3ab (not shown), the P+ layer 4ab, and the N+ layer 5ab (not shown). SiO2 layers 27a, 27b, 27c (not shown), and 27d (not shown) are formed under the mask material layers 26a to 26d.

Figure 1Q:
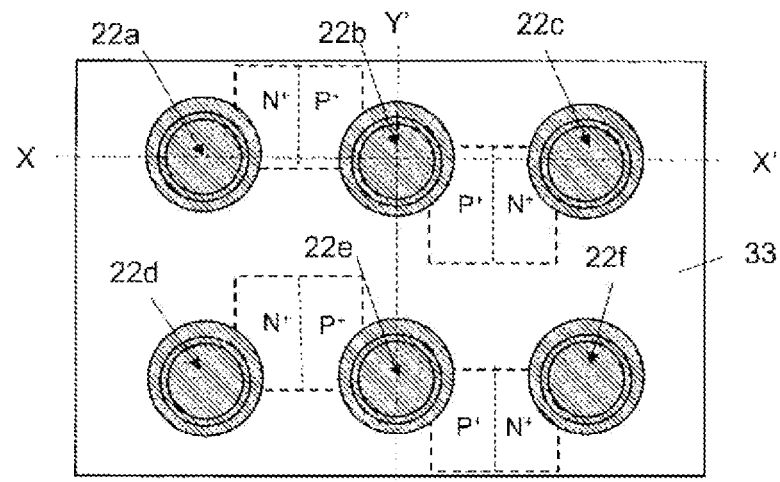
FIGS. 1QA to 1QC are a plan view and sectional structural views illustrating the method for manufacturing a pillar-shaped semiconductor device having an SGT according to the first embodiment.
Figure 1Q:
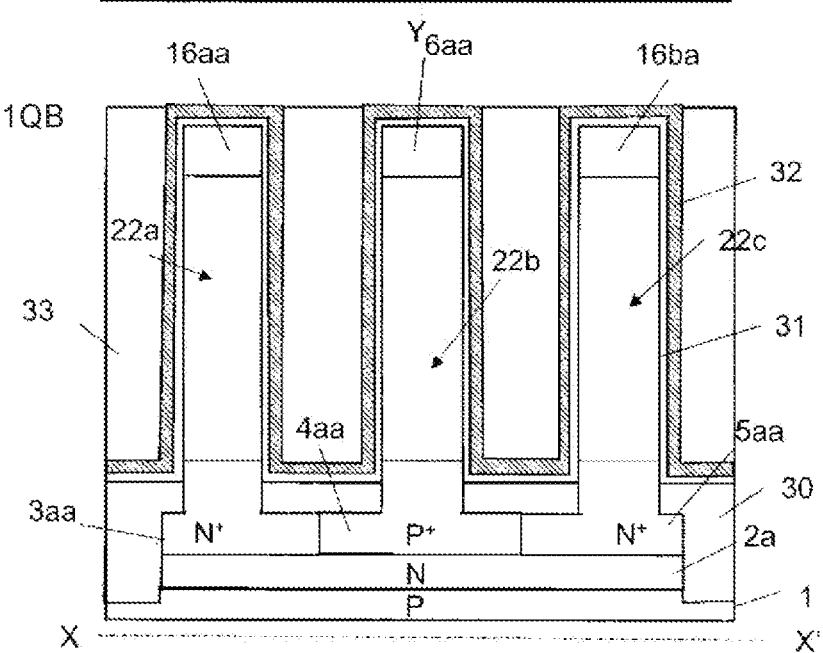
Figure 1Q:
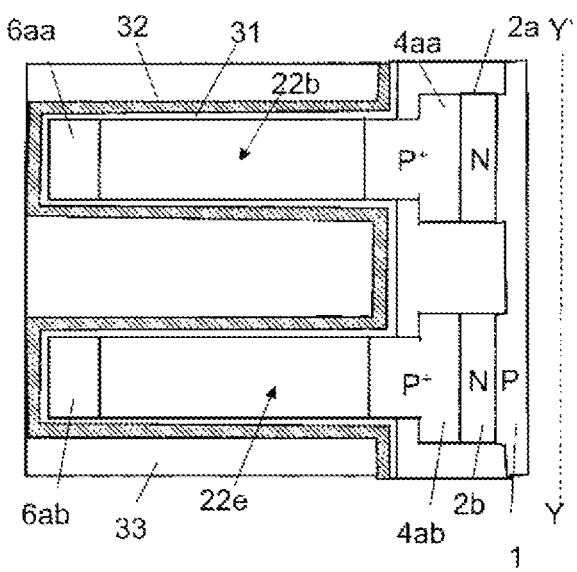

Next, as shown in FIGS. 1QA to 1QC, the mask material layers 26a to 26d are removed. The SiO2 layers 27a to 27d are removed. A SiO2 layer 30 is then formed around the outer peripheries of the N+ layers 3aa, 5aa, 3ab, and 5ab, the P+ layers 4aa and 4ab, and the N layers 2a and 2b and on the P-layer substrate 1. A HfO2 layer 31 and a TiN layer 32 are then formed so as to cover the entire surface by ALD. A SiO2 layer (not shown) is then formed so as to cover the entire surface by CVD. The SiO2 layer is then polished by CMP such that the upper surface thereof is located at the same height as the upper surface of the TiN layer 32, thereby forming a SiO2 layer 33.

Figure 1R:
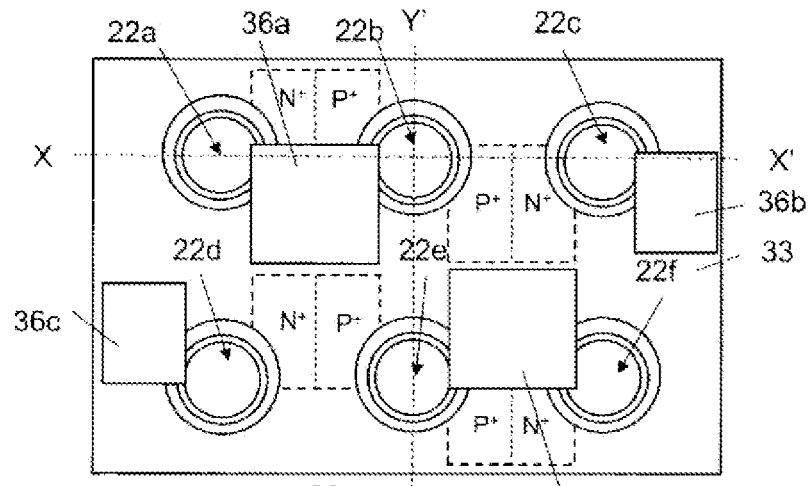
FIGS. 1RA to 1RC are a plan view and sectional structural views illustrating the method for manufacturing a pillar-shaped semiconductor device having an SGT according to the first embodiment.
Figure 1R:
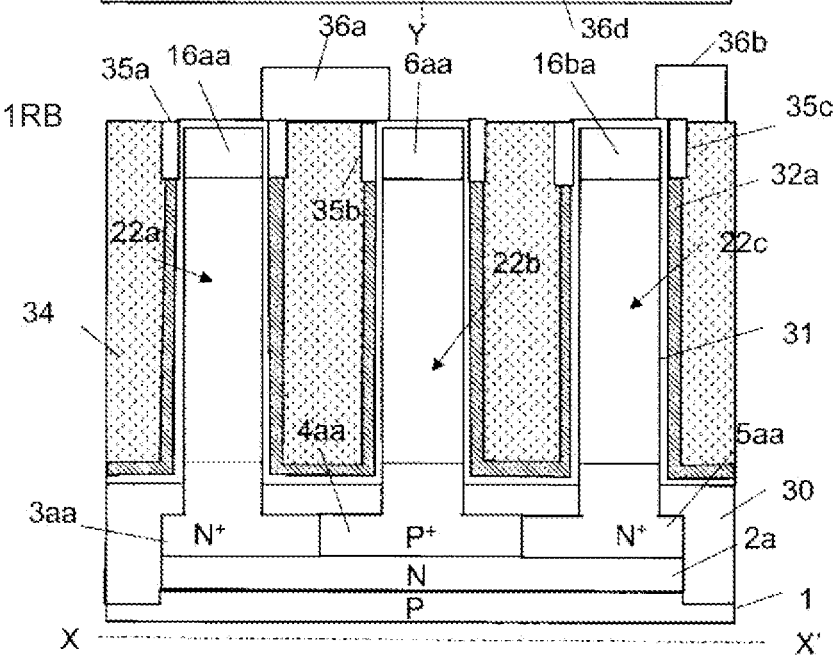
Figure 1R:
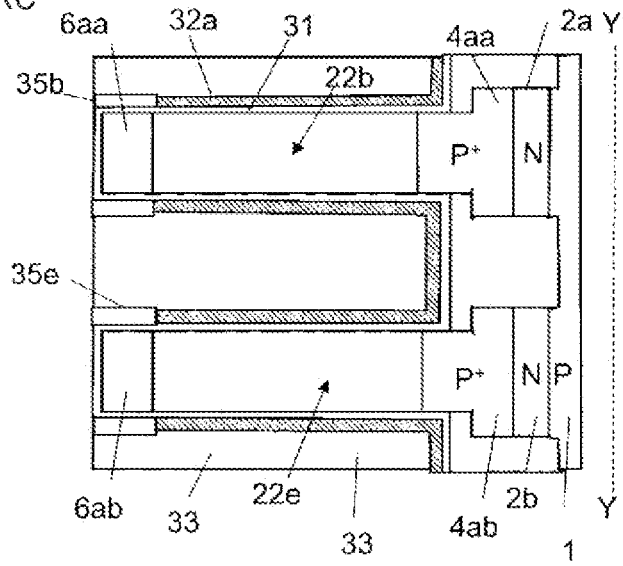

Next, as shown in FIGS. 1RA to 1RC, the entire surface is covered with a W layer. The W layer is then polished by CMP such that the upper surface thereof is located at the same height as the upper surface of the HfO2 layer 31, thereby forming a W layer 34. The top portion of the TiN layer 32 is then etched such that the upper surface thereof is located at the same height as the bottom portions of the mask material layers 16aa, 6aa, 16ba, 16ab, 6ab, and 16bb, thereby forming a TiN layer 32a. The entire surface is then covered with a SiN layer (not shown). The SiN layer is then polished by CMP such that the upper surface thereof is located at the same height as the upper surface of the HfO2 layer 31, thereby forming SiN layers 35a, 35b, 35c, 35d (not shown), 35e, and 35f (not shown). A mask material layer 36a composed of a SiN layer and connected to the Si pillars 22a and 22b in plan view is then formed. Similarly, a mask material layer 36b connected to the Si pillar 22c, a mask material layer 36c connected to the Si pillar 22d, and a mask material layer 36d connected to the Si pillars 22e and 22f in plan view are formed.

Figure 1S:
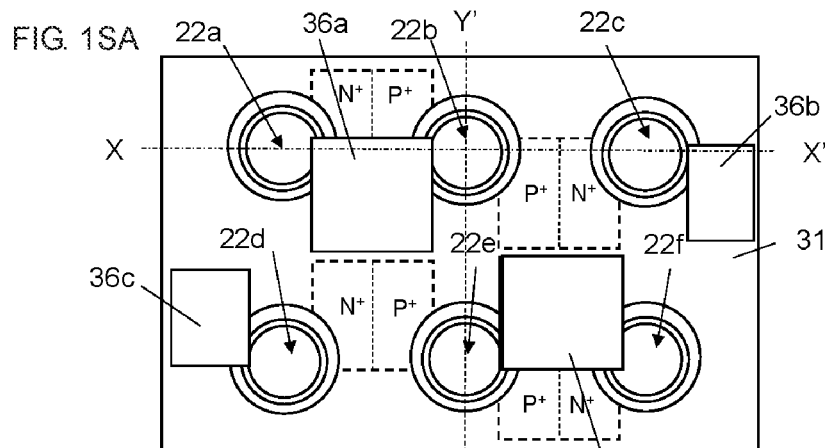
FIGS. 1SA to 1SC are a plan view and sectional structural views illustrating the method for manufacturing a pillar-shaped semiconductor device having an SGT according to the first embodiment.
Figure 1S:
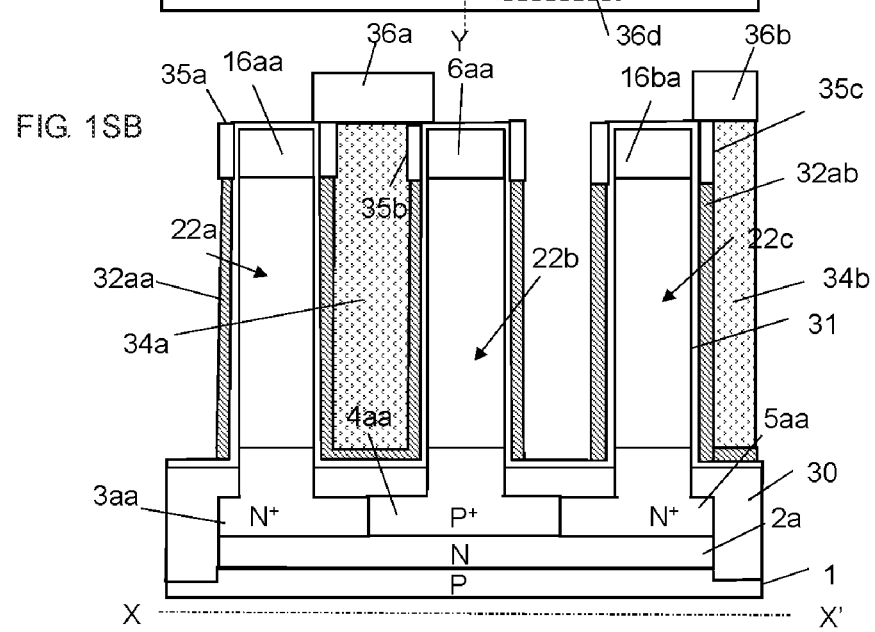
Figure 1S:
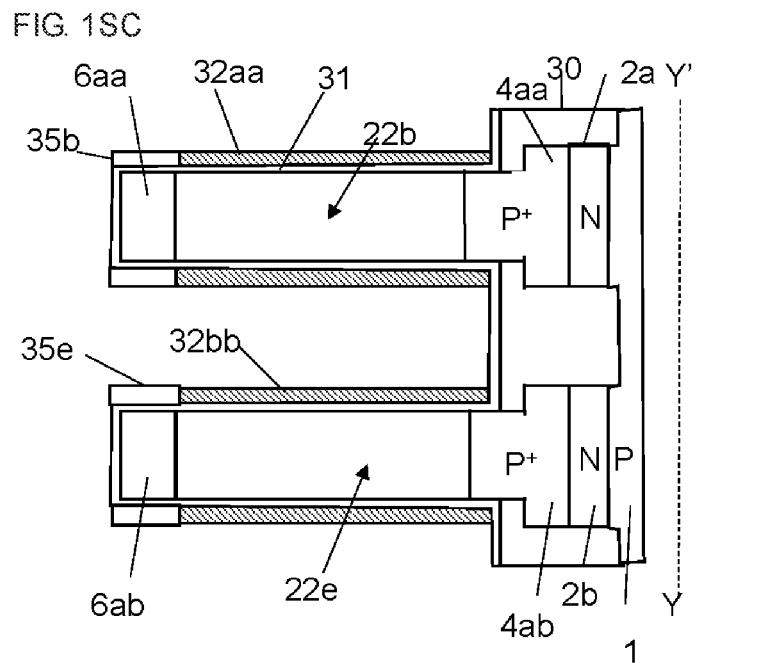

Next, as shown in FIGS. 1SA to 1SC, the W layer 34 and the TiN layer 32a are etched using the SiN layers 35a to 35f and the mask material layers 16aa, 6aa, 16ab, 16ba, 6ab, 16bb, and 36a to 36d as a mask. Thus, a W layer 34a is formed under the mask material layer 36a in plan view. Similarly, a W layer 34b is formed under the mask material layer 36b, a W layer 34c (not shown) is formed under the mask material layer 36c, and a W layer 34d (not shown) is formed under the mask material layer 36d. A TiN layer 32aa is formed around the outer peripheries of the Si pillars 22a and 22b so as to overlap the mask material layer 36a in plan view. A TiN layer 32ab is formed around the outer periphery of the Si pillar 22c so as to overlap the mask material layer 36b in plan view. A TiN layer 32ba is formed around the outer periphery of the Si pillar 22d so as to overlap the mask material layer 36c in plan view. A TiN layer 32bb is formed around the outer peripheries of the Si pillars 22e and 22f so as to overlap the mask material layer 36d in plan view.

Figure 1T:
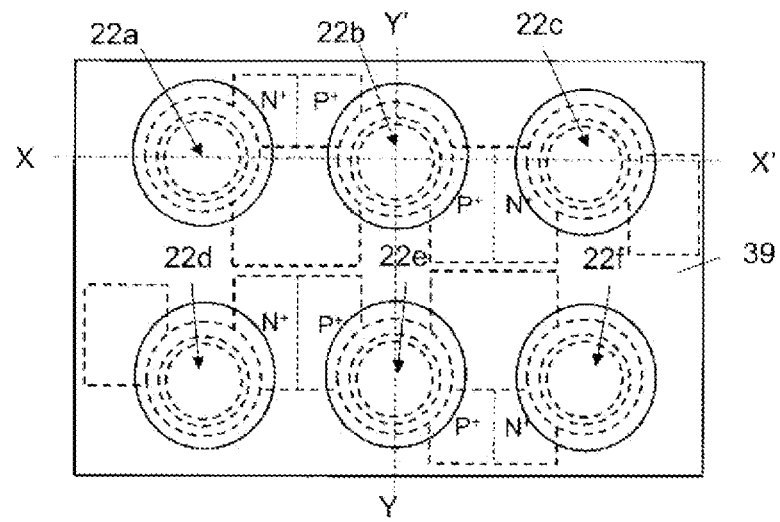
FIGS. 1TA to 1TC are a plan view and sectional structural views illustrating the method for manufacturing a pillar-shaped semiconductor device having an SGT according to the first embodiment.
Figure 1T:
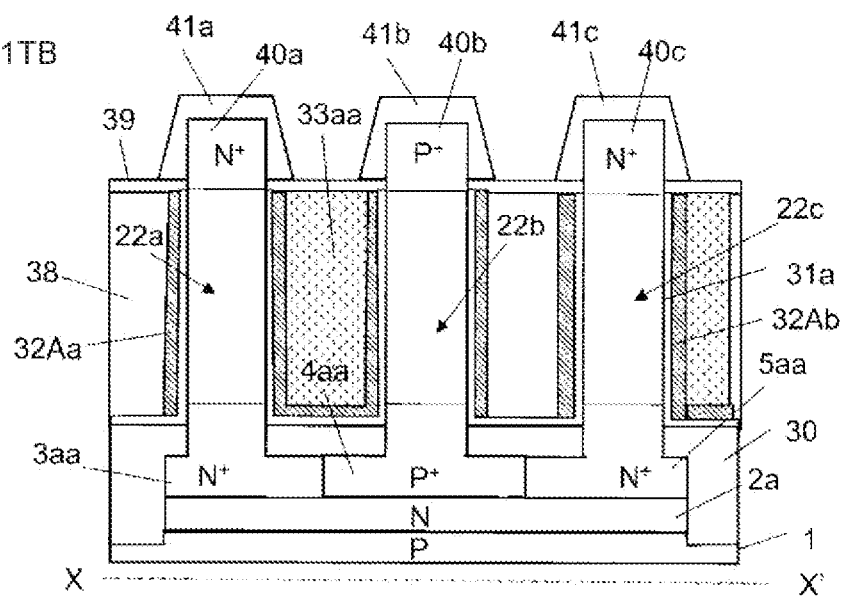
Figure 1T:
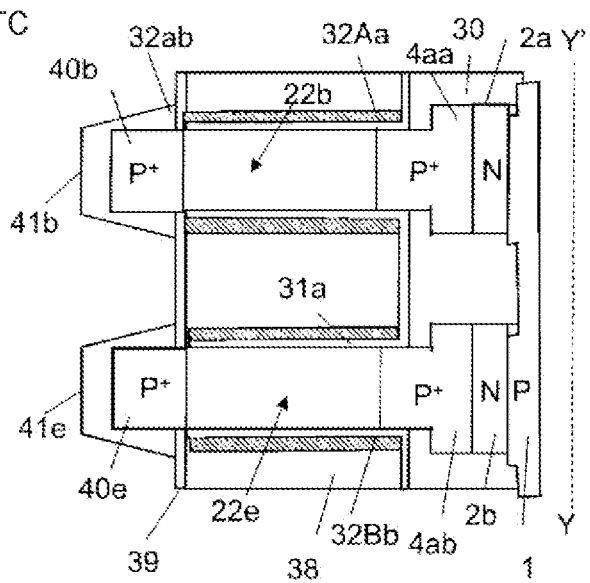

Next, as shown in FIGS. 1TA to 1TC, the entire surface is covered with a SiO2 layer (not shown), and the SiO2 layer is then polished by CMP such that the upper surface thereof is located at the same height as the upper surface of the top portion of the HfO2 layer 31. The SiN layers 35a to 35f are then removed. The upper portion of the SiO2 layer is then etched by RIE such that the upper surface thereof is located below the top portions of the Si pillars 22a to 22f. The HfO2 layer 31a covering the mask material layers 16aa, 6aa, 16ba, 16ab, and 6ab and the mask material layer 16aa, 6aa, 16ba, 16ab, 6ab are then removed. A SiN layer 39 is then formed around the outer peripheries of the top portions of the Si pillars 22a to 22f. After the top portions of the Si pillars 22b and 22e is covered with a SiO2 layer (not shown), an N+ layer 41a containing a donor impurity is formed so as to cover the top portion of the Si pillar 22a by selective epitaxial crystal growth. At the same time, an N+ layer 41c is formed so as to cover the top portion of the Si pillar 22c, an N+ layer 41d (not shown) is formed so as to cover the top portion of the Si pillar 22d, and an N+ layer 41f (not shown) is formed so as to cover the top portion of the Si pillar 22f are formed. After the SiO2 layer covering the top portions of the Si pillars 22b and 22e is removed, the N+ layers 41a, 41c, 41d, and 41f is covered with a SiO2 layer (not shown). P+ layers 41b and 41e are then formed so as to cover the top portions of the Si pillars 22b and 22e by selective epitaxial crystal growth. The SiO2 layer covering the N+ layer 41a, 41c, 41d, and 41f is then removed. The donor impurity in the N+ layer 41a, 41c, 41d, and 41f is then diffused into the top portions of the Si pillars 22a, 22c, 22d, and 22f by heat treatment to form N+ layers 40a, 40c, 40d (the top portion of the Si pillar 22d, not shown), and 40f (the top portion of the Si pillar 22f, not shown). At the same time, the acceptor impurity in the P+ layers 41b and 41e is diffused into the top portions of the Si pillars 22b and 22e to form P+ layers 40b and 40e.

Figure 1U:
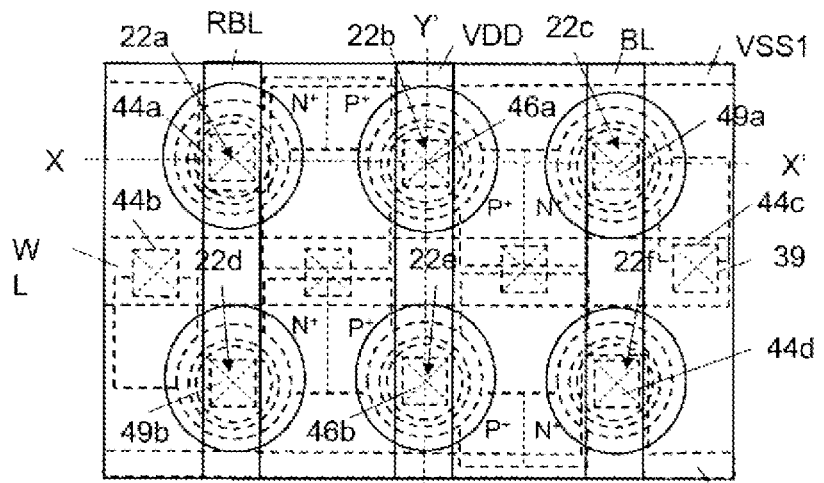
FIGS. 1UA to 1UC are a plan view and sectional structural views illustrating the method for manufacturing a pillar-shaped semiconductor device having an SGT according to the first embodiment.
Figure 1U:
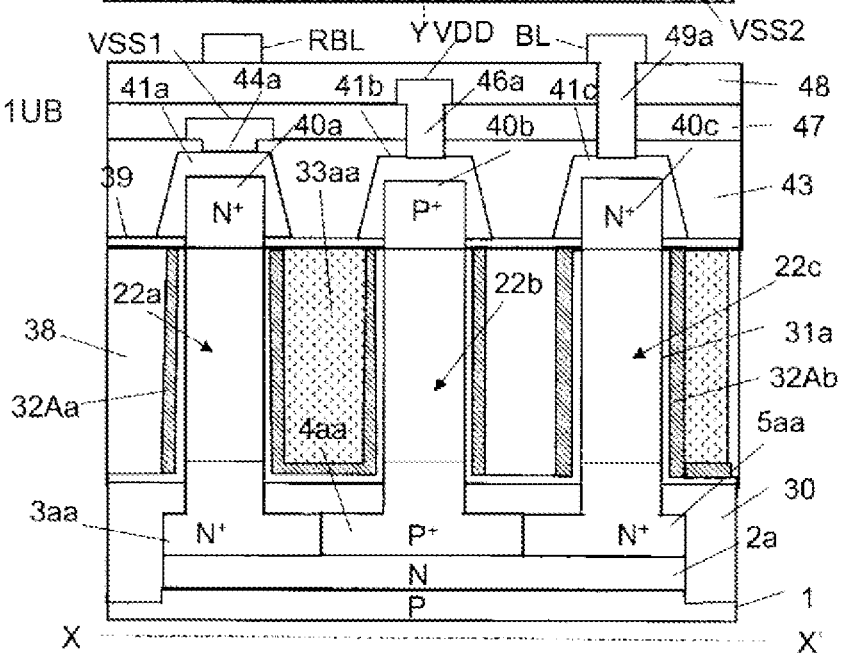
Figure 1U:
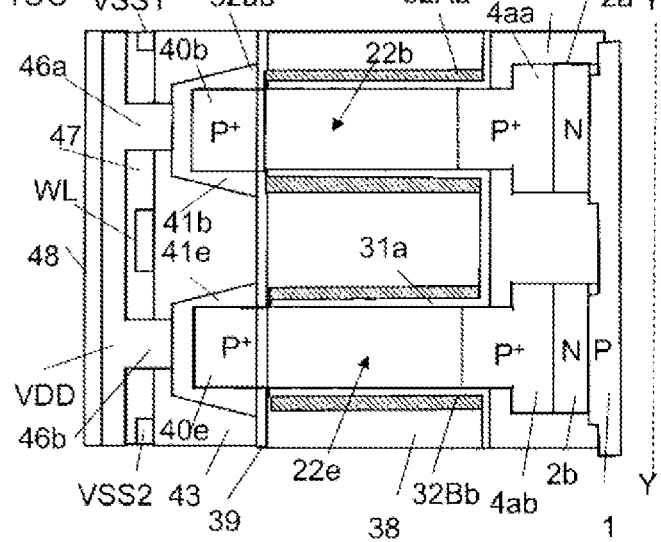

Next, as shown in FIGS. 1UA to 1UC, a SiO2 layer 43 having a flat upper surface is formed so as to cover the entire surface. Ground line layers VSS1 and VSS2 are then formed through contact holes 44a and 44d formed above the N+ layers 41a and 41f, and a word line layer WL is formed through contact holes 44b and 44c formed above the TiN layers 32Ba and 32Ab. A SiO2 layer 47 having a flat upper surface is then formed so as to cover the entire surface. A power supply line layer VDD is then formed through contact holes 46a and 46b formed above the P+ layers 41b and 41e. A SiO2 layer 48 having a flat upper surface is then formed so as to cover the entire surface. A bit output line layer BL and an inverted bit output line layer RBL are then formed through contact holes 49a and 49b formed above the N+ layers 41c and 41d. Thus, an SRAM cell circuit is formed on the P-layer substrate 1.

The method of manufacture according to the first embodiment provides the following features:

1. The band-shaped Si pillar 8 is formed by etching the i layer 7 using the mask material layer 6a, which is formed by lithography, as an etching mask. The Si pillars 22b and 22e are formed from the band-shaped Si pillar 8. On the other hand, the Si pillars 22a, 22c, 22d, and 22f are formed in the Si layer 15, which is formed so as to cover the entire surface of the band-shaped Si pillar 8, the band-shaped SiGe pillars 10aa and 10bb, and the mask material layers 6a, 13a, and 13b shown in FIGS. 1HA to 1HC by Si ALD. The distance between the band-shaped Si pillar 8, 15aa, and 15bb is equal to the thickness of the SiGe layers 10aa and 10bb, which are formed so as to have the same width on both sides of the band-shaped Si pillar 8 by ALD. Thus, in this embodiment, lithography is used only for the formation of the band-shaped Si pillar 8. Since the SiGe layers 10aa and 10bb are formed by ALD, the distance between the band-shaped Si pillars 15aa, 8, and 15bb in the X-X' direction can be made smaller than the minimum patterning size of lithography. Thus, this embodiment provides an SRAM cell with a higher density in the X-X' direction. The SiGe layer 10 and the Si layer 15 need not be formed by ALD, but may instead be formed by another method such as molecular beam deposition.

2. In this embodiment, the band-shaped Si pillars 15aa and 15bb are formed on both sides of the band-shaped Si pillar 8. Thus, three Si pillars 22a, 22b, and 22c arranged in the X direction and three Si pillars 22d, 22e, and 22f arranged in the X direction are formed. On the other hand, after the step in FIGS. 1KA to 1KC, the band-shaped Si pillars 15aa and 15bb can be formed, and two band-shaped SiGe layers and two band-shaped Si layers can be further formed outside the band-shaped Si pillars 15aa and 15bb in plan view. Thus, five Si pillars arranged in the X direction are formed. By repeating this step, a larger number of Si pillars arranged in the X direction can be formed. Si pillars that are unnecessary from the viewpoint of circuit design can be removed after the formation of the Si pillars 22a to 22f or can be removed by not forming any of the mask material layers 6a, 16a, and 16b or by removing any of the mask material layers 6a, 16a, and 16b after they are formed. Thus, Si pillars corresponding to the circuit design can be formed at high density.

3. This embodiment has been described using an example in which three Si pillars 22a, 22b, and 22c and three Si pillars 22d, 22e, and 22f are arranged at high density in the X direction. On the other hand, the same method of manufacture can be used to form Si pillars at high density in the Y direction. Si pillars can be simultaneously formed at high density in the X or Y direction depending on the circuit region by the method of manufacture provided by this embodiment. This allows for high-density circuit formation.

4. This embodiment has been described using an example in which the Si pillars 22a and 22d and the Si pillars 22c and 22f are formed on both sides of the Si pillars 22b and 22e. On the other hand, instead of the Si layer 15 in FIGS. 1HA to 1HC, the Si pillars 22a and 22d and the Si pillars 22c and 22f may be formed from other semiconductor material layers. Thus, the Si pillars 22a and 22d and Si pillars 22c and 22f can be formed from other semiconductor material layers. According to the present invention, semiconductor pillars can be formed from different semiconductor materials. This improves the flexibility of circuit design and thus provides a higher circuit performance.

5. In this embodiment, the width of the band-shaped mask material layers 16a and 16b in the X direction is equal to the width of the Si layer 15, which is formed on the side surfaces of the band-shaped SiGe pillars 10aa and 10bb by ALD. This means that the width of the band-shaped mask material layers 16a and 16b in the X direction can be changed by changing the time for deposition of the Si layer 15 by ALD. Thus, the Si pillars 22a, 22c, 22d, and 22f can be formed so as to have a different width in the X direction in plan view from the Si pillars 22b and 22e depending on the circuit design requirements. This provides a higher circuit performance.

Second Embodiment

A method for manufacturing a pillar-shaped semiconductor device having an SGT according to a second embodiment of the present invention will hereinafter be described with reference to FIGS. 2AA to 2CC, where the figures with the suffix A are plan views, the figures with the suffix B are sectional structural views taken along line X-X' of the figures with the suffix A, and the figures with the suffix C are sectional structural views taken along line Y-Y' of the figures with the suffix A. The steps of the method of manufacture according to the second embodiment are identical to those shown in the first embodiment except for the differences described below.

Figure 2A:
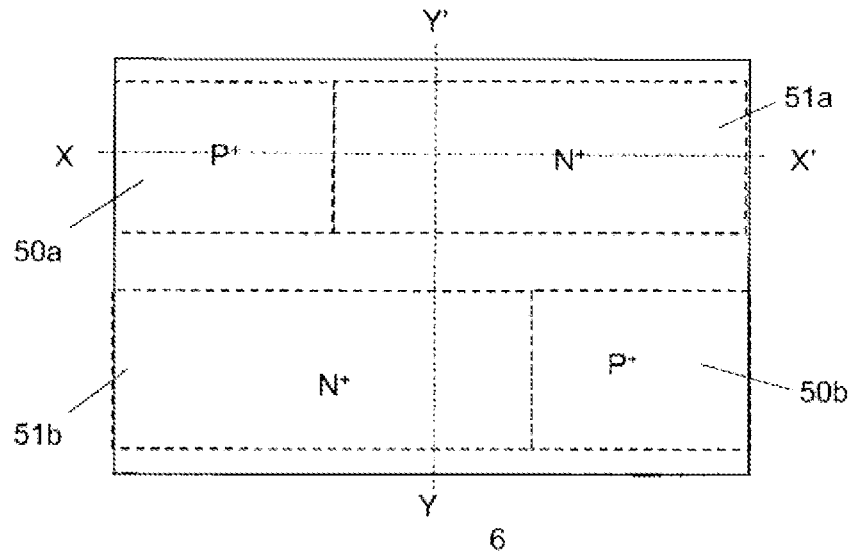
FIGS. 2AA to 2AC are a plan view and sectional structural views illustrating a method for manufacturing a pillar-shaped semiconductor device having an SGT according to a second embodiment of the present invention.
Figure 2A:
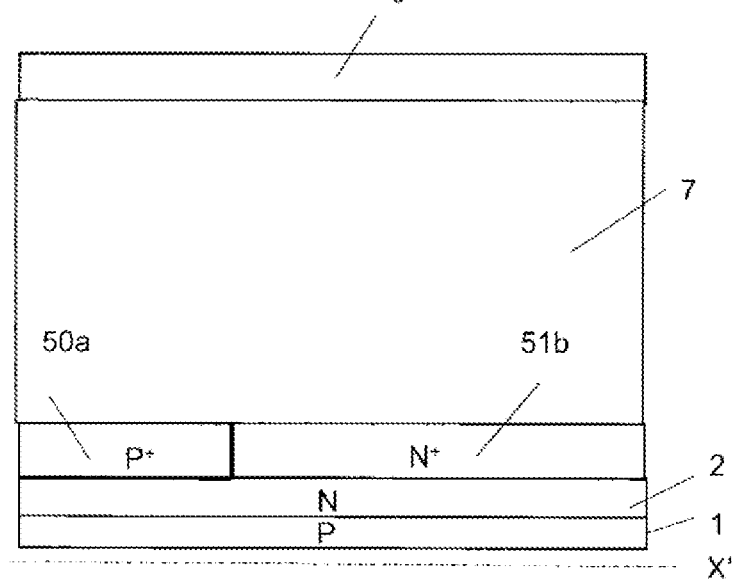
Figure 2A:
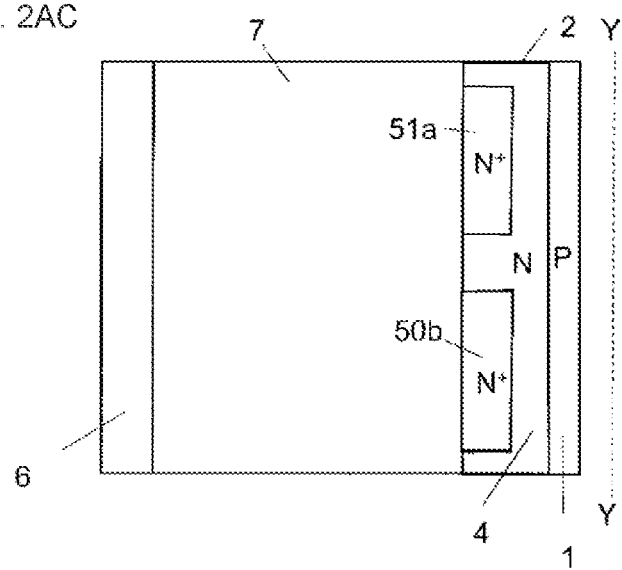

As shown in FIGS. 2AA to 2AC, instead of the band-shaped N+ layers 3 and 5 and P+ layer 4 in FIGS. 1AA to 1AC, P+ layers 50a and 50b and N+ layers 51a and 51b are formed so as to cross each other in plan view.

Figure 2B:
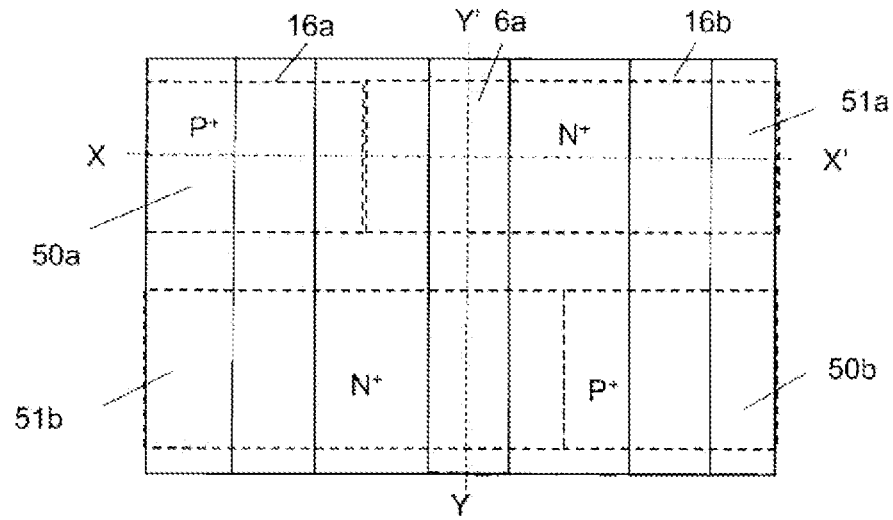
FIGS. 2BA to 2BC are a plan view and sectional structural views illustrating the method for manufacturing a pillar-shaped semiconductor device having an SGT according to the second embodiment.
Figure 2B:
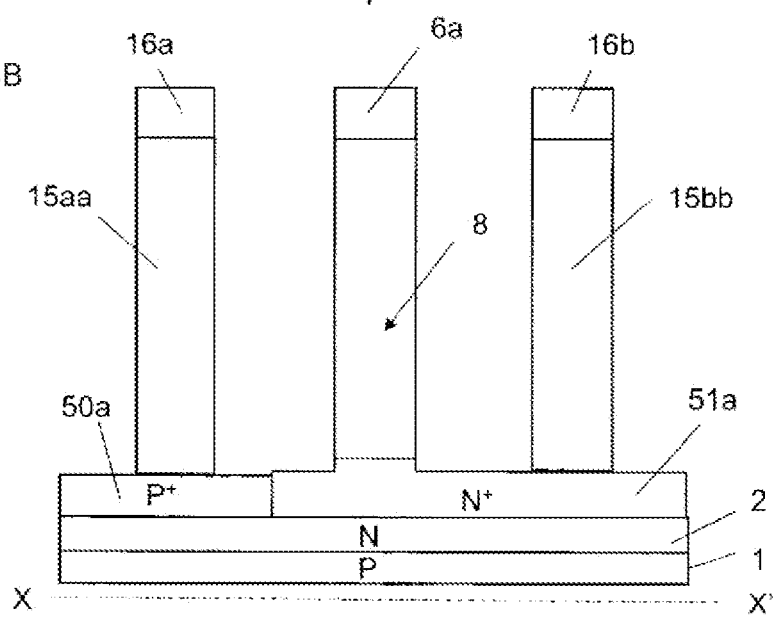
Figure 2B:
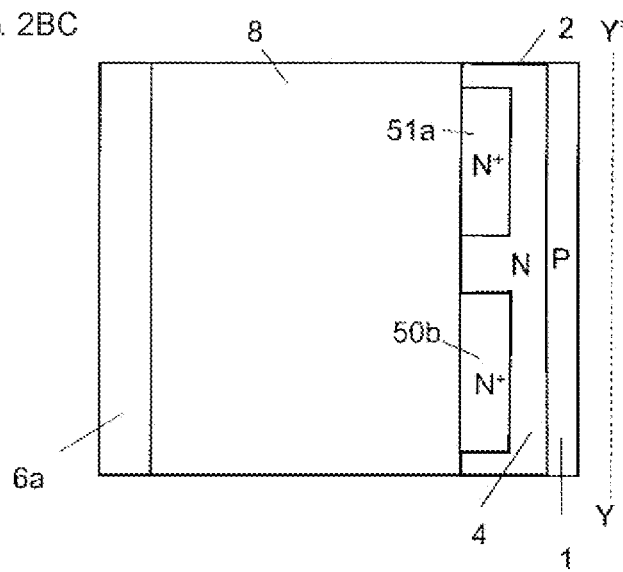

Next, as shown in FIGS. 2BA to 2BC, the same steps as those in FIGS. 1BA to 1MC are performed to form a band-shaped Si pillar 15aa connected to the P+ layer 50a and the N+ layer 51b, a band-shaped Si pillar 8 connected to the N+ layer 51a and the N+ layer 51b, and a band-shaped Si pillars 15bb connected to the N+ layer 51a and the P+ layer 50b in plan view. The band-shaped Si pillar 15aa has a mask material layer 16a formed thereon. The band-shaped Si pillar 8 has a mask material layer 6a formed thereon. The band-shaped Si pillars 15bb has a mask material layer 16b formed thereon.

Next, the same steps as those in FIGS. 1NA to 1SC are performed. Thus, as shown in FIGS. 2CA to 2CC, a HfO2 layer 31a surrounding the Si pillars 22a to 22f, a TiN layer 32AA surrounding the HfO2 layer 31a and surrounding the outer peripheries of the Si pillars 22a and 22b, a TiN layer 32AB surrounding the outer periphery of the Si pillar 22c, a TiN layer 32BA (not shown) surrounding the outer peripheries of the Si pillars 22d and 22e, and a TiN layer 32BB surrounding the outer periphery of Si pillar 22f are formed. A SiN layer 39 is then formed around the outer peripheries of the top portions of the Si pillars 22a to 22f. A P+ layer 40A is then formed on the upper portion of the Si pillar 22a. An N+ layer 40B is formed on the upper portion of the Si pillar 22b. An N+ layer 40C is formed on the upper portion of the Si pillar 22c. An N+ layer 40D (not shown) is formed on the upper portion of the Si pillar 22d. An N+ layer 40E is formed on the upper portion of the Si pillar 22e. A P+ layer 40F (not shown) is formed on the upper portion of the Si pillar 22f. P+ layers 41A and 41F (not shown) are then formed so as to cover the P+ layers 40A and 40F by selective epitaxial crystal growth. Similarly, N+ layers 41B, 41C (not shown), 41D, and 41E are formed so as to cover the N+ layers 40B, 40C, 40D, and 40E by selective epitaxial crystal growth. Power supply line layers Vdd1 and Vdd2 are formed through contact holes 44a and 44d formed above the N+ layers 41A and 41F. A word line layer WL is formed through contact holes 44b and 44c formed above the TiN layers 32AB and 32BA. A SiO2 layer 47 having a flat upper surface is then formed so as to cover the entire surface. A ground line layer Vss is then formed through contact holes 46a and 46b formed above the P+ layers 41B and 41E. A SiO2 layer 48 having a flat upper surface is then formed so as to cover the entire surface. A bit output line layer BL and an inverted bit output line layer RBL are then formed through contact holes 49a and 49b formed above the N+ layers 41C and 41D. Thus, an SRAM cell circuit is formed on the P-layer substrate 1.

The method for manufacturing a pillar-shaped semiconductor device having an SGT according to this embodiment provides the following feature:

1. According to this embodiment, the SGTs formed at the Si pillars 22b and 22e, which are formed from the highly crystalline i layer 7, provide a higher on-current than the SGTs formed at the Si pillars 22a, 22c, 22d, and 22f, which are formed in the Si layer 15 formed by ALD. Accordingly, in the SRAM cell, drive SGTs, which require a higher drive current, are formed at the Si pillars 22b and 22e. Thus, a high-density, high-performance SRAM cell is formed.

Third Embodiment

A method for manufacturing a pillar-shaped semiconductor device having an SGT according to a third embodiment of the present invention will hereinafter be described with reference to FIGS. 3AA to 3DC, where the figures with the suffix A are plan views, the figures with the suffix B are sectional structural views taken along line X-X' of the figures with the suffix A, and the figures with the suffix C are sectional structural views taken along line Y-Y' of the figures with the suffix A. The steps of the method of manufacture according to the third embodiment are identical to those shown in the first embodiment except for the differences described below.

Instead of the N+ layers 3 and 5 and the P+ layer 4 in FIGS. 1AA to 1AC, a P+ layer (not shown) is formed over the entire surface, and the steps in FIGS. 1AA to 1MC are performed. As shown in FIGS. 3AA to 3AC, instead of the band-shaped mask material layers 20a and 20b, a band-shaped mask material layer 56 perpendicular to the band-shaped Si pillars 15aa, 8, and 15bb in plan view is formed. A P+ layer 55 is formed so as to be connected to the bottom portions of the band-shaped Si pillars 15aa, 8, and 15bb.

Next, the steps in FIGS. 1NA to 1OC are performed. Thus, as shown in FIGS. 3BA to 3BC, Si pillars 58a, 58b, and 58c are formed on the P+ layer 55. The Si pillars 58a, 58b, and 58c have mask material layers 57a, 57b, and 57c formed thereon.

Next, the steps in FIGS. 1PA to 1SC are performed. Thus, as shown in FIGS. 3CA to 3CC, an N layer 2b is formed on the P layer substrate 1, and a P+ layer 55a is formed thereon. The Si pillars 58a, 58b, and 58c are formed on the P+ layer 55a. A SiO2 layer 30a is then formed so as to surround the bottom portions of the Si pillars 58a, 58b, and 58c. A HfO2 layer 60 is then formed around the outer peripheries of the Si pillars 58a, 58b, and 58c and on the SiO2 layer 30a. A TiN layer 61 is then formed so as to surround the HfO2 layer 60 on the side surfaces of the Si pillars 58a, 58b, and 58c, and a W layer 62 connected to the Si pillars 58a, 58b, and 58c in plan view are formed. The TiN layer 61 and the W layer 62 are formed by etching using a mask material layer 63, the mask material layers 57a, 57b, and 57c, and SiN layers 34aa, 34bb, and 34cc as a mask.

Next, the step in FIGS. 1TA to 1TC up to the formation of the SiN layer 39 is performed. As shown in FIGS. 3DA to 3DC, P+ layers 66a, 66b, and 66c containing an acceptor impurity are then formed so as to cover the top portions of the Si pillars 58a, 58b, and 58c by selective epitaxial growth. P+ layers 65a, 65b, and 65c are then formed in the top portions of the Si pillars 58a, 58b, and 58c by heat treatment. A SiO2 layer 67 is then formed so as to cover the entire surface. A drain line layer Vd is then formed through contact holes 68a, 68c, and 68e formed above the P+ layers 66a, 66b, and 66c. Similarly, a source line layer Vs is formed through a contact hole 68b formed above the P+ layer 55a. Similarly, a gate line layer Vg is formed through a contact hole 68d formed above the W layer 62 connected to the TiN layer 61. Thus, three P-channel SGTs connected in parallel are formed on the P layer substrate 1.

The method for manufacturing a pillar-shaped semiconductor device having an SGT according to this embodiment provides the following feature:

2. In this embodiment, the Si pillars 58a, 58b, and 58c are formed by performing the steps up to FIGS. 3AA to 3AC in the same manner as those shown in FIGS. 1AA to 1KC in the first embodiment such that the shape of the mask material layer 56 in FIGS. 3AA to 3AC in plan view differs from that of the mask material layers 20a and 20b shown in FIGS. 1KA to 1KC in the first embodiment. Thus, a high-density SRAM cell and three SGTs connected in parallel at high density can be simultaneously formed on the same P layer substrate 1.

Fourth Embodiment

A method for manufacturing a pillar-shaped semiconductor device having an SGT according to a fourth embodiment of the present invention will hereinafter be described with reference to FIGS. 4AA to 4BC, where the figures with the suffix A are plan views, the figures with the suffix B are sectional structural views taken along line X-X' of the figures with the suffix A, and the figures with the suffix C are sectional structural views taken along line Y-Y' of the figures with the suffix A. The steps of the method of manufacture according to the fourth embodiment are identical to those shown in the third embodiment except for the differences described below.

Figure 3A:
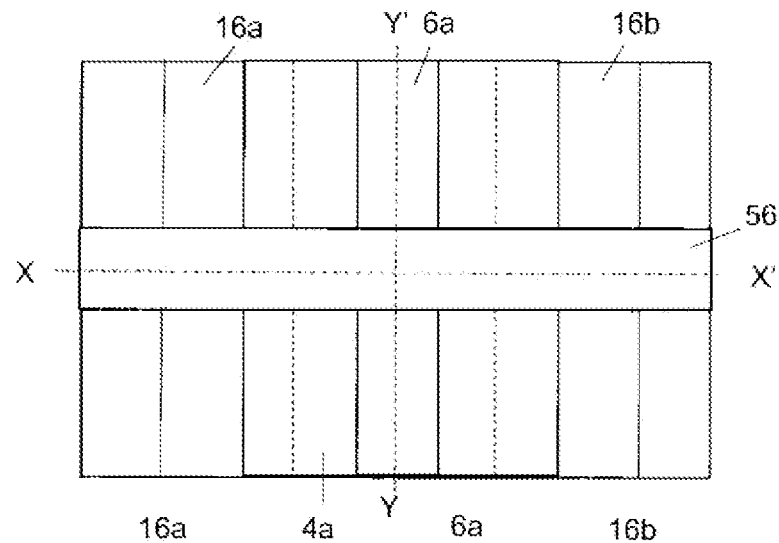
FIGS. 3AA to 3AC are a plan view and sectional structural views illustrating a method for manufacturing a pillar-shaped semiconductor device having an SGT according to a third embodiment of the present invention.
Figure 3A:
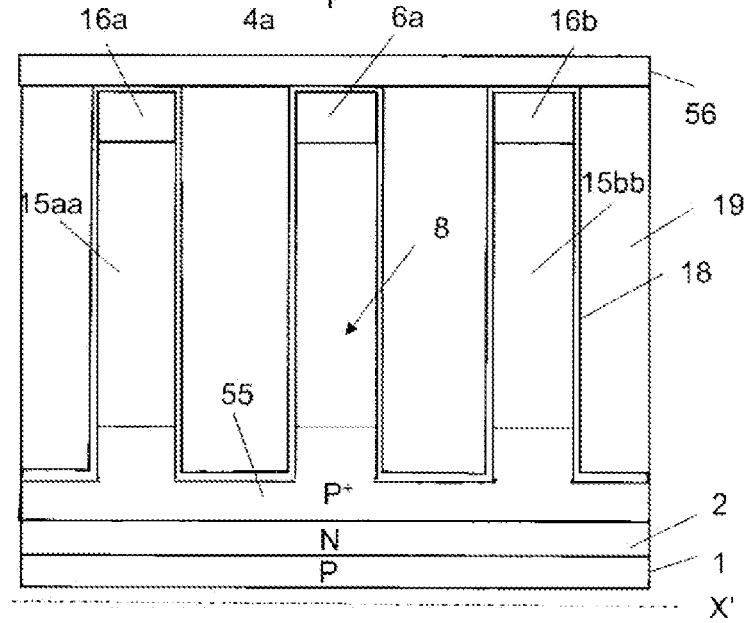
Figure 3A:
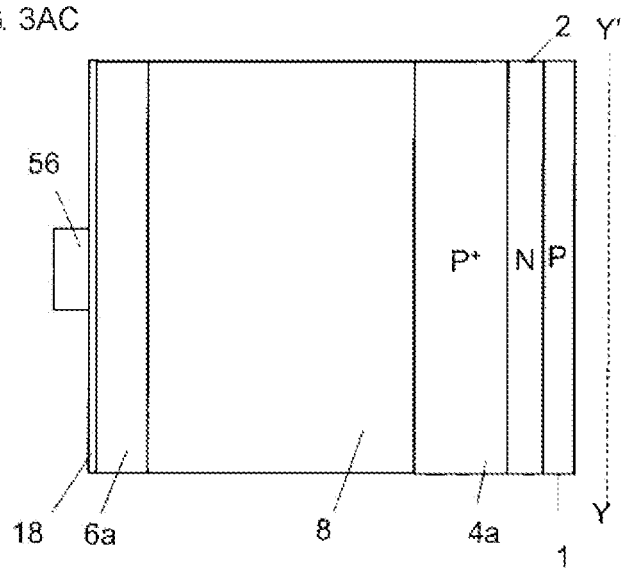
Figure 3B:
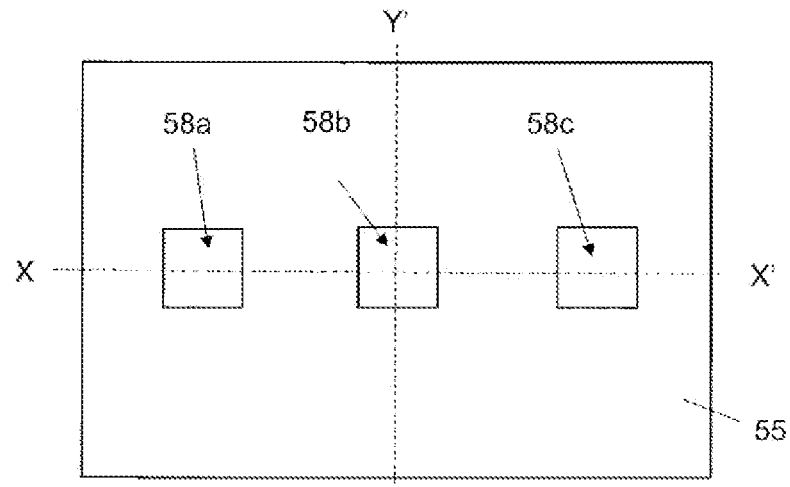
FIGS. 3BA to 3BC are a plan view and sectional structural views illustrating the method for manufacturing a pillar-shaped semiconductor device having an SGT according to the third embodiment of the present invention.
Figure 3B:
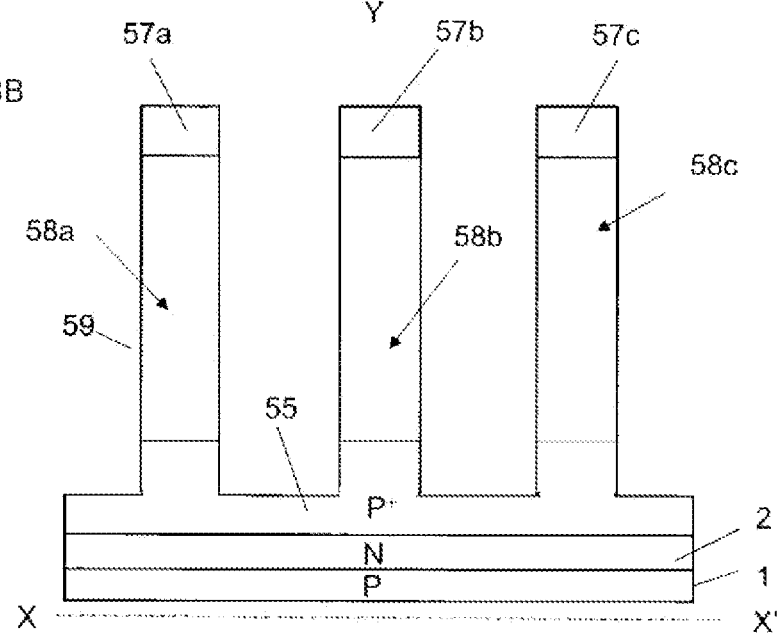
Figure 3B:
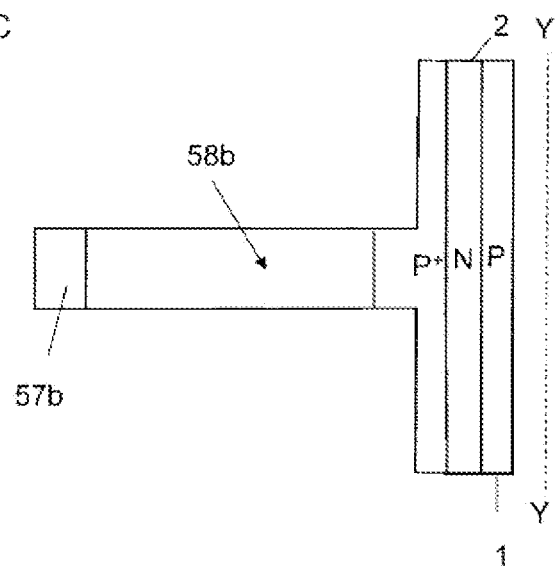
Figure 3C:
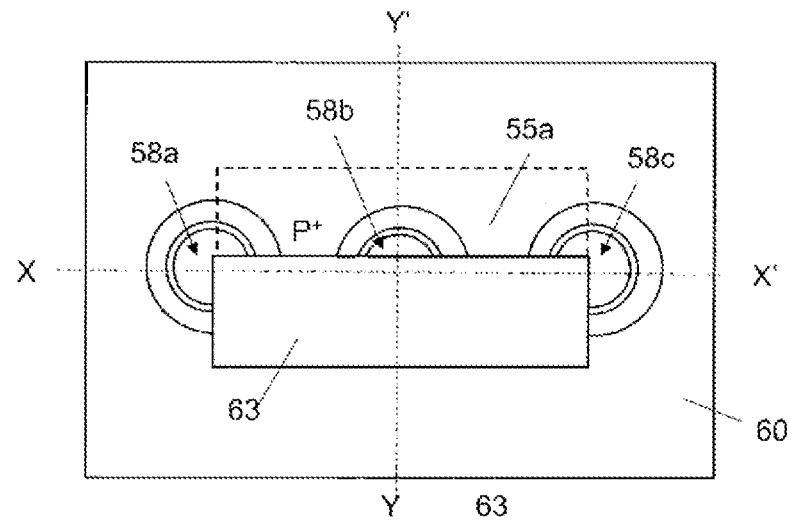
FIGS. 3CA to 3CC are a plan view and sectional structural views illustrating the method for manufacturing a pillar-shaped semiconductor device having an SGT according to the third embodiment of the present invention.
Figure 3C:
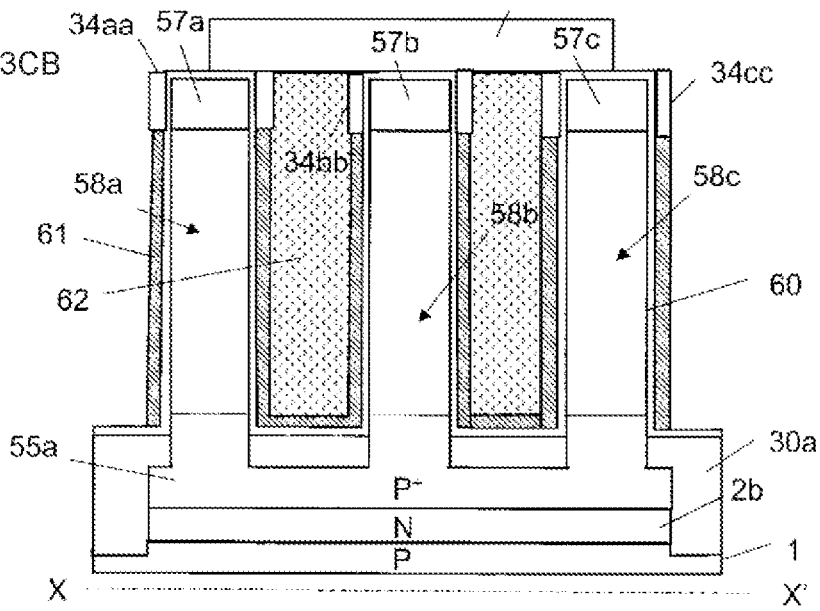
Figure 3C:
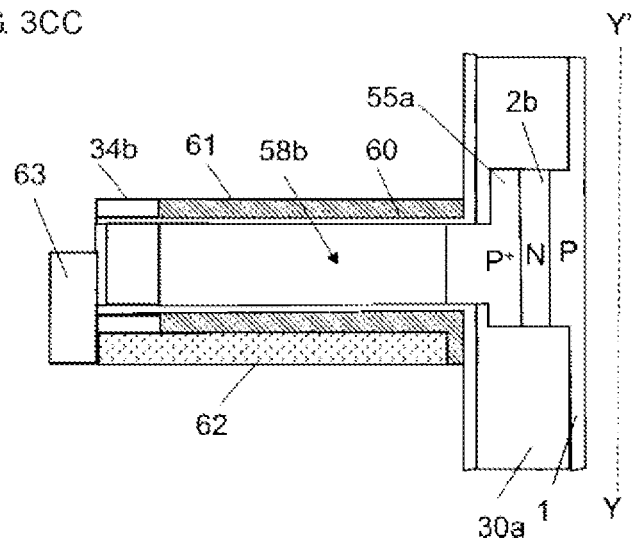
Figure 3D:
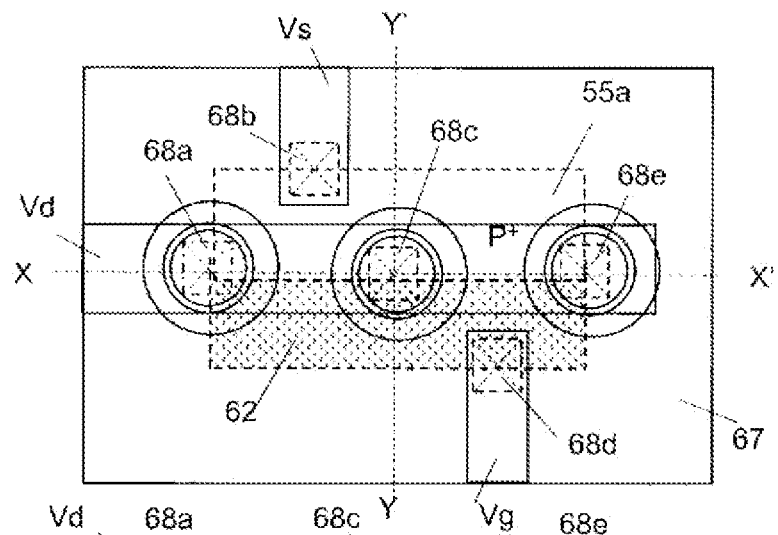
FIGS. 3DA to 3DC are a plan view and sectional structural views illustrating the method for manufacturing a pillar-shaped semiconductor device having an SGT according to the third embodiment of the present invention.
Figure 3D:
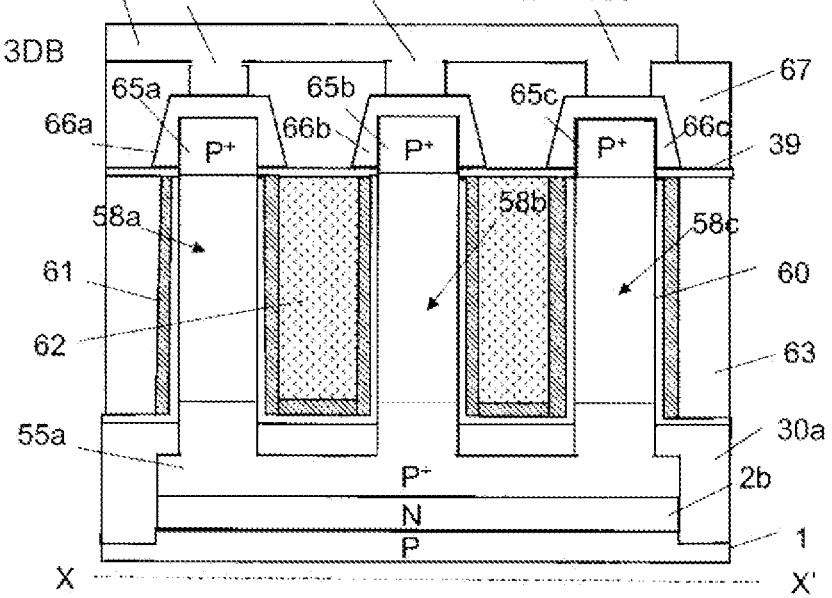
Figure 3D:
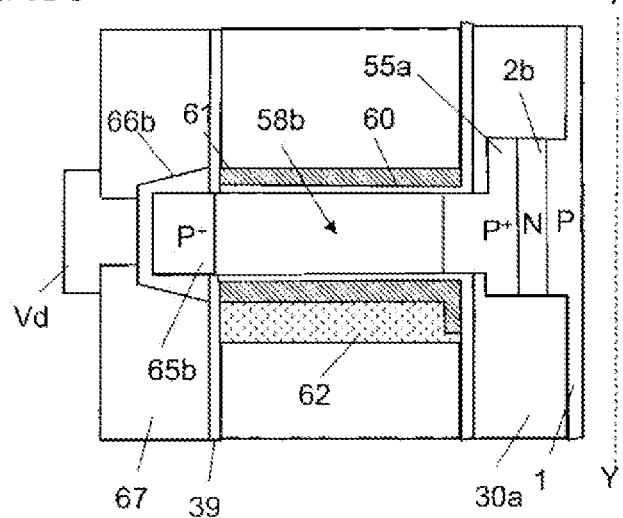
Figure 4A:
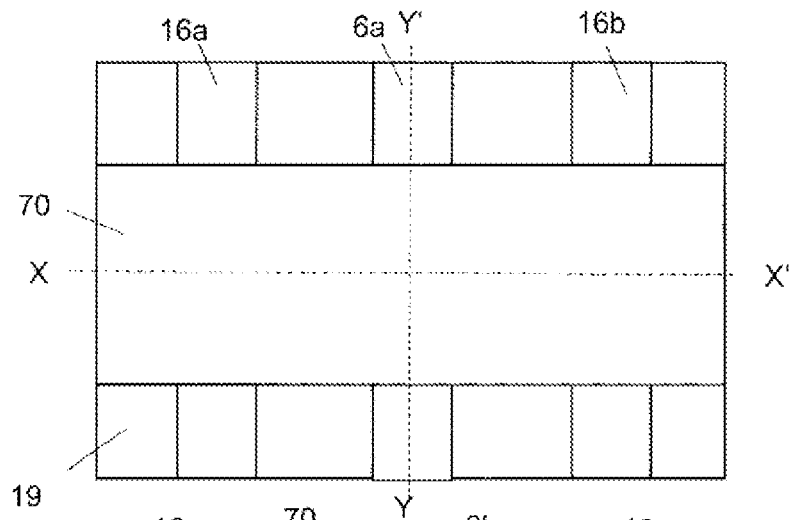
FIGS. 4AA to 4AC are a plan view and sectional structural views illustrating a method for manufacturing a pillar-shaped semiconductor device having an SGT according to a fourth embodiment of the present invention.
Figure 4A:
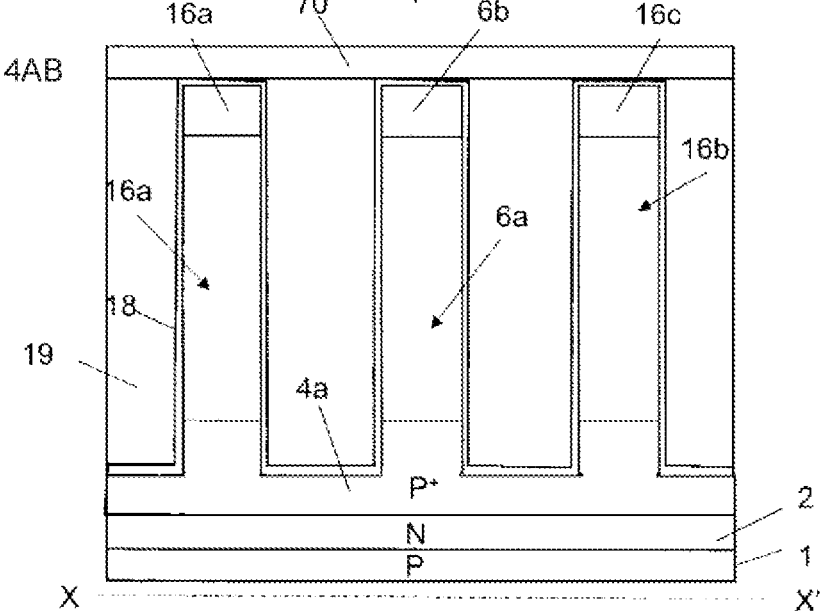
Figure 4A:
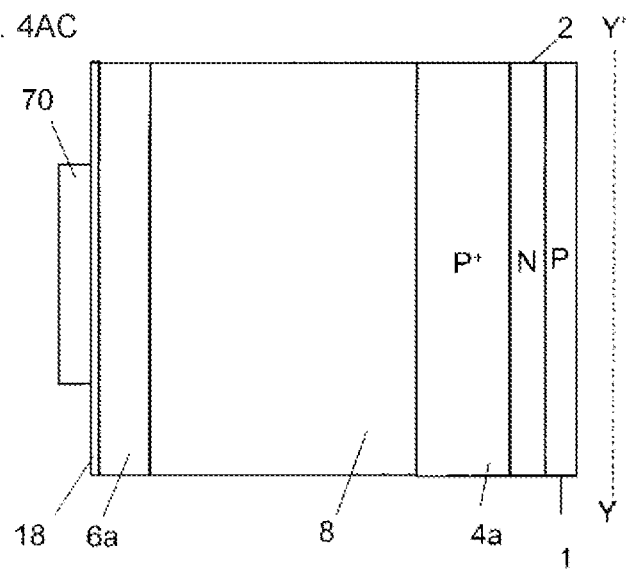

As shown in FIGS. 4AA to 4AC, instead of the mask material layer 56 in FIGS. 3AA to 3AC, a mask material layer 70 that is wider than the mask material layer 56 in the Y direction in plan view is formed.

Figure 4B:
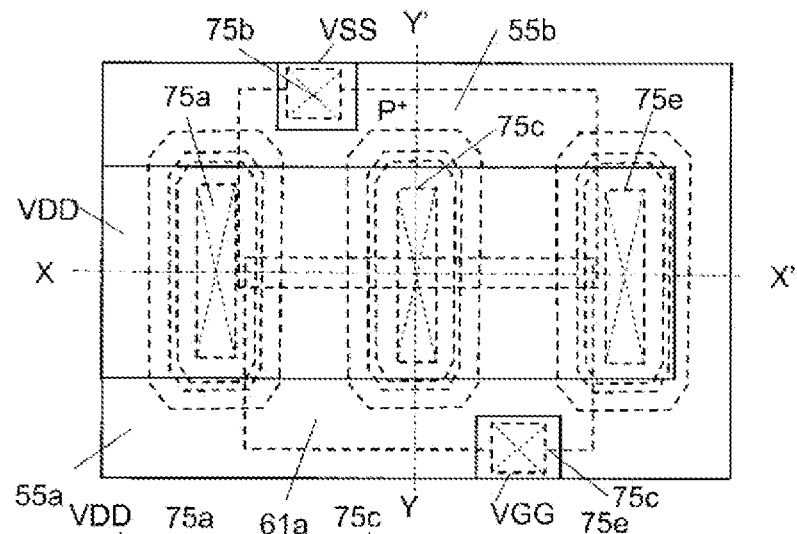
FIGS. 4BA to 4BC are a plan view and sectional structural views illustrating the method for manufacturing a pillar-shaped semiconductor device having an SGT according to the fourth embodiment of the present invention.
Figure 4B:
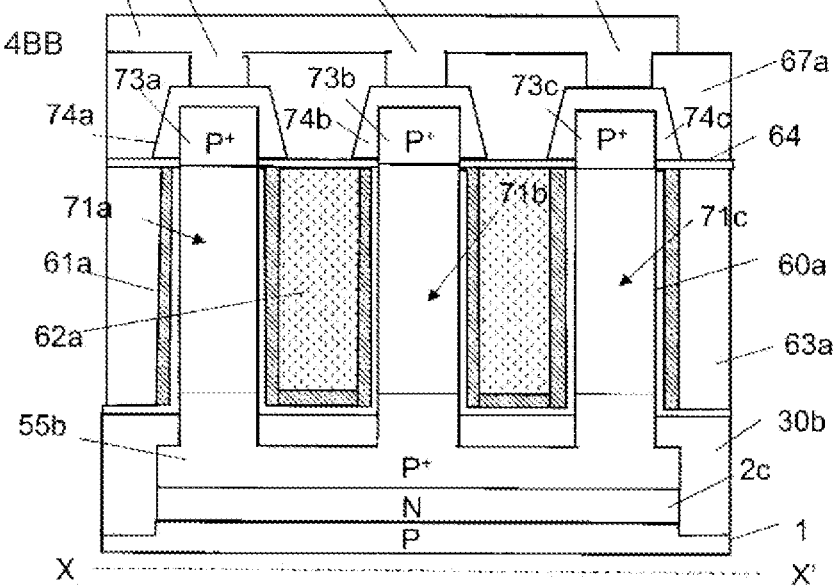
Figure 4B:
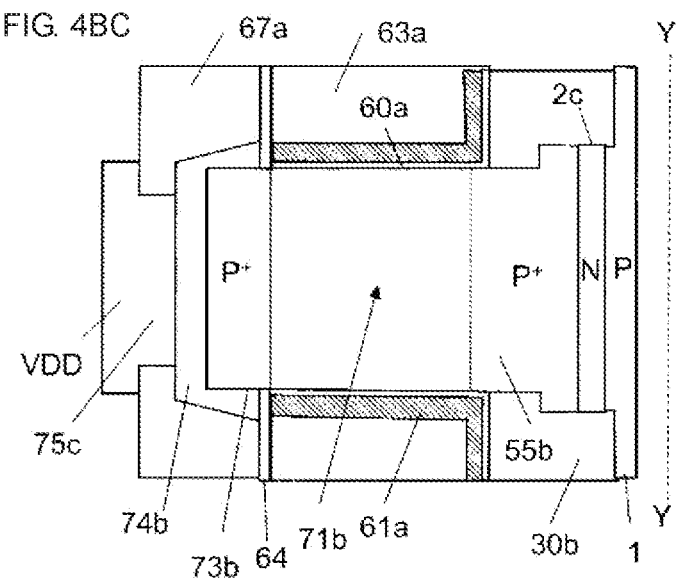

Next, as shown in FIGS. 4BA to 4BC, the same steps as those of the third embodiment are performed to form three band-shaped Si pillars 71a, 71b, and 71c on a P+ layer 55b. A SiO2 layer 30b is then formed so as to surround the bottom portions of the band-shaped Si pillars 71a, 71b, and 71c. A HfO2 layer 60a is then formed around the outer peripheries of the band-shaped Si pillars 71a, 71b, and 71c and on the SiO2 layer 30b. A TiN layer 61a is then formed so as to surround the HfO2 layer 60a on the side surfaces of the Si pillars 71a, 71b, and 71c, and a W layer 62a connected to the band-shaped Si pillars 71a, 71b, 71c in plan view are formed. Next, a SiO2 layer 63a is formed so as to surround the outer peripheries of the band-shaped Si pillars 71a, 71b, and 71c, and a SiN layer 64 is formed on the SiO2 layer 63a. Next, P+ layers 74a, 74b, and 74c containing an acceptor impurity are formed so as to cover the top portions of the Si pillars 71a, 71b, and 71c by selective epitaxial growth. P+ layers 73a, 73b, and 73c are then formed in the top portions of the Si pillars 71a, 71b, and 71c by heat treatment. A SiO2 layer 67a is then formed so as to cover the entire surface. A drain line layer VDD is then formed through contact holes 75a, 75b, and 75c formed above the P+ layers 74a, 74b, and 74c. Similarly, a source line layer VSS is formed through a contact hole 75b formed above the P+ layer 55b. Similarly, a gate line layer VGG is formed through a contact hole 75c formed above the W layer 62a connected to the TiN layer 61a. Thus, three P-channel SGTs connected in parallel are formed on the P layer substrate 1.

The method for manufacturing a pillar-shaped semiconductor device having an SGT according to this embodiment provides the following features:

3. According to this embodiment, the cross-sectional area of the band-shaped Si pillars 71a, 71b, and 71c in plan view is larger than that of the Si pillars 58a, 58b, and 58c in the third embodiment. Thus, the SGTs according to this embodiment can achieve a higher drive current than the SGTs according to the third embodiment.

4. In this embodiment, the SGTs can be easily formed so as to achieve the desired drive current by changing the length of the band-shaped Si pillars 71a, 71b, and 71c in the Y direction in plan view.

Fifth Embodiment

A method for manufacturing a pillar-shaped semiconductor device having an SGT according to a fifth embodiment of the present invention will hereinafter be described with reference to FIGS. 5AA to 5CC, where the figures with the suffix A are plan views, the figures with the suffix B are sectional structural views taken along line X-X' of the figures with the suffix A, and the figures with the suffix C are sectional structural views taken along line Y-Y' of the figures with the suffix A. The steps of the method of manufacture according to the fifth embodiment are identical to those shown in the fourth embodiment except for the differences described below.

Figure 5A:
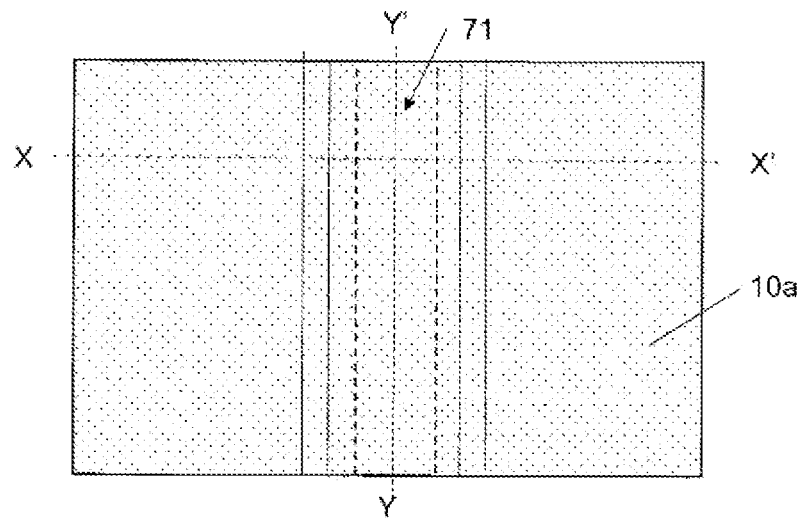
FIGS. 5AA to 5AC are a plan view and sectional structural views illustrating a method for manufacturing a pillar-shaped semiconductor device having an SGT according to a fifth embodiment of the present invention.
Figure 5A:
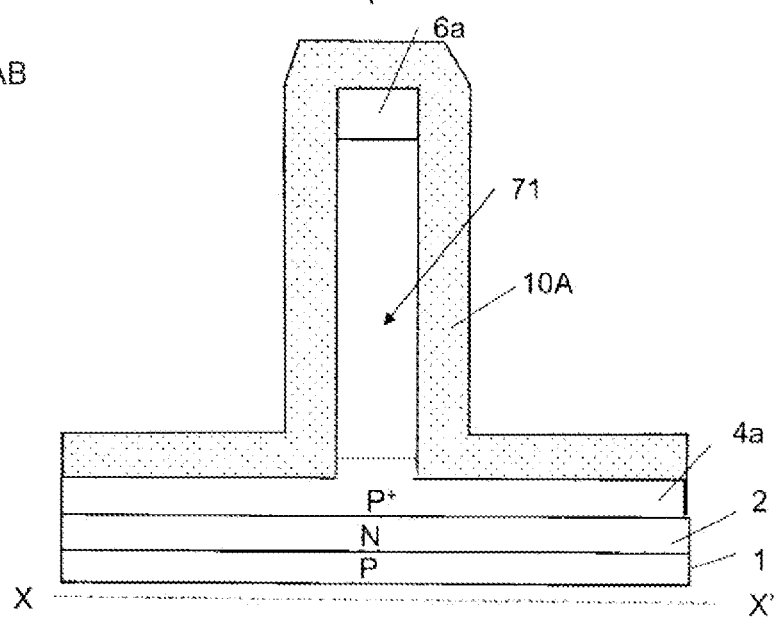
Figure 5A:
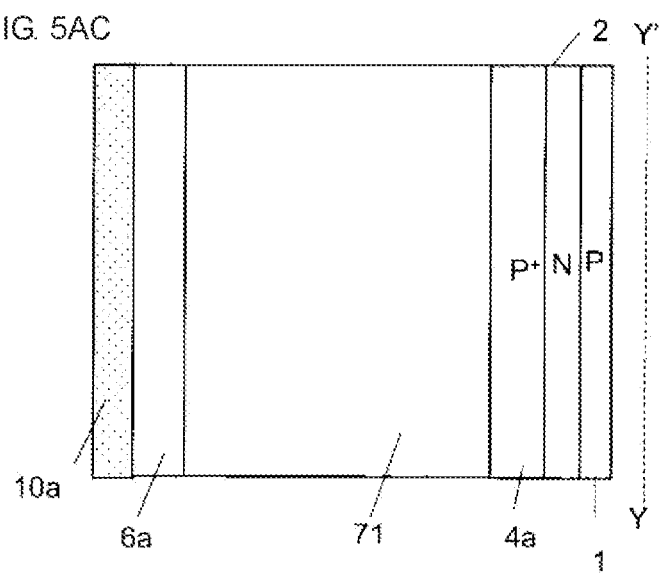

As shown in FIGS. 5AA to 5AC, as in the fourth embodiment, a band-shaped Si pillar 71 is formed on the P+ layer 4a. A SiGe layer 10A is then formed so as to cover the entire surface by ALD such that the SiGe layer 10A is thinner than that of the fourth embodiment. The thin SiGe layer 10A can be formed since ALD allows SiGe atomic layers to be deposited layer by layer in a controlled manner.

Figure 5B:
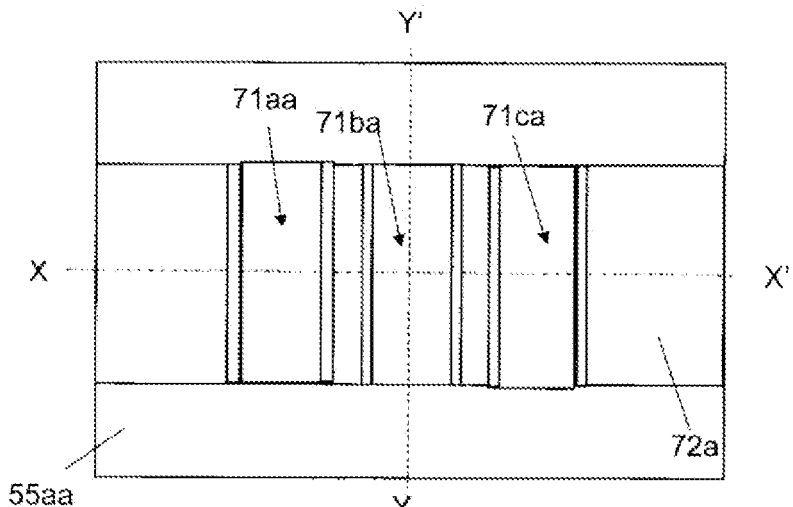
FIGS. 5BA to 5BC are a plan view and sectional structural views illustrating the method for manufacturing a pillar-shaped semiconductor device having an SGT according to the fifth embodiment of the present invention.
Figure 5B:
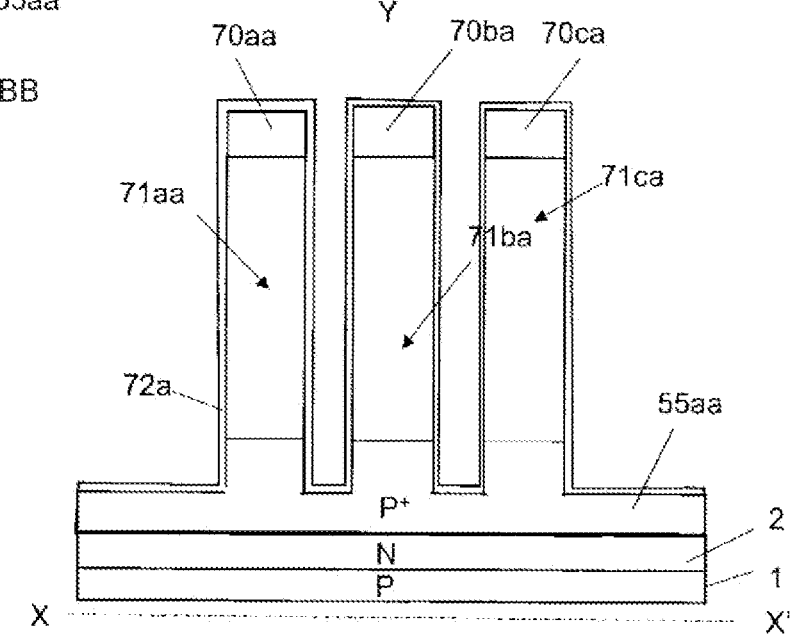
Figure 5B:
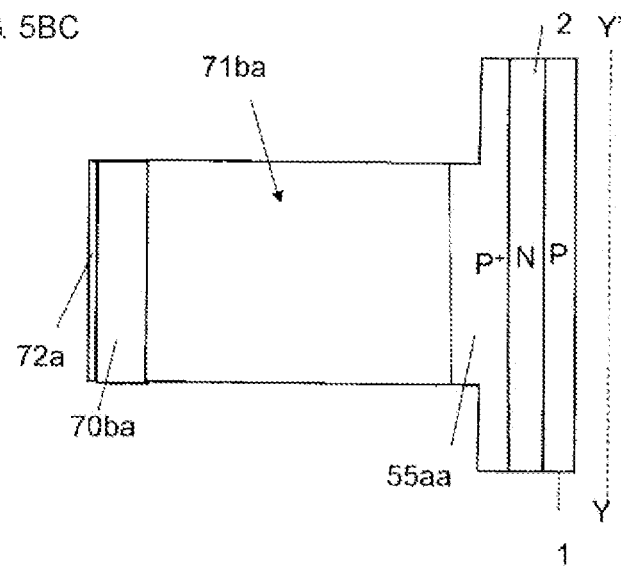

Next, as shown in FIGS. 5BA to 5BC, the same steps as those of the fourth embodiment are performed to form band-shaped Si pillars 71aa and 71ca on both sides of a band-shaped Si pillar 71ba. Thus, the band-shaped Si pillars 71aa, 71ba, and 71ca are formed at a shorter distance than the band-shaped Si pillars 71a, 71b, and 71c in the fourth embodiment.

Figure 5C:
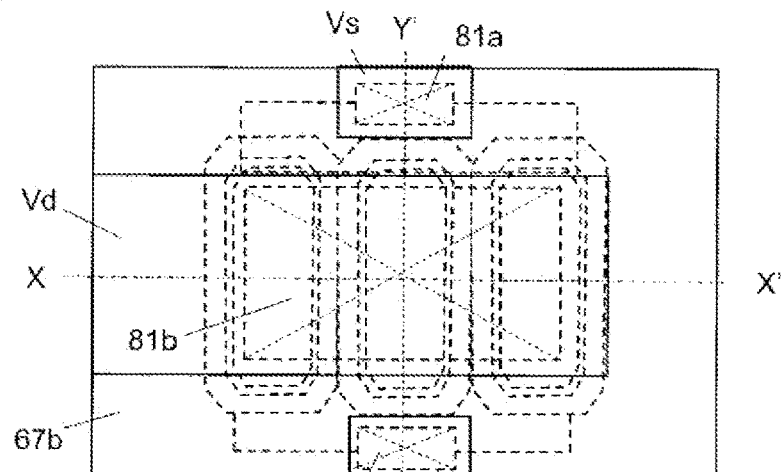
FIGS. 5CA to 5CC are a plan view and sectional structural views illustrating the method for manufacturing a pillar-shaped semiconductor device having an SGT according to the fifth embodiment of the present invention.
Figure 5C:
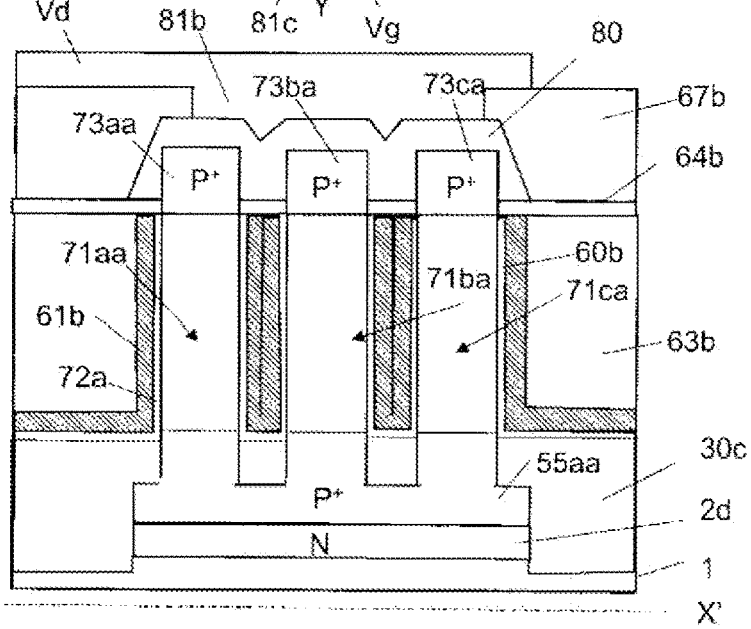
Figure 5C:
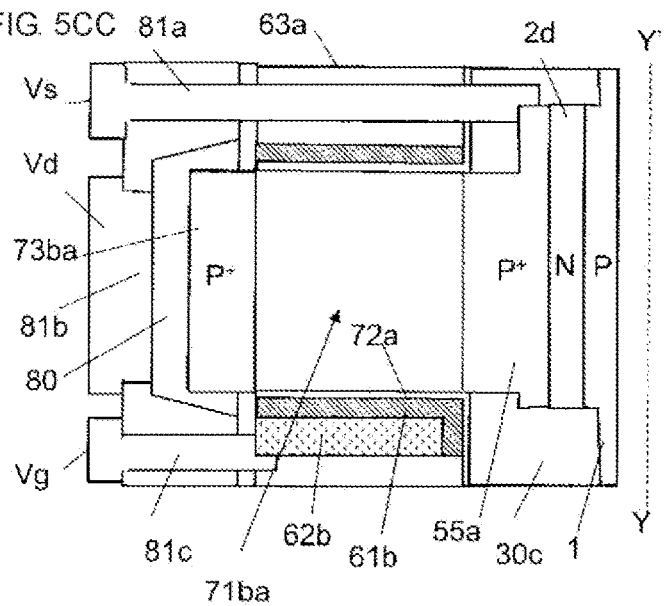

Next, as shown in FIGS. 5CA to 5CC, the same steps as those of the fourth embodiment are performed to form a SiO2 layer 30c so as to surround the bottom portions of the band-shaped Si pillars 71aa, 71ba, and 71ca. A HfO2 layer 72a is then formed around the outer peripheries of the band-shaped Si pillars 71aa, 71ba, and 71ca and on the SiO2 layer 30c. A TiN layer 61b is then formed so as to surround the HfO2 layer 72a. The TiN layer 61b is formed so as to fill the spaces between the band-shaped Si pillars 71aa, 71ba, and 71ca. Next, a SiO2 layer 63b is formed so as to surround the outer peripheries of the band-shaped Si pillars 71a, 71b, and 71c, and a SiN layer 64b is formed on the SiO2 layer 63b. Next, a P+ layer 80 containing an acceptor impurity is continuously formed so as to cover the top portions of the band-shaped Si pillars 71aa, 71ba, and 71ca by selective epitaxial growth. P+ layers 73aa, 73ba, and 73ca are then formed in the top portions of the Si pillars 71aa, 71ba, and 71ca by heat treatment. A SiO2 layer 67b is then formed so as to cover the entire surface. A drain line layer Vd is then formed through a contact hole 81b formed above the P+ layer 80. Similarly, a source line layer Vs is formed through a contact hole 81a formed above the P+ layer 55aa. Similarly, a gate line layer Vg is formed through a contact hole 81c formed above the TiN layer 61b. Thus, three P-channel SGTs connected in parallel are formed on the P layer substrate 1.

The method for manufacturing a pillar-shaped semiconductor device having an SGT according to this embodiment provides the following features:

5. In this embodiment, the gate electrode material TiN layer 61b reduces the distance between the band-shaped Si pillars 71aa, 71ba, and 71ca so as to fill the spaces between the band-shaped Si pillars 71aa, 71ba, and 71ca. Since the TiN layer 61b covers the outer periphery of the gate insulating layer 60b, normal transistor operation of SGTs is achieved. Thus, an SGT circuit in which three SGTs are connected in parallel at a higher density can be achieved.

In this embodiment, the P+ layer 80 is continuously formed over the P+ layers 73aa, 73ba, and 73ca on the top portions of the band-shaped Si pillars 71aa, 71ba, and 71ca by selective epitaxial growth. Thus, the contact hole 81b can be formed over a larger area in plan view above the P+ layer 80. This allows the contact hole 81b to be easily and accurately formed.

Sixth Embodiment

A method for manufacturing a pillar-shaped semiconductor device having an SGT according to a sixth embodiment of the present invention will hereinafter be described with reference to FIGS. 6AA to 6EC, where the figures with the suffix A are plan views, the figures with the suffix B are sectional structural views taken along line X-X' of the figures with the suffix A, and the figures with the suffix C are sectional structural views taken along line Y-Y' of the figures with the suffix A.

Figure 6A:
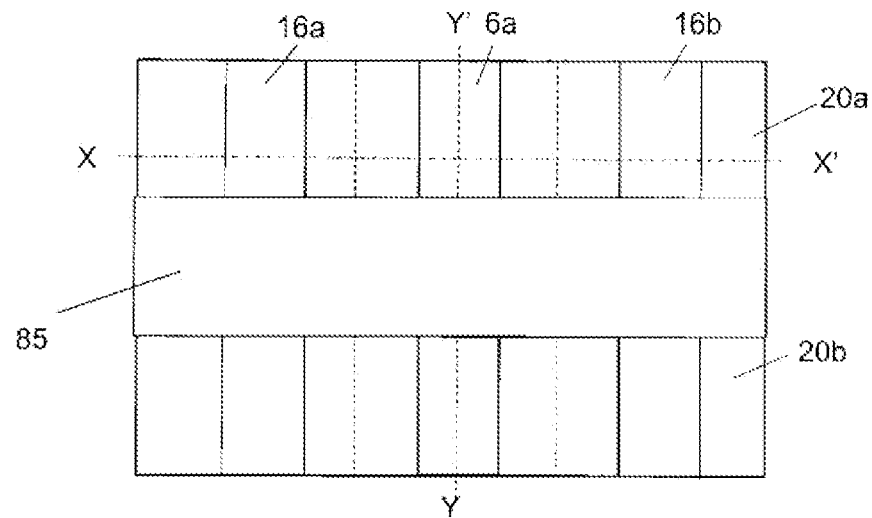
FIGS. 6AA to 6AC are a plan view and sectional structural views illustrating a method for manufacturing a pillar-shaped semiconductor device having an SGT according to a sixth embodiment.
Figure 6A:
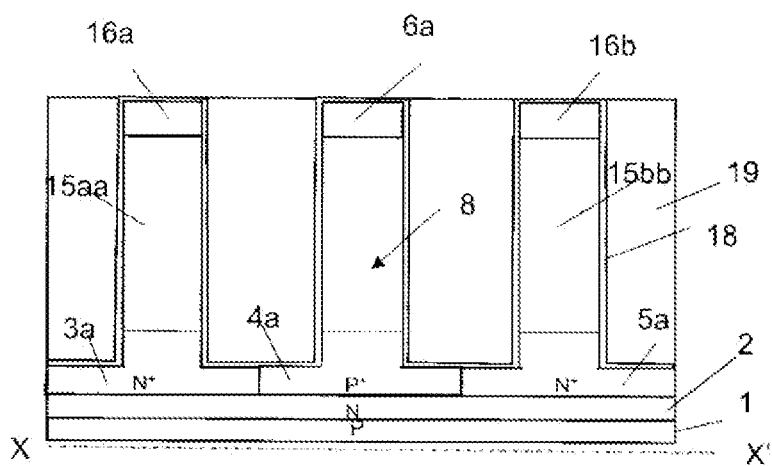
Figure 6A:
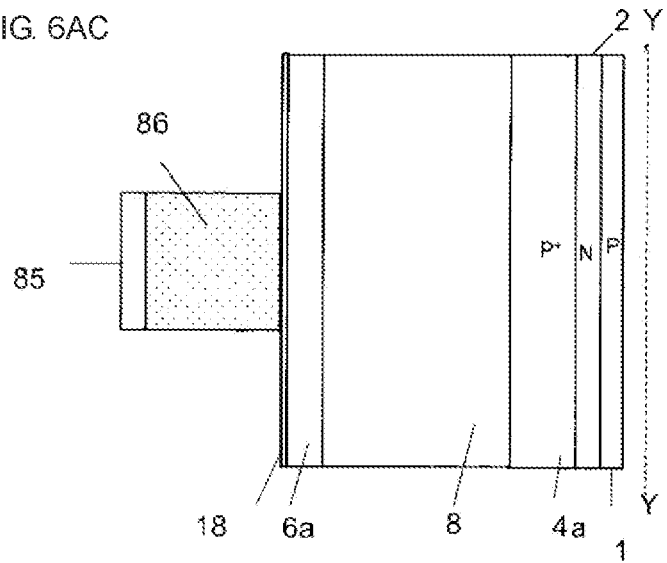
Figure 6B:
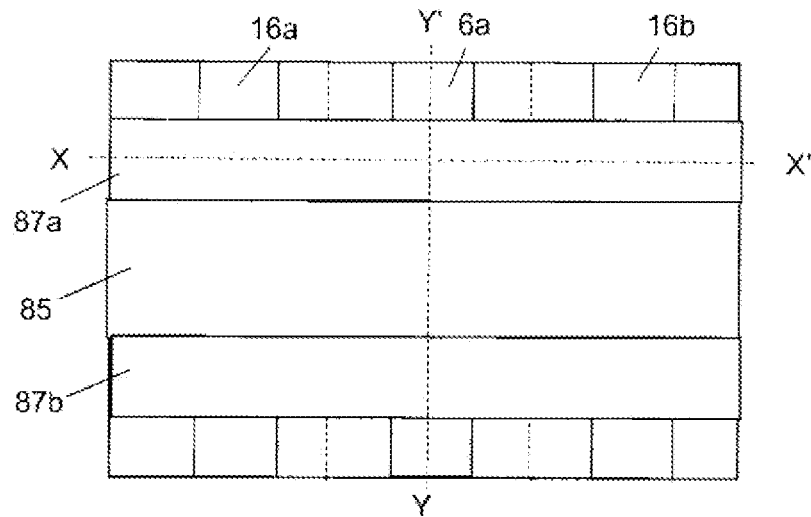
FIGS. 6BA to 6BC are a plan view and sectional structural views illustrating the method for manufacturing a pillar-shaped semiconductor device having an SGT according to the sixth embodiment.
Figure 6B:
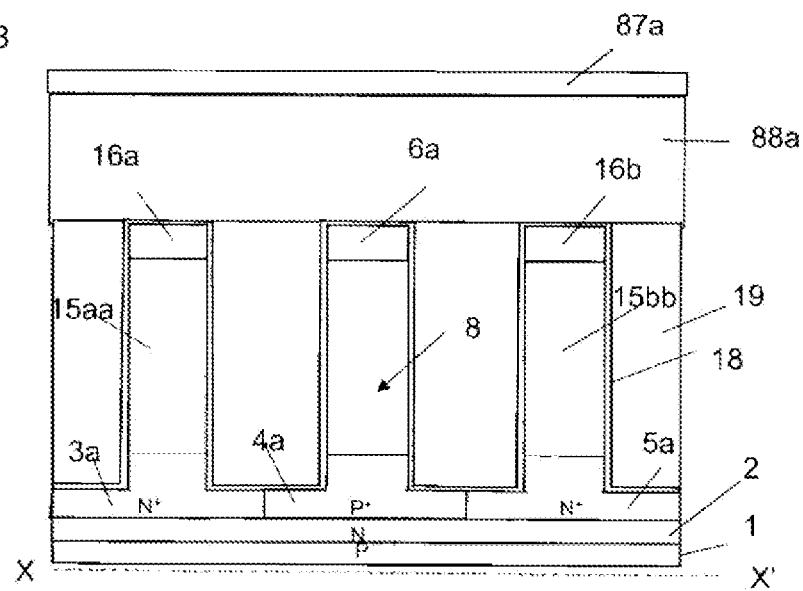
Figure 6B:
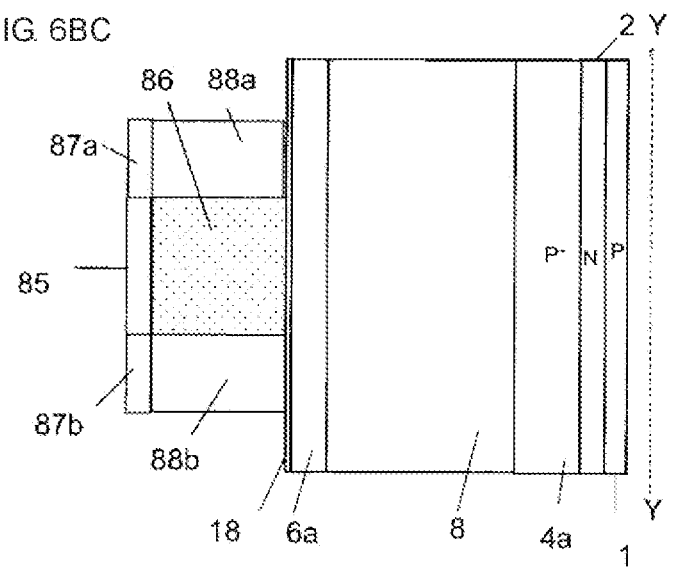

As shown in FIGS. 6AA to 6AC, after the steps up to FIGS. 1LA to 1LC in the first embodiment are performed, a SiGe layer (not shown) and a material layer (not shown) composed of a SiN layer, an Al2O3 layer, and a SiO2 layer are formed over the entire surface. The material layer is then subjected to lithography and RIE to form a band-shaped mask material layer 85 extending in the horizontal direction and composed of a SiN layer, an Al2O3 layer, and a SiO2 layer. The SiGe layer is then etched using the mask material layer 85 as a mask to form a band-shaped SiGe layer 86.

Next, the entire surface is covered with a SiN layer (not shown) by ALD. The entire surface is then covered with a SiO2 layer (not shown). The entire surface is then polished by CMP such that the upper surface is located at the same height as the upper surface of the mask material layer 85. The upper portion of the SiN layer is then etched to form recesses such that the bottom portions thereof are located at the same height as the bottom portion of the mask material layer 85. The entire surface is then covered with an Al2O3 layer. The Al2O3 layer is then polished to form mask material layers 87a and 87b made of the Al2O3 layer on both sides of the band-shaped mask material layer 85 such that the upper surfaces of the mask material layers 87a and 87b are located at the same height as the upper surface of the mask material layer 85. The SiO2 layer outside the SiGe layer 86 and the mask material layers 87a and 87b is then removed. The SiN layer is then etched using the mask material layers 85, 87a, and 87b as a mask to form band-shaped SiN layers 88a and 88b on both sides of the band-shaped SiGe layer 86.

Figure 6C:
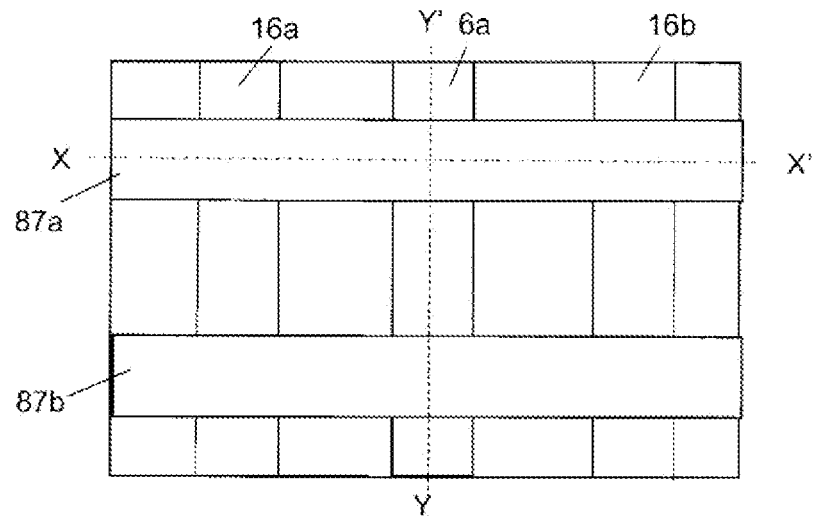
FIGS. 6CA to 6CC are a plan view and sectional structural views illustrating the method for manufacturing a pillar-shaped semiconductor device having an SGT according to the sixth embodiment.
Figure 6C:
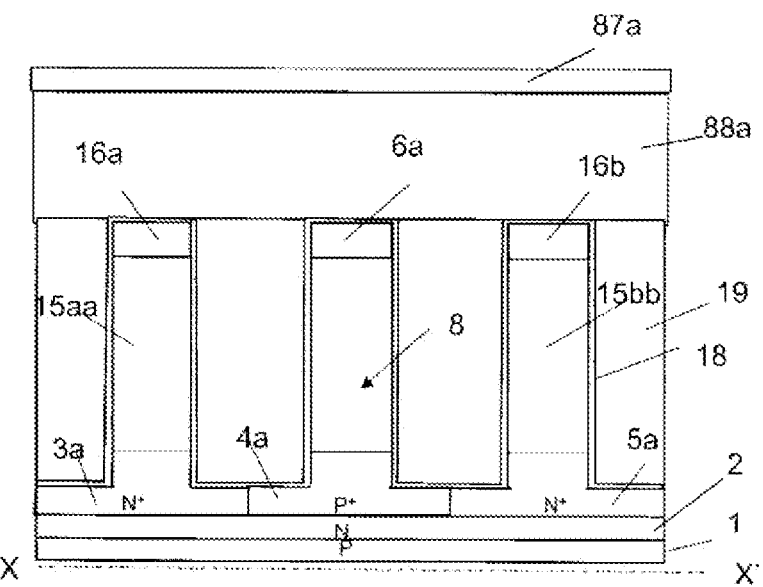
Figure 6C:
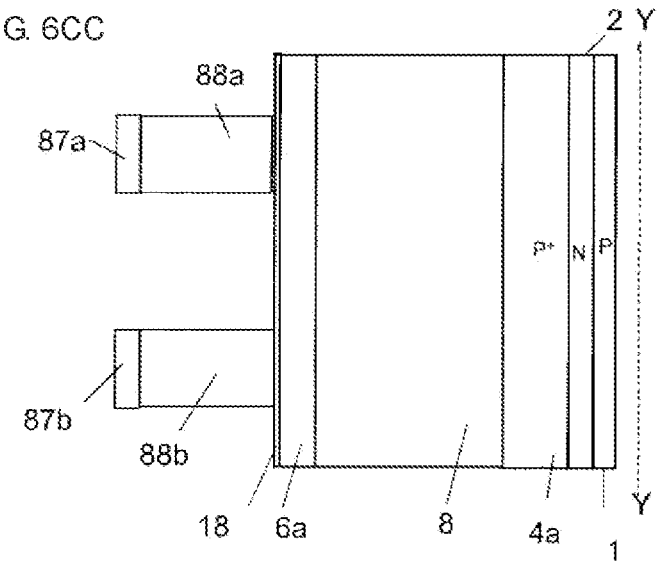

Next, as shown in FIGS. 6CA to 6CC, the band-shaped mask material layer 85 and the band-shaped SiGe layer 86 are removed by etching.

Figure 6D:
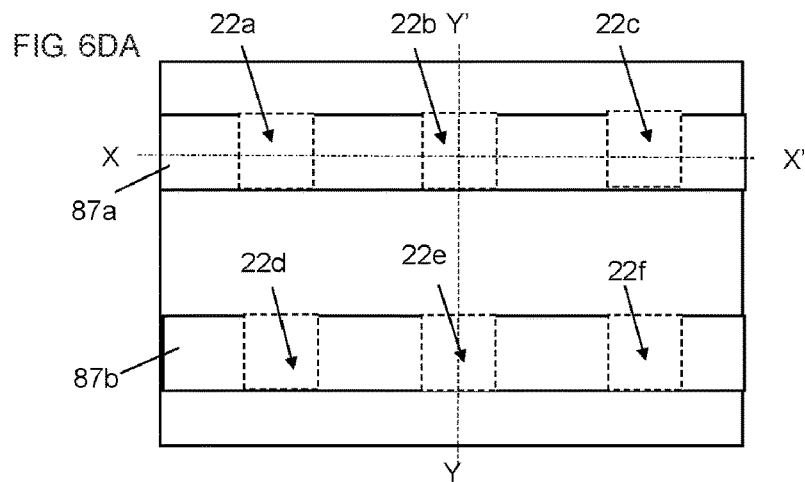
FIGS. 6DA to 6DC are a plan view and sectional structural views illustrating the method for manufacturing a pillar-shaped semiconductor device having an SGT according to the sixth embodiment.
Figure 6D:
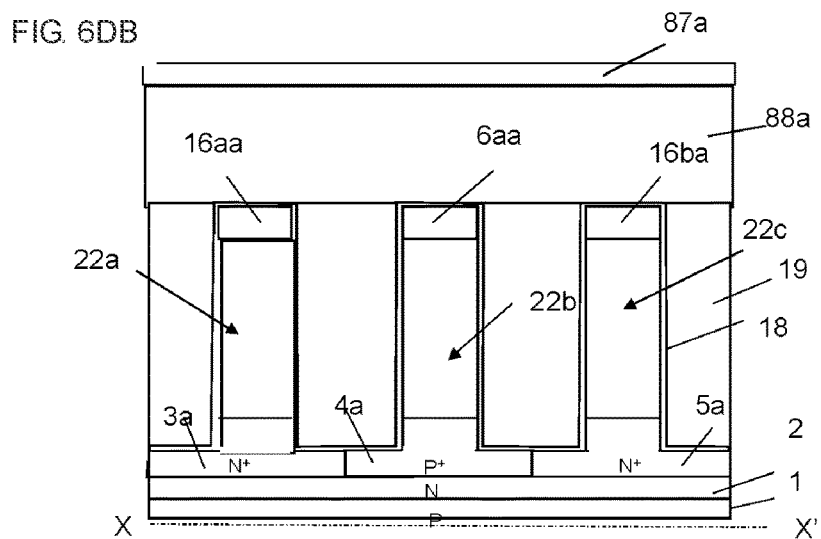
Figure 6D:
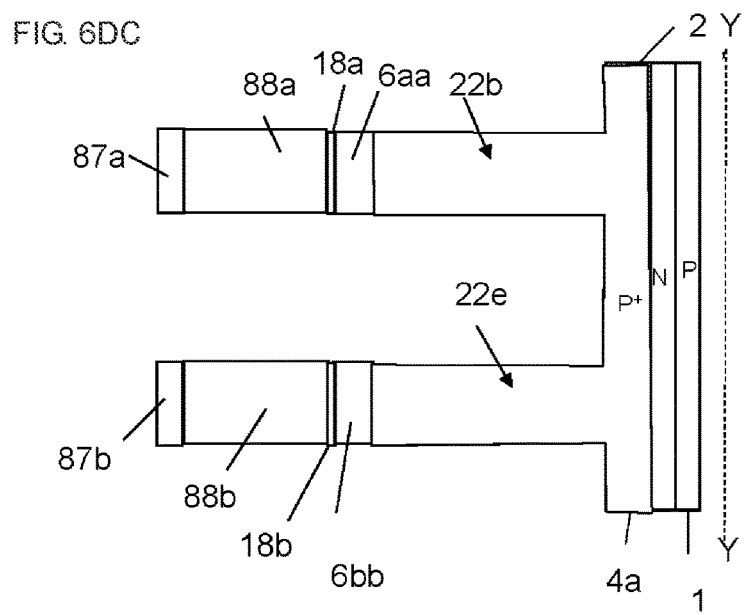

Next, as shown in FIGS. 6DA to 6DC, the protective material layer 18, the mask material layer 6a, and the band-shaped Si pillars 8, 15aa, and 15bb are etched using the mask material layers 87a and 87b and the SiN layers 88a and 88b as a mask. Thus, Si pillars 22a, 22b, 22c, 22d, 22e, and 22f are formed. By this etching, a mask material layer 16aa, a protective material layer 18a, the band-shaped SiN layer 88a, and the band-shaped mask material layer 87a are formed on the Si pillar 22a. A mask material layer 6aa, the protective material layer 18a, the band-shaped SiN layer 88a, and the band-shaped mask material layer 87a are formed on the Si pillar 22b. A mask material layer 16ba, the protective material layer 18a, the band-shaped SiN layer 88a, and the band-shaped mask material layer 87a are formed on the Si pillar 22c. A mask material layer 16ab (not shown), the protective material layer 18a, the band-shaped SiN layer 88b, and the band-shaped mask material layer 87b are formed on the Si pillar 22d. A mask material layer 6bb, the protective material layer 18b, the band-shaped SiN layer 88b, and the band-shaped mask material layer 87b are formed on the Si pillar 22e. A mask material layer 16bb, the protective material layer 18b, the band-shaped SiN layer 88b, and the band-shaped mask material layer 87b are formed on the Si pillar 22f. A SiO2 layer 19a is formed under the band-shaped SiN layer 88a between and outside the Si pillars 22a, 22b, and 22c. Similarly, a SiO2 layer 19b (not shown) is formed under the band-shaped SiN layer 88b between and outside the Si pillars 22d, 22e, and 22f.

Figure 6E:
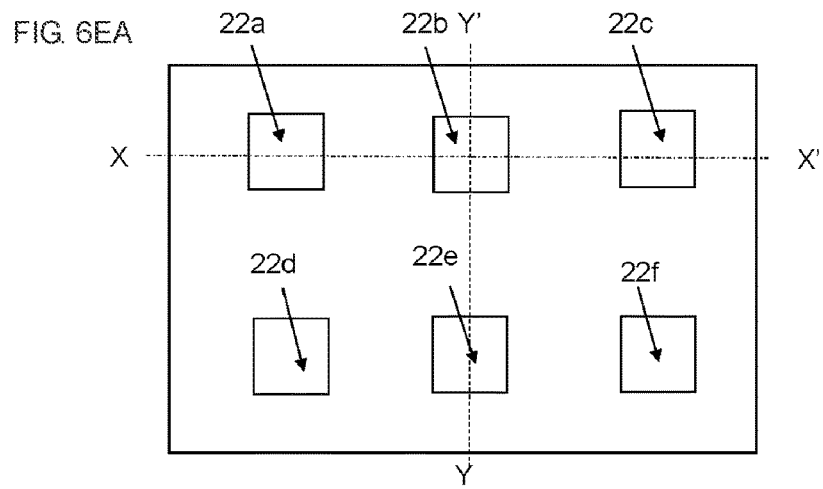
FIGS. 6EA to 6EC are a plan view and sectional structural views illustrating the method for manufacturing a pillar-shaped semiconductor device having an SGT according to the sixth embodiment.
Figure 6E:
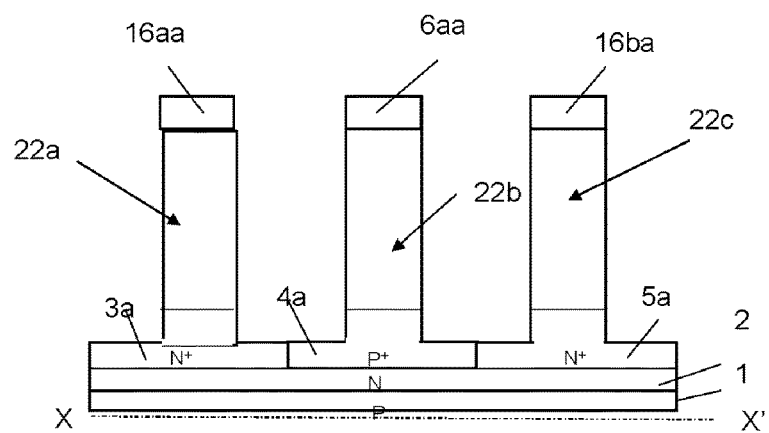
Figure 6E:
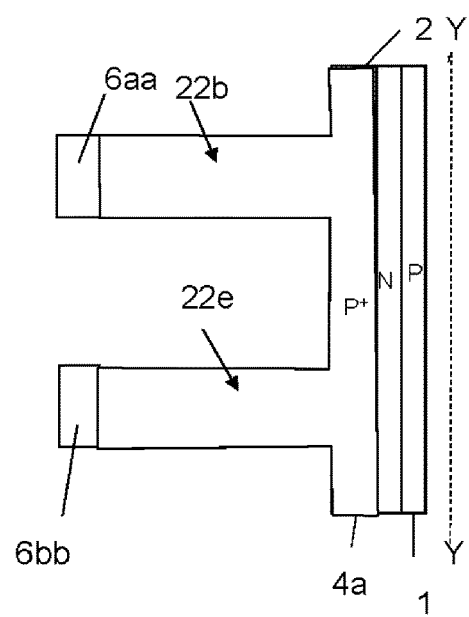
Figure 7:
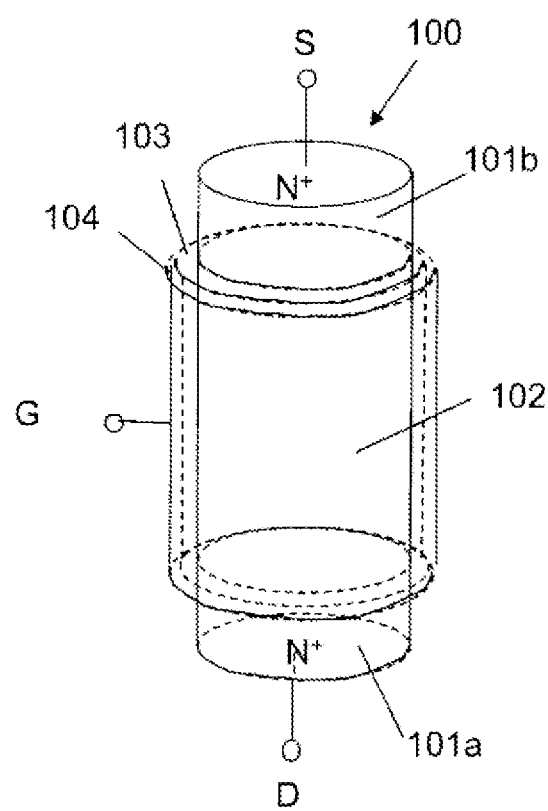
FIG. 7 is a schematic structural view showing a conventional example of an SGT.

Next, the mask material layers 87a and 87b, the SiN layers 88a and 88b, the SiO2 layers 19a and 19b, the protective material layers 18a and 18b, the band-shaped SiN layers 88a and 88b, and the band-shaped mask material layers 87a and 87b are removed. Thus, as shown in FIGS. 6EA to 6EC, the Si pillars 22a to 22f and the mask material layers 16aa, 16ba, 16ab, 16bb, 6aa, and 6bb on the top portions of the Si pillars 22a to 22f are left on the N+ layers 3a, 3b, 5a, and 5b and the P+ layers 4a and 4b. Thereafter, the steps from FIGS. 1PA to 1UC in the first embodiment are performed. Thus, an SRAM cell can be formed on the P-layer substrate 1.

The method for manufacturing a pillar-shaped semiconductor device having an SGT according to this embodiment provides the following features:

1. In this embodiment, the Si pillars 22a to 22f can not only be arranged at high density in the X direction, as in the first embodiment, but also be arranged at high density in the Y direction. Thus, an SRAM cell with a higher density can be achieved.

2. In this embodiment, after the band-shaped SiGe layer 86 is first formed, the SiN layers 88a and 88b are formed on both sides of the band-shaped SiGe layer 86. Thus, the two rows of Si pillars 22a to 22f can be formed at high density in the Y direction. If a band-shaped SiGe layer and a band-shaped SiN layer are formed outside the SiN layers 88a and 88b in plan view, four rows of Si pillars can be formed at high density in the Y direction. By repeating this step, an even number of rows of Si pillars including at least four rows can be formed in the Y direction.

3. In this embodiment, after the band-shaped SiGe layer 86 is first formed, the SiN layers 88a and 88b are formed on both sides of the band-shaped SiGe layer 86. On the other hand, a method in which, after a SiN layer is first formed, a SiGe layer is formed on both sides of the band-shaped SiN layer allows three rows of Si pillars to be formed in the Y direction. By repeating this step, an odd number of rows of Si pillars including at least three rows can be formed at high density in the Y direction.

Although SRAM circuits and circuits in which three SGTs are connected in parallel have been described by way of example in the embodiments according to the present invention, the present invention is also applicable to the formation of other circuits having SGTs.

Although one SGT is formed at one semiconductor pillar in the embodiments according to the present invention, the present invention is also applicable to the formation of circuits in which two or more SGTs are formed at one semiconductor pillar. This also applies to other embodiments according to the present invention.

In the first embodiment, the N+ layers 40a, 40c, 40d, and 40f and the P+ layers 40b and 40e, which contain donor and acceptor impurities, need not be formed on the top portions of the Si pillars 22a to 22f; instead, the N+ layers 41a, 41c, 41d, and 41f and the P+ layers 41b and 41e can function as the sources or drains of the SGTs. The N+ layers 40a, 40c, 40d, and 40f and the P+ layers 40b and 40e also function as the sources or drains of the SGTs when they are formed in the side surfaces of the top portions of the Si pillars 22a to 22f. The Si pillars 22a to 22f may also be formed such that the upper portions thereof are located at the same height as the upper ends of the gate TiN layers 32Aa and 32Ab, and the N+ layers 41a, 41c, 41d, and 41f and the P+ layers 41b and 41e may be formed on the top portions of the Si pillars 22a to 22f. The N+ layers 41a, 41c, 41d, and 41f and the P+ layers 41*b* and 41*e* may also be formed of, for example, a metal such as W or an alloy. This also applies to other embodiments according to the present invention.

In the first embodiment, as shown in FIGS. 1AA to 1AC, the mask material layer 6, which is composed of a SiO2 layer, an Al2O3 layer, and a SiO2 layer, is used as an etching mask. A material layer composed of a single layer or another combination of a plurality of layers may also be used as long as its purpose is achieved. These material layers may be inorganic or organic material layers. This also applies to other mask material layers 6*a*, 6*aa*, 6*ab*, 16*a*, 16*b*, 16*aa*, 16*bb*, 16*ab*, 16*ba*, 20*a*, 20*b*, and 26*a* to 26*d*. This also applies to other embodiments according to the present invention.

In the first embodiment, the mask material layers 6, 6*a*, 6*b*, 6*aa*, 6*bb*, 16*aa*, 16*ba*, and 16*bb* are assumed to have the same thickness; however, the surface layer becomes thinner during etching as the process proceeds. Accordingly, the selection of the constituent materials and the thicknesses of the mask material layers 6, 6*a*, 6*b*, 6*aa*, 6*bb*, 16*aa*, 16*ba*, and 16*bb* are determined so that they deliver a predetermined function as mask material layers in their respective steps. This also applies to other embodiments according to the present invention.

In the first embodiment, as shown in FIGS. 1CA to 1CC, the SiGe layer 10 is formed so as to cover the band-shaped Si pillar 8 by ALD. The SiGe layer 10 may also be formed by another method such as molecular beam deposition, rather than by ALD. The SiGe layer 10 may also be replaced by another material layer that can be formed so as to have the same thickness on the side surfaces of the band-shaped Si pillar 8 and that can be removed after the formation of the band-shaped Si pillars 15*aa* and 15*bb*. This also applies to other embodiments according to the present invention.

Although the SGTs are formed on the P-layer substrate 1 in the first embodiment, the P-layer substrate 1 may be replaced by a silicon-on-insulator (SOI) substrate. This also applies to other embodiments according to the present invention.

In this embodiment, as shown in FIGS. 1CA to 1CC, the SiGe layer 10 is directly formed on the exposed side surfaces of the band-shaped Si pillar 8 and the surface layers of the N+ layers 3*a* and 5*a* and the P+ layer 4*a*; instead, a thin SiO2 layer may be formed on the side surfaces of the band-shaped Si pillar 8 and the surface layers of the N+ layers 3*a* and 5*a* and the P+ layer 4*a* before the formation of the SiGe layer 10. The SiO2 layer on the N+ layers 3*a* and 5*a* around the outer peripheries of the SiGe layers 10*a* and 10*b* may be removed before the formation of the Si layer 15, whereas the SiO2 layer on the side surfaces of the band-shaped Si pillar 8 may be removed before the formation of the gate insulating HfO2 layer 18. A material layer composed of a single layer other than a SiO2 layer or a plurality of layers may also be used. This also applies to other embodiments according to the present invention.

In the first embodiment, as shown in FIGS. 1OA to 1PC, a SiO2 layer (not shown) is formed in the side surfaces of the Si pillars 22*a* to 22*f* by isotropic oxidation, and the SiO2 layer is then removed so that the Si pillars 22*a* to 22*f* have a circular cross-section in plan view. This circular cross-section is intended to create as concentric a potential distribution as possible in the cross-section of the Si pillars 22*a* to 22*f*. This isotropic oxidation is not necessary if the cross-section need not be circular in terms of the required performance. The circular cross-section of the Si pillars 22*a* to 22*f* may also be formed by forming circular mask material layers 16*aa*, 6*aa*, 16*ba*, 16*ab*, 6*ab*, and 16*bb*. The circular cross-section may also be oval. This also applies to other embodiments according to the present invention.

Although the HfO2 layer 31 is used as a gate insulating layer and the TiN layer 32 is used as a gate material layer in the first embodiment, each of them may be another material layer composed of a single layer or a plurality of layers. Similarly, the W layer 34 may be another material layer composed of a single layer or a plurality of layers. This also applies to other embodiments according to the present invention.

In the first embodiment, the N+ layers 41*a*, 41*c*, 41*d*, and 41*f* and the P+ layers 41*b* and 41*e* shown in FIGS. 1TA to 1TC are formed by selective epitaxial crystal growth. The N+ layers 41*a*, 41*c*, 41*d*, and 41*f* and the P+ layers 41*b* and 41*e* need not be formed by CVD, but may instead be formed by another method that allows selective epitaxial crystal growth, such as, for example, molecular beam deposition, ALD, or liquid phase epitaxy. This also applies to other embodiments according to the present invention.

In the first embodiment, the N+ layers 41*a*, 41*c*, 41*d*, and 41*f* and the P+ layers 41*b* and 41*e* shown in FIGS. 1TA to 1TC are formed by selective epitaxial crystal growth. The N+ layers 41*a*, 41*c*, 41*d*, and 41*f* and the P+ layers 41*b* and 41*e* may also be formed by normal epitaxial crystal growth followed by lithography and etching. This also applies to other embodiments according to the present invention.

In the first embodiment, as shown in FIGS. 1UA to 1UC, the N+ layers 40*a*, 40*c*, 40*d*, and 40*f* and the P+ layers 40*b* and 40*e* are formed such that the lower ends thereof are located at the same height as the upper ends of the TiN layers 32Aa, 32Ab, 32Ba, and 32Bb, which are gate conductor layers, in the perpendicular direction. Although it is desirable that the bottom portions of the lower ends of the N+ layers 40*a*, 40*c*, 40*d*, and 40*f* and the P+ layers 40*b* and 40*e* be located at the same height as the upper ends of the gate TiN layers 32Aa, 32Ab, 32Ba, and 32Bb, they may be located slightly above or below the upper ends of the gate TiN layers 32Aa, 32Ab, 32Ba, and 32Bb as long as there is no problem with the operation of the SGTs. The same also applies to the relationship between the N+ layers 3*aa*, 5*aa*, 3*ab*, and 5*ab* and the P+ layers 4*aa* and 4*ab* and the gate TiN layers 32Aa, 32Ab, 32Ba, and 32Bb. This also applies to other embodiments according to the present invention.

In the first embodiment, a configuration in which the Si pillars 22*a* and 22*d* and the Si pillars 22*c* and 22*f* are formed on both sides of the Si pillars 22*b* and 22*e* has been described by way of example. On the other hand, the method of manufacture according to this embodiment can be used to form new Si pillars outside both sides of the Si pillars 22*a* and 22*d* and the Si pillars 22*c* and 22*f*. This also applies to other embodiments according to the present invention.

In the first embodiment, a configuration in which the Si pillars 22*a* and 22*d* and the Si pillars 22*c* and 22*f* are formed on both sides of the Si pillars 22*b* and 22*e* has been described by way of example. On the other hand, any of the Si pillars 22*a* to 22*f* that have been formed may be removed by lithography and etching depending on the circuit design. This also applies to other embodiments according to the present invention.

In the first embodiment, SGTs in which the sources and the drains are formed on the upper and lower sides of the Si pillars 22*a* to 22*f* using the N+ layers 40*a*, 40*c*, 40*d*, and 40*f*, the P+ layers 40*b* and 40*e*, the N+ layers 3*aa*, 5*aa*, 3*ab*, and 5*ab*, and the P+ layers 4*aa* and 4*ab*, which have conductivity of the same polarity, have been described; instead, the present invention is also applicable to tunneling SGTs having sources and drains of different polarities. This also applies to other embodiments according to the present invention.

In the foregoing embodiments, an example in which silicon (Si) is used as semiconductor regions such as channels, sources, and drains in semiconductor pillars has been described. However, the technical idea of the present invention is not limited thereto, but is also applicable to semiconductor devices having SGTs using Si-containing semiconductor materials such as SiGe or semiconductor materials other than Si.

In vertical NAND-type flash memory circuits, semiconductor pillars are used as channels, and memory cells composed of a tunneling oxide layer, a charge storage layer, an interlayer insulating layer, and a control conductor layer surrounding the semiconductor pillars are formed in multiple stages in the perpendicular direction. The semiconductor pillars at both ends of the memory cells have a source line impurity layer corresponding to the source and a bit line impurity layer corresponding to the drain. If one of the memory cells on both sides of one memory cell functions as a source, the other functions as a drain. Thus, vertical NAND-type flash memory circuits are one type of SGT circuit. Accordingly, the present invention is also applicable to NAND-type flash memory circuits.

Various embodiments of the present invention and modifications thereof are possible without departing from the broad spirit and scope of the present invention. The foregoing embodiments are given to describe an example of the present invention and are not intended to limit the scope of the present invention. The foregoing examples and modifications can be combined in any manner. Furthermore, the foregoing embodiments fall within the scope of the technical idea of the present invention even if some elements are excluded from those embodiments as needed.

The methods for manufacturing a pillar-shaped semiconductor device according to the present invention provide high-density pillar-shaped semiconductor devices.

What is claimed is:

1. A method for manufacturing a pillar-shaped semiconductor device, comprising the steps of:
    forming a first mask material layer extending in a band shape in one direction in plan view on a semiconductor layer on a substrate;
    etching the semiconductor layer using the first mask material layer as a mask to form a first band-shaped semiconductor pillar;
    forming a first material layer so as to cover the first mask material layer, the first band-shaped semiconductor pillar, and a portion of the substrate around an outer periphery of the first band-shaped semiconductor pillar;
    forming a second material layer so as to cover the first material layer;
    planarizing the first material layer and the second material layer such that upper surfaces thereof are located at the same height as an upper surface of the first mask material layer;
    etching a top portion of the first material layer using the first mask material layer and the second material layer as a mask to form first recesses;
    forming a second mask material layer so as to fill the first recesses above the top portion of the first material layer and such that an upper surface of the second mask material layer is located at the same height as the upper surface of the first mask material layer;
    removing the second material layer;
    etching the first material layer using the first mask material layer and the second mask material layer as a mask to form a first band-shaped material pillar and a second band-shaped material pillar based on the first material layer on both sides of the first band-shaped semiconductor pillar in plan view;
    forming a first semiconductor layer so as to cover the first mask material layer, the second mask material layer, the first band-shaped semiconductor pillar, the first band-shaped material pillar, the second band-shaped material pillar, and the substrate;
    forming a third material layer so as to cover the first semiconductor layer;
    planarizing the first semiconductor layer and the third material layer such that upper surfaces thereof are located at the same height as the upper surface of the first mask material layer;
    etching a top portion of the first semiconductor layer using the first mask material layer, the second mask material layer, and the third material layer as a mask to form second recesses;
    forming a third mask material layer so as to fill the second recesses above the top portion of the first semiconductor layer and such that an upper surface of the third mask material layer is located at the same height as the upper surface of the first mask material layer;
    removing the third material layer;
    etching the first semiconductor layer using the first mask material layer, the second mask material layer, and the third mask material layer as a mask to form a second band-shaped semiconductor pillar and a third band-shaped semiconductor pillar based on the first semiconductor layer outside the first band-shaped material pillar and the second band-shaped material pillar in plan view;
    removing the first band-shaped material pillar and the second band-shaped material pillar;
    forming a fourth material layer around outer peripheries of the first band-shaped semiconductor pillar, the second band-shaped semiconductor pillar, and the third band-shaped semiconductor pillar such that an upper surface of the fourth material layer is located at the same height as the upper surface of the first mask material layer;
    forming a fourth mask material layer extending in a band shape on the first mask material layer, the third mask material layer, and the fourth material layer in a direction perpendicular to the direction in which the first mask material layer extends in a band shape in plan view; and
    etching the first band-shaped semiconductor pillar, the second band-shaped semiconductor pillar, and the third band-shaped semiconductor pillar using the fourth mask material layer as a mask to form a first semiconductor pillar, a second semiconductor pillar, and a third semiconductor pillar,
    wherein pillar-shaped semiconductor devices having channels in the first semiconductor pillar, the second semiconductor pillar, and the third semiconductor pillar are formed.

2. The method for manufacturing a pillar-shaped semiconductor device according to claim 1, wherein
    the second band-shaped semiconductor pillar and the third band-shaped semiconductor pillar are formed from a second semiconductor base different from a first semiconductor base for the first band-shaped semiconductor pillar.

3. The method for manufacturing a pillar-shaped semiconductor device according to claim 1, wherein
one of the first mask material layer and the second mask material layer is formed so as to be wider than the other in plan view.

4. The method for manufacturing a pillar-shaped semiconductor device according to claim 1, wherein
one of the first mask material layer and the third mask material layer is formed so as to be wider than the other in plan view.

5. The method for manufacturing a pillar-shaped semiconductor device according to claim 1, wherein
one of the first mask material layer and the fourth mask material layer is formed so as to be wider than the other in plan view.

6. The method for manufacturing a pillar-shaped semiconductor device according to claim 1, comprising the steps of:
forming a gate insulating layer so as to surround side surfaces of the first semiconductor pillar, the second semiconductor pillar, and the third semiconductor pillar; and
forming a gate conductor layer so as to surround the gate insulating layer,
wherein the gate conductor layer is formed so as to fill spaces between the first semiconductor pillar, the second semiconductor pillar, and the third semiconductor pillar.

7. The method for manufacturing a pillar-shaped semiconductor device according to claim 6, wherein
a semiconductor layer containing a donor or acceptor impurity is formed by epitaxial growth, the semiconductor layer covering top portions of the first semiconductor pillar, the second semiconductor pillar, and the third semiconductor pillar, or having a lower end thereof located at an upper portion of the gate conductor layer in a perpendicular direction and being in contact with and connected to the side surfaces of the first semiconductor pillar, the second semiconductor pillar, and the third semiconductor pillar.

8. The method for manufacturing a pillar-shaped semiconductor device according to claim 1, comprising the steps of:
forming a fifth material layer around the outer peripheries of the first band-shaped semiconductor pillar, the second band-shaped semiconductor pillar, and the third band-shaped semiconductor pillar such that an upper surface of the fifth material layer is located at the same height as the upper surface of the first mask material layer;
forming a third band-shaped material pillar having a fifth mask material layer on a top portion thereof on the first mask material layer, the third mask material layer, and the fifth material layer, the third band-shaped material pillar being perpendicular to the first band-shaped semiconductor pillar in plan view;
forming a fourth band-shaped material pillar having a sixth mask material layer on a top portion thereof on one side of the third band-shaped material pillar and a fifth band-shaped material pillar having a seventh mask material layer on a top portion thereof on the other side of the third band-shaped material pillar;
removing the fifth mask material layer and the third band-shaped material pillar; and
etching the first band-shaped semiconductor pillar, the second band-shaped semiconductor pillar, and the third band-shaped semiconductor pillar using one or both of the sixth mask material layer and the fourth band-shaped material pillar as a mask to form the first semiconductor pillar, the second semiconductor pillar, and the third semiconductor pillar
while etching the first band-shaped semiconductor pillar, the second band-shaped semiconductor pillar, and the third band-shaped semiconductor pillar using one or both of the seventh mask material layer and the fifth band-shaped material pillar as a mask to form a fourth semiconductor pillar, a fifth semiconductor pillar, and a sixth semiconductor pillar in regions where the seventh mask material layer intersects the first band-shaped semiconductor pillar, the second band-shaped semiconductor pillar, and the third band-shaped semiconductor pillar in plan view,
wherein the sixth mask material layer and the seventh mask material layer have the same width in plan view.

* * * * *